(12) United States Patent
Masuoka et al.

(10) Patent No.: US 9,337,319 B2
(45) Date of Patent: May 10, 2016

(54) SEMICONDUCTOR DEVICE AND METHOD FOR MANUFACTURING SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

(21) Appl. No.: 14/591,664

(22) Filed: Jan. 7, 2015

(65) Prior Publication Data
US 2015/0200280 A1 Jul. 16, 2015

(30) Foreign Application Priority Data
Jan. 15, 2014 (JP) ................................. 2014-005481

(51) Int. Cl.
*H01L 29/66* (2006.01)
*H01L 29/78* (2006.01)
(Continued)

(52) U.S. Cl.
CPC .... *H01L 29/66833* (2013.01); *H01L 27/11582* (2013.01); *H01L 29/66484* (2013.01); *H01L 29/66545* (2013.01); *H01L 29/66795* (2013.01); *H01L 29/7855* (2013.01); *H01L 29/792* (2013.01)

(58) Field of Classification Search
CPC .................. H01L 29/66666; H01L 27/11563; H01L 27/11578; H01L 27/1158; H01L 29/66833

USPC .................. 257/328, 329, E29.118, E29.131, 257/E29.274
See application file for complete search history.

(56) References Cited

U.S. PATENT DOCUMENTS

| | | | |
|---|---|---|---|
| 6,891,234 B1 | 5/2005 | Connelly et al. | |
| 2008/0239818 A1* | 10/2008 | Mokhlesi | H01L 27/11568 365/185.17 |

(Continued)

FOREIGN PATENT DOCUMENTS

| | | |
|---|---|---|
| JP | 11-297984 | 10/1999 |
| JP | 2004-356314 | 12/2004 |

(Continued)

OTHER PUBLICATIONS

Mistry et al., "A 45nm Logic Technology with High-k+Metal Gate Transistors, Strained Silicon, 9 Cu Interconnect Layers, 193nm Dry Patterning, and 100% Pb-Free Packaging", *IEEE*, pp. 247-250, 2007.

*Primary Examiner* — Kimberly Rizkallah
*Assistant Examiner* — Maria Ligai
(74) *Attorney, Agent, or Firm* — Brinks Gilson & Lione

(57) ABSTRACT

A semiconductor device includes a fin-shaped semiconductor layer disposed on a semiconductor substrate, a first insulating film disposed around the fin-shaped semiconductor layer, a first pillar-shaped semiconductor layer disposed on the fin-shaped semiconductor layer, a first gate insulating film that is disposed around the first pillar-shaped semiconductor layer and includes a charge storing layer, a second gate insulating film disposed around the first pillar-shaped semiconductor layer and at a position higher than the first gate insulating film, a fifth gate insulating film surrounding an upper portion of the first pillar-shaped semiconductor layer, and a first contact electrode surrounding the fifth gate insulating film.

12 Claims, 46 Drawing Sheets

(51) Int. Cl.
*H01L 29/792* (2006.01)
*H01L 27/115* (2006.01)

(56) References Cited

U.S. PATENT DOCUMENTS

2013/0105902 A1* 5/2013 Uenaka ............. H01L 29/66833
257/368
2014/0231954 A1* 8/2014 Lue ................... H01L 27/11524
257/528

FOREIGN PATENT DOCUMENTS

| JP | 2007-266143 | 10/2007 |
| JP | 2011-096341 A | 5/2011 |
| JP | 2011-166163 A | 8/2011 |
| JP | 2013-004690 | 1/2013 |
| JP | 2013-065636 A | 4/2013 |
| JP | 2014-003232 A | 1/2014 |

* cited by examiner

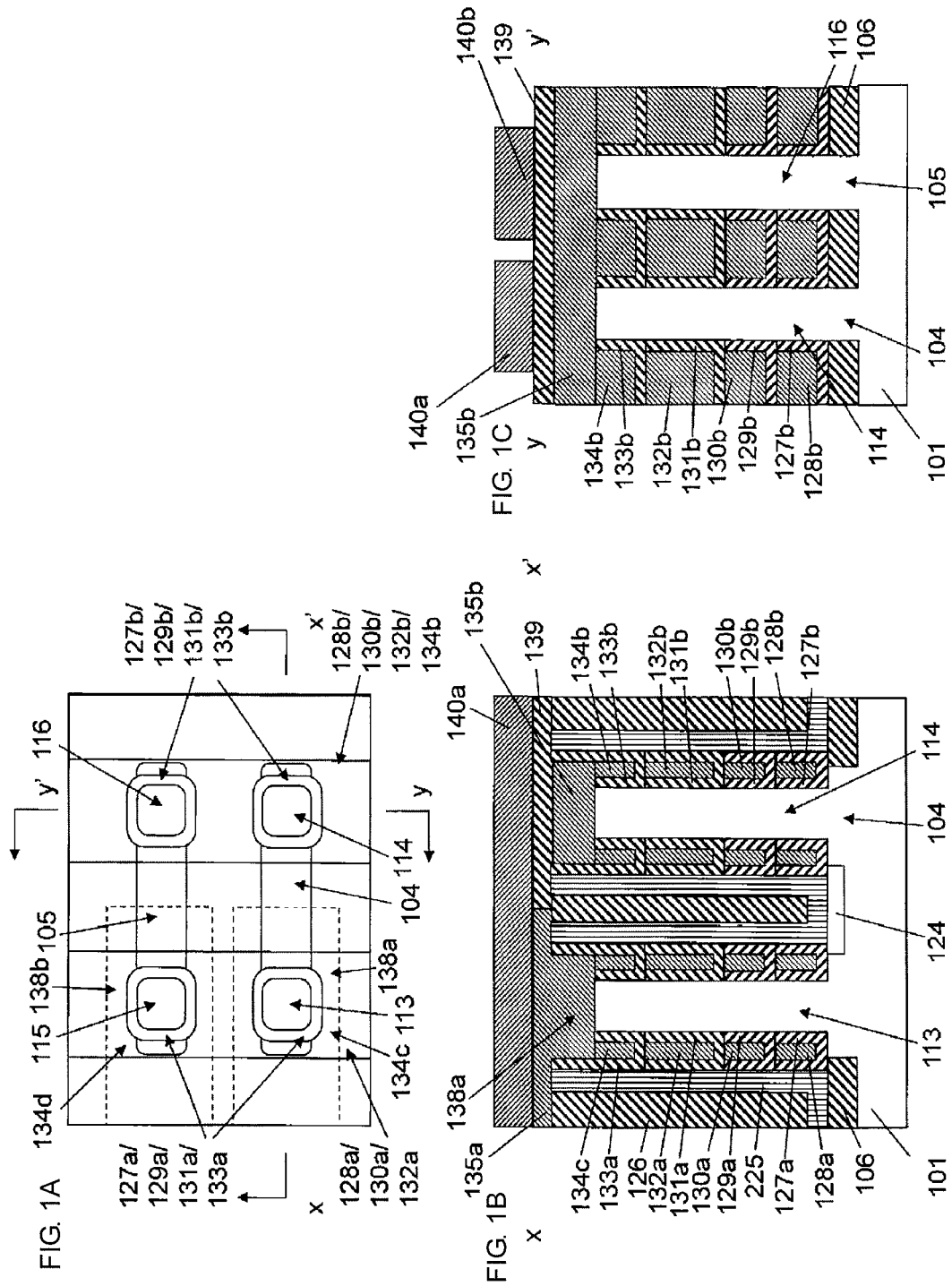

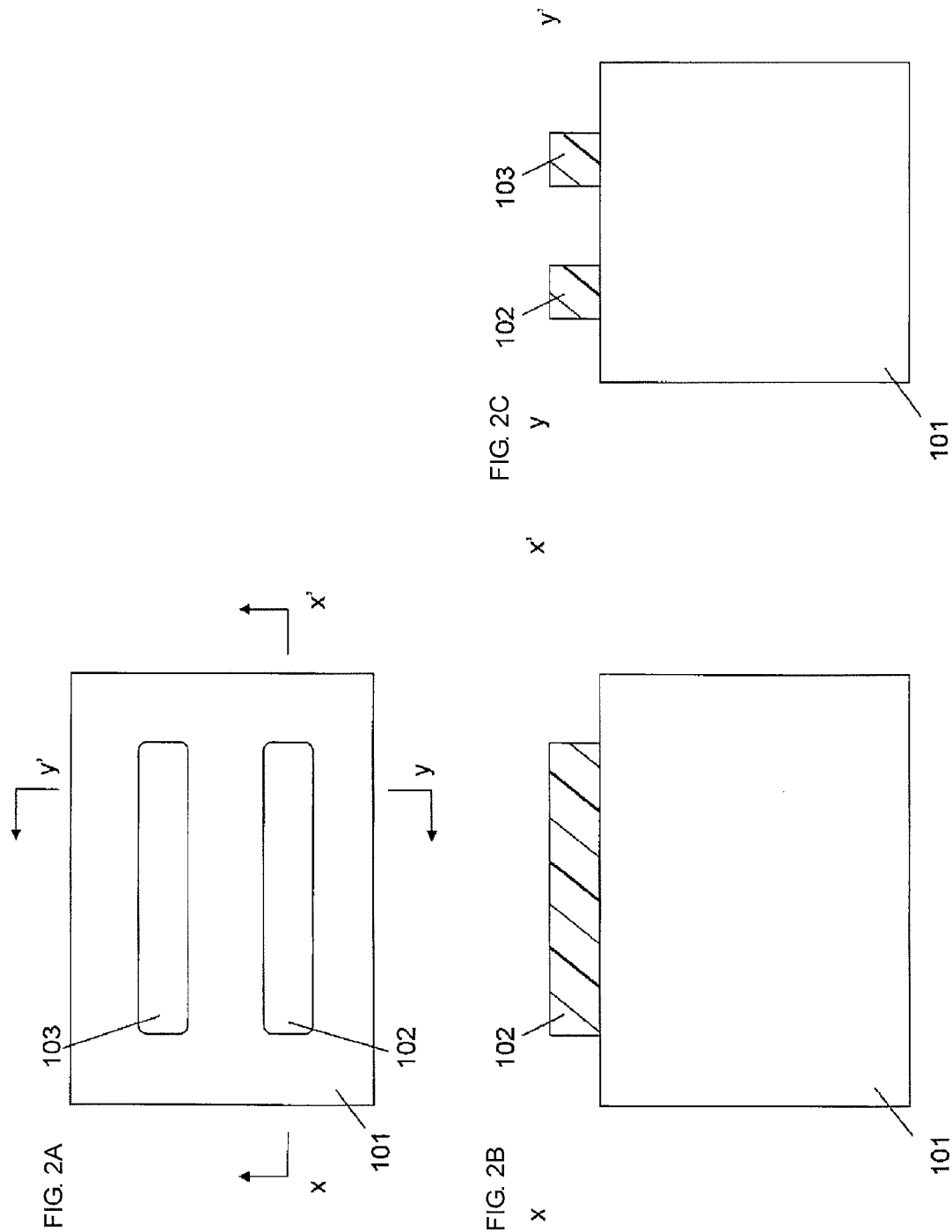

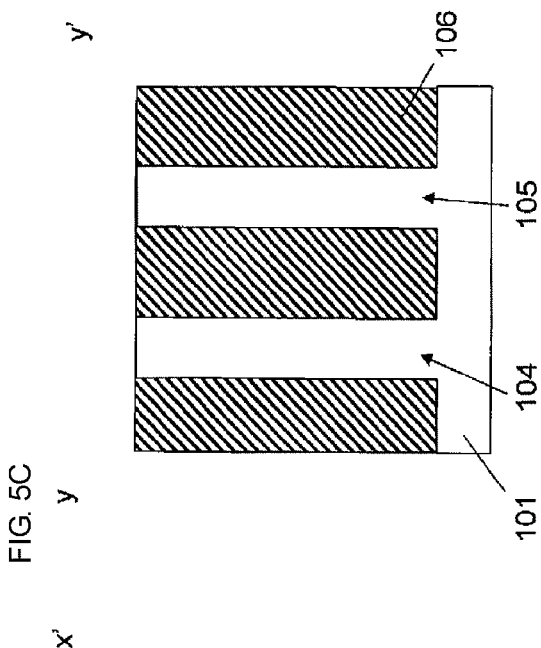
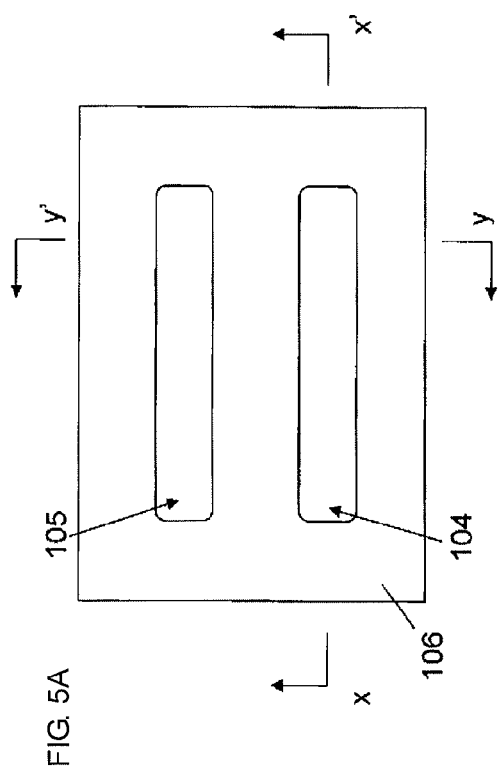
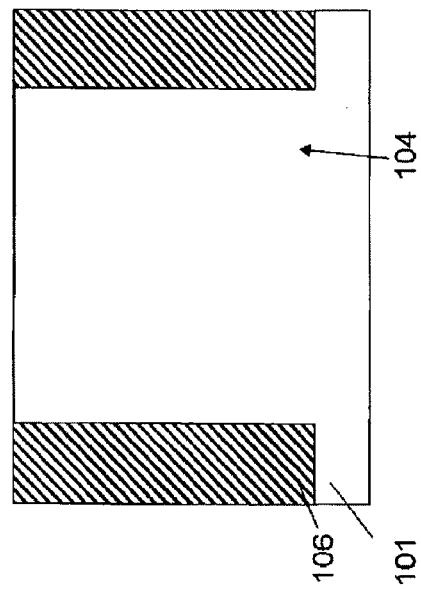
FIG. 5A
FIG. 5B
FIG. 5C

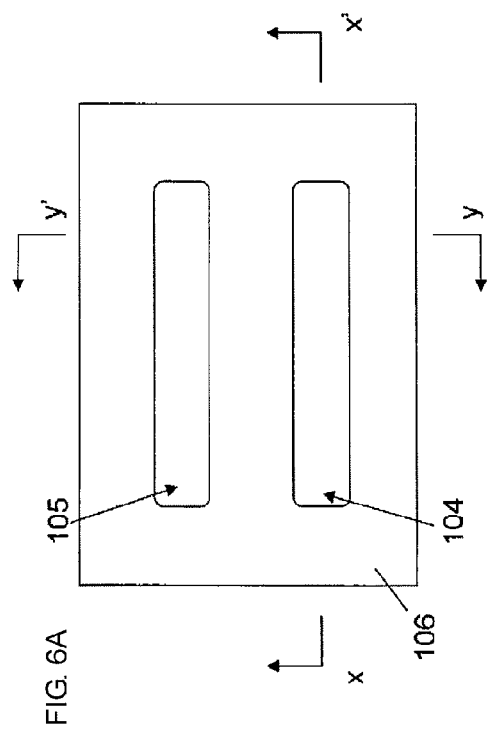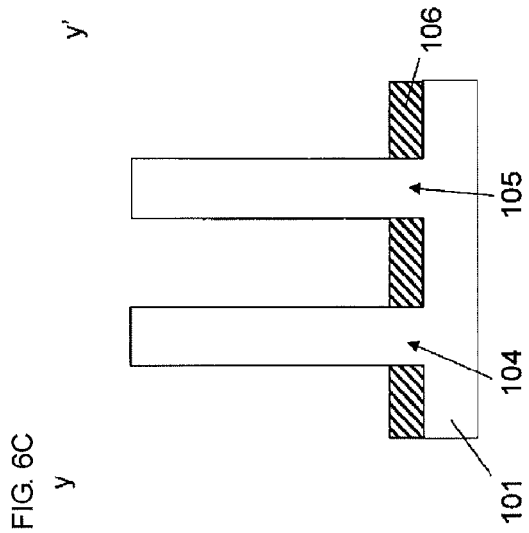

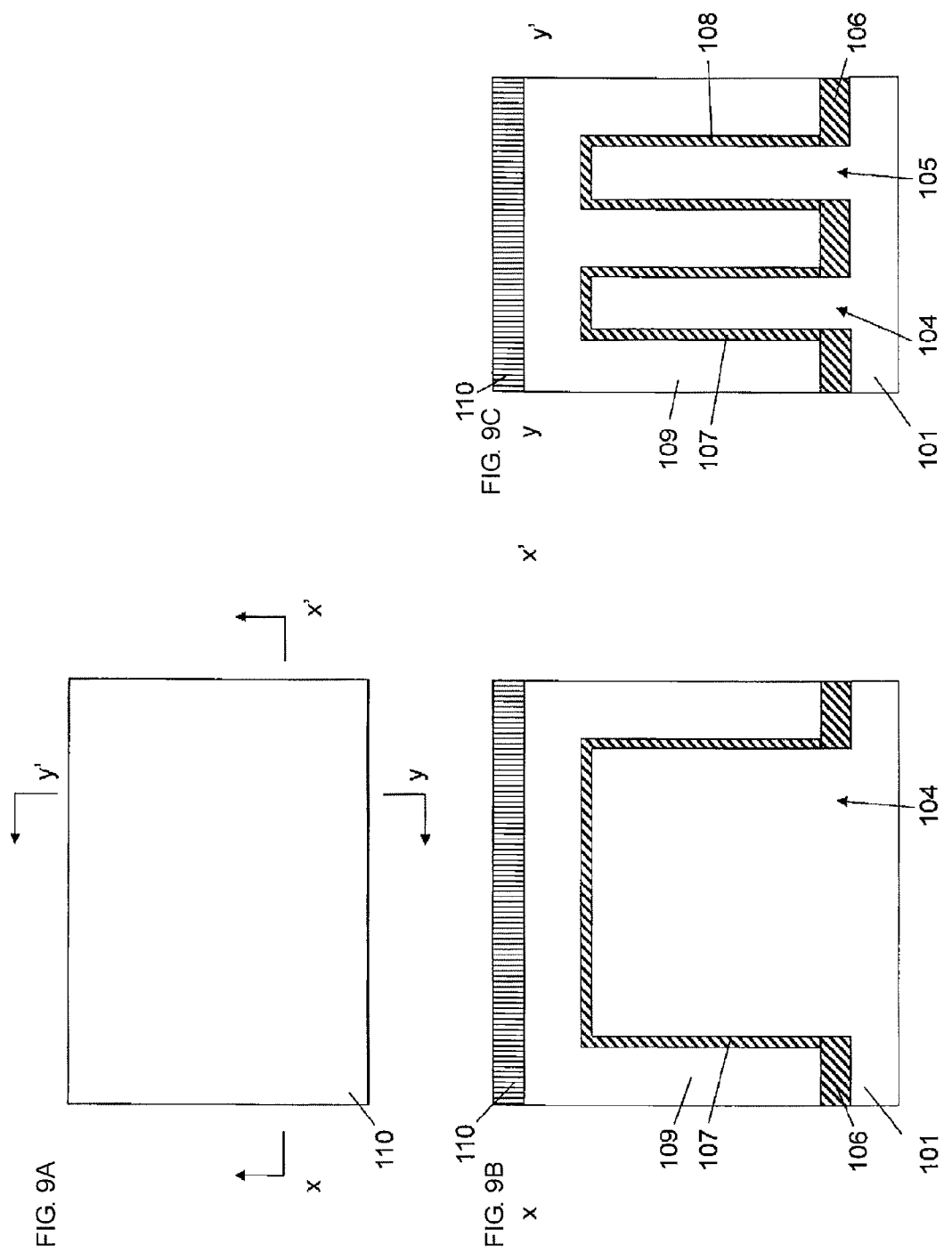

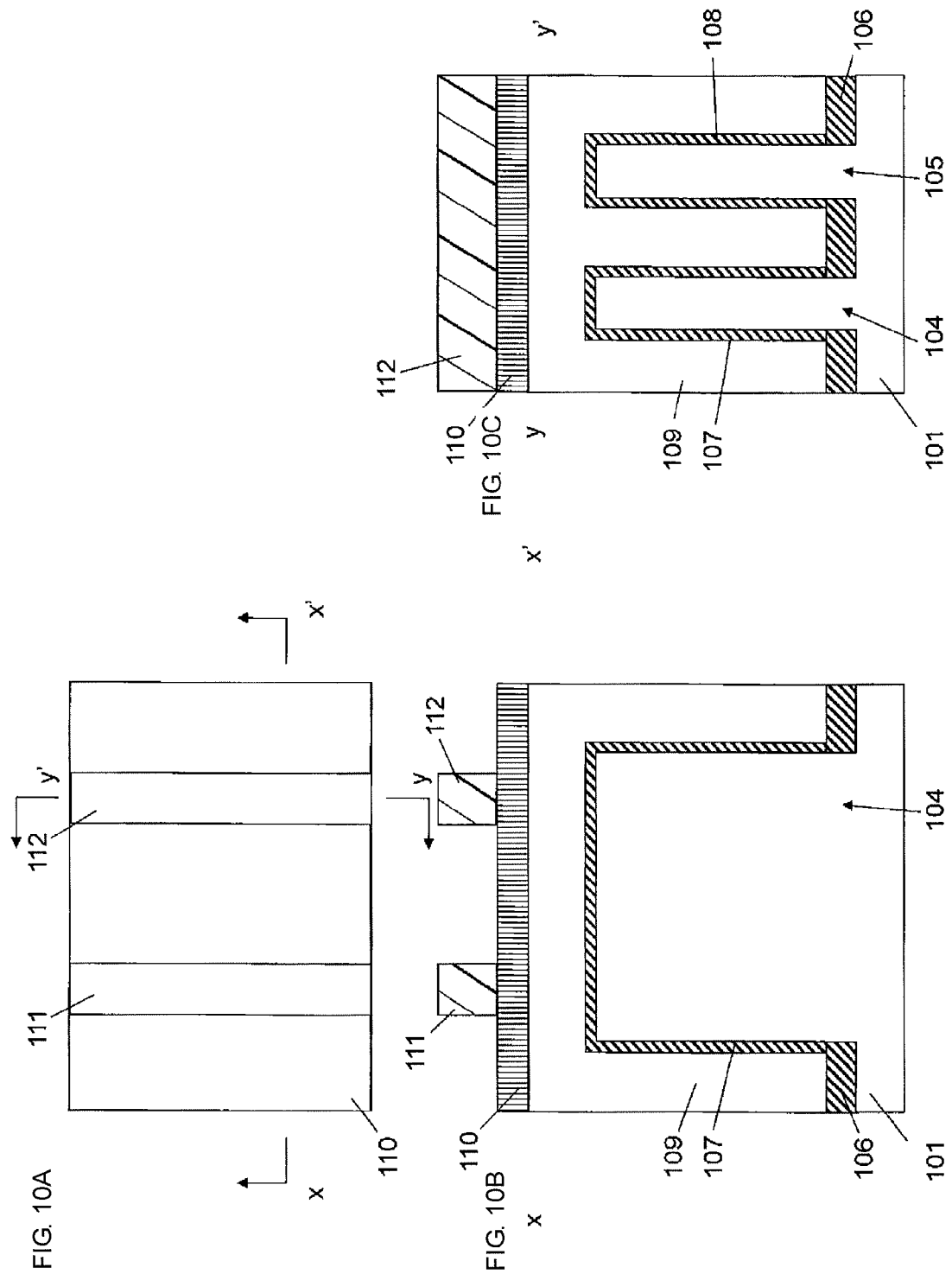

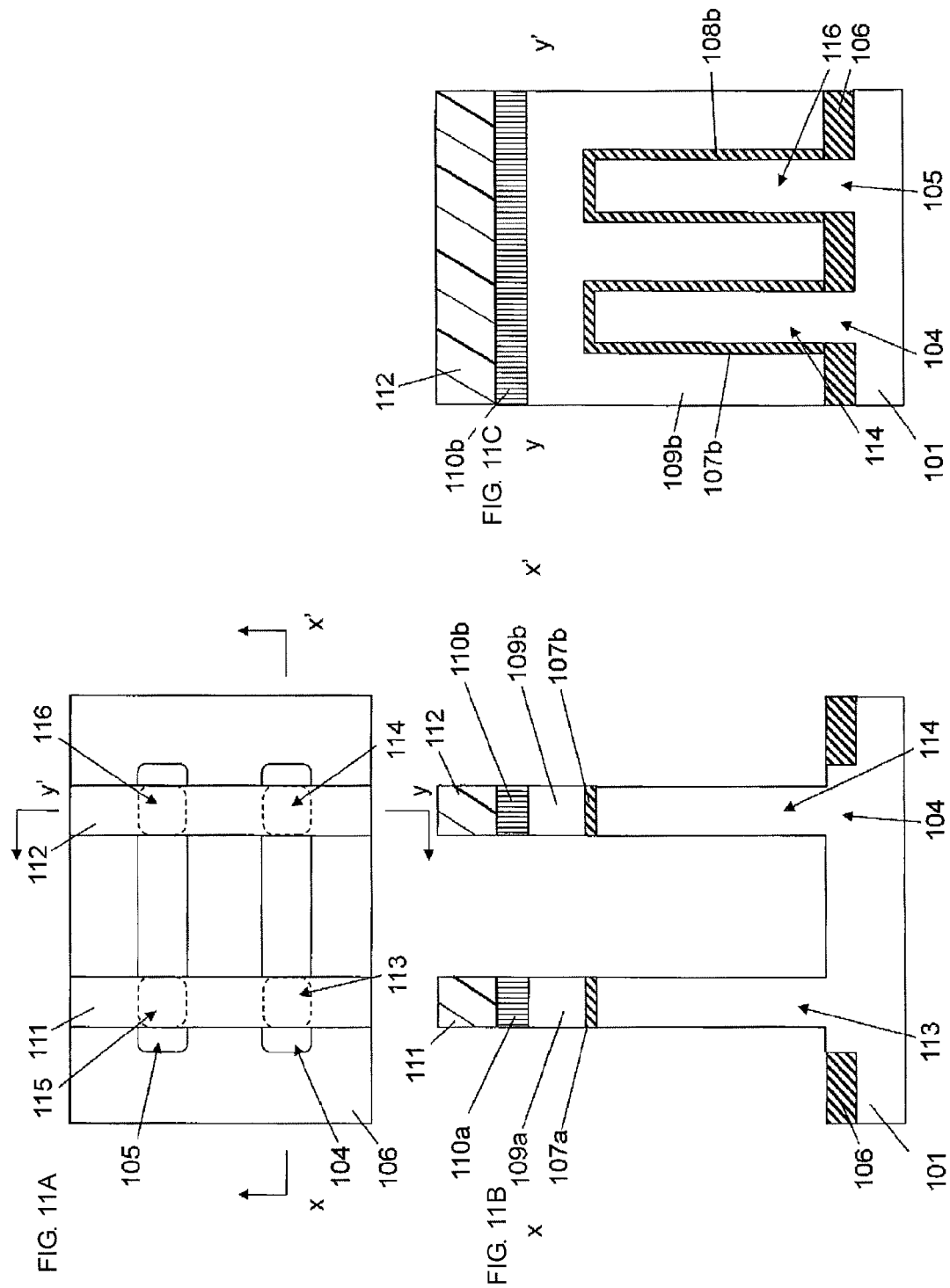

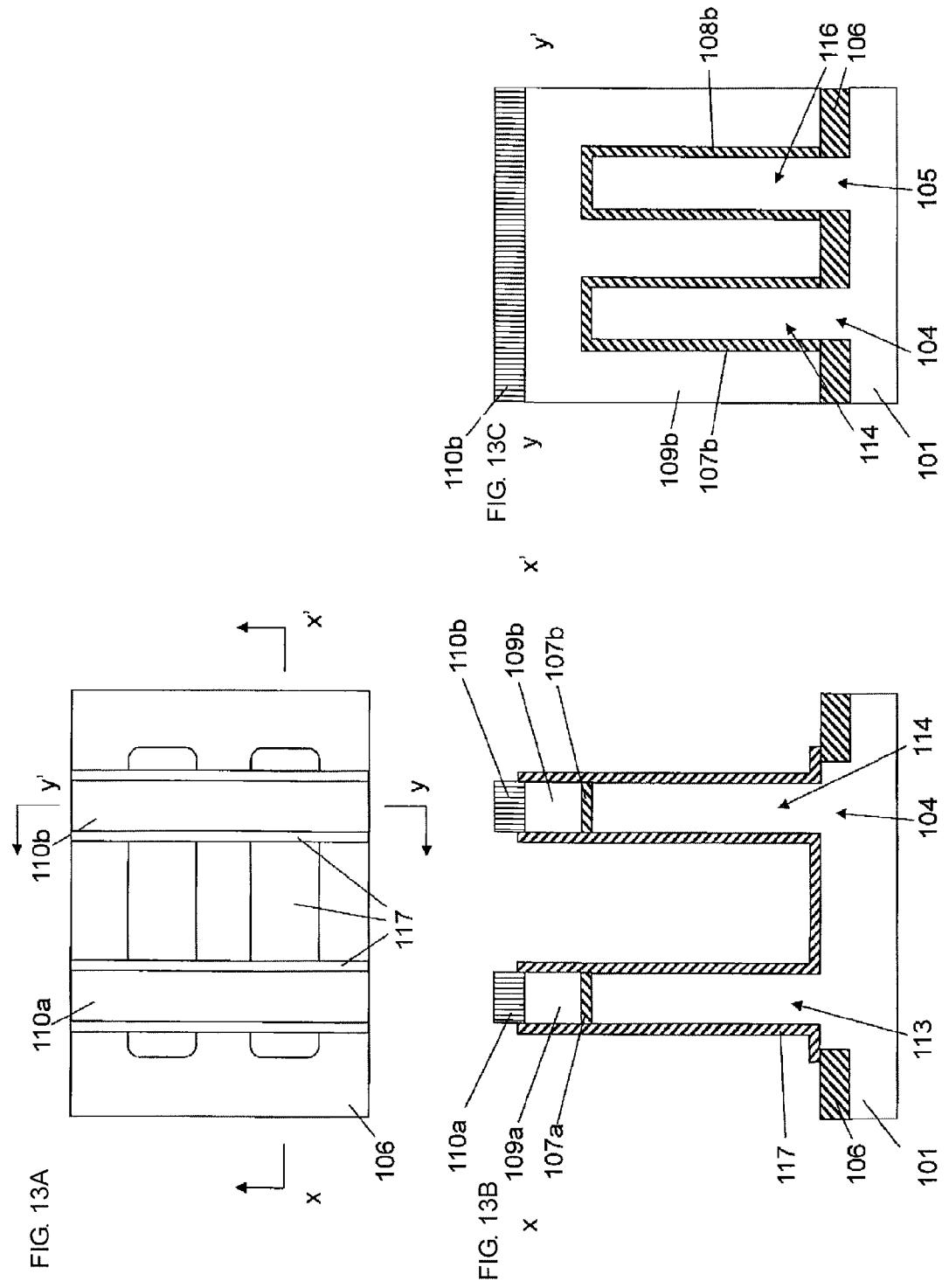

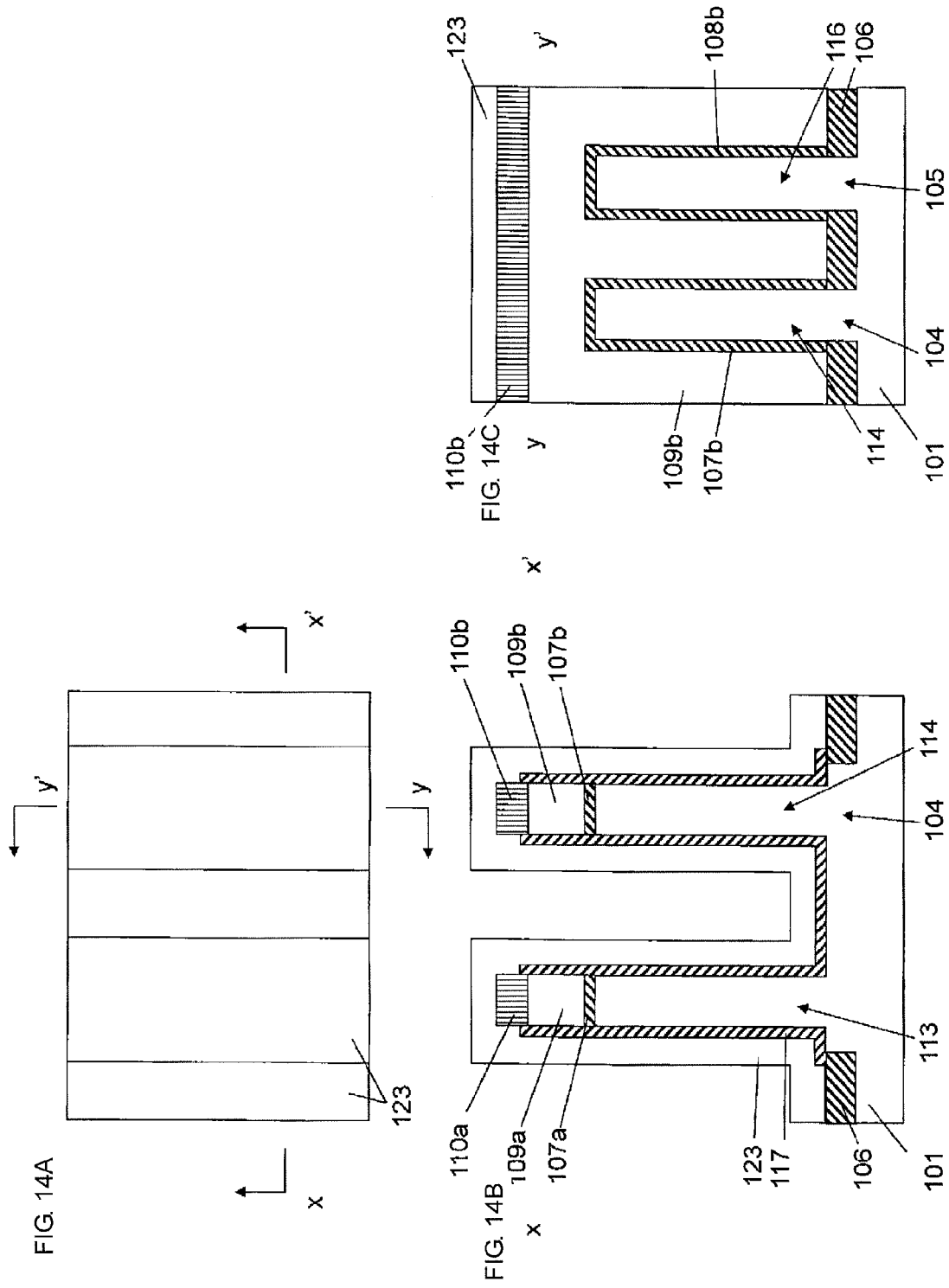

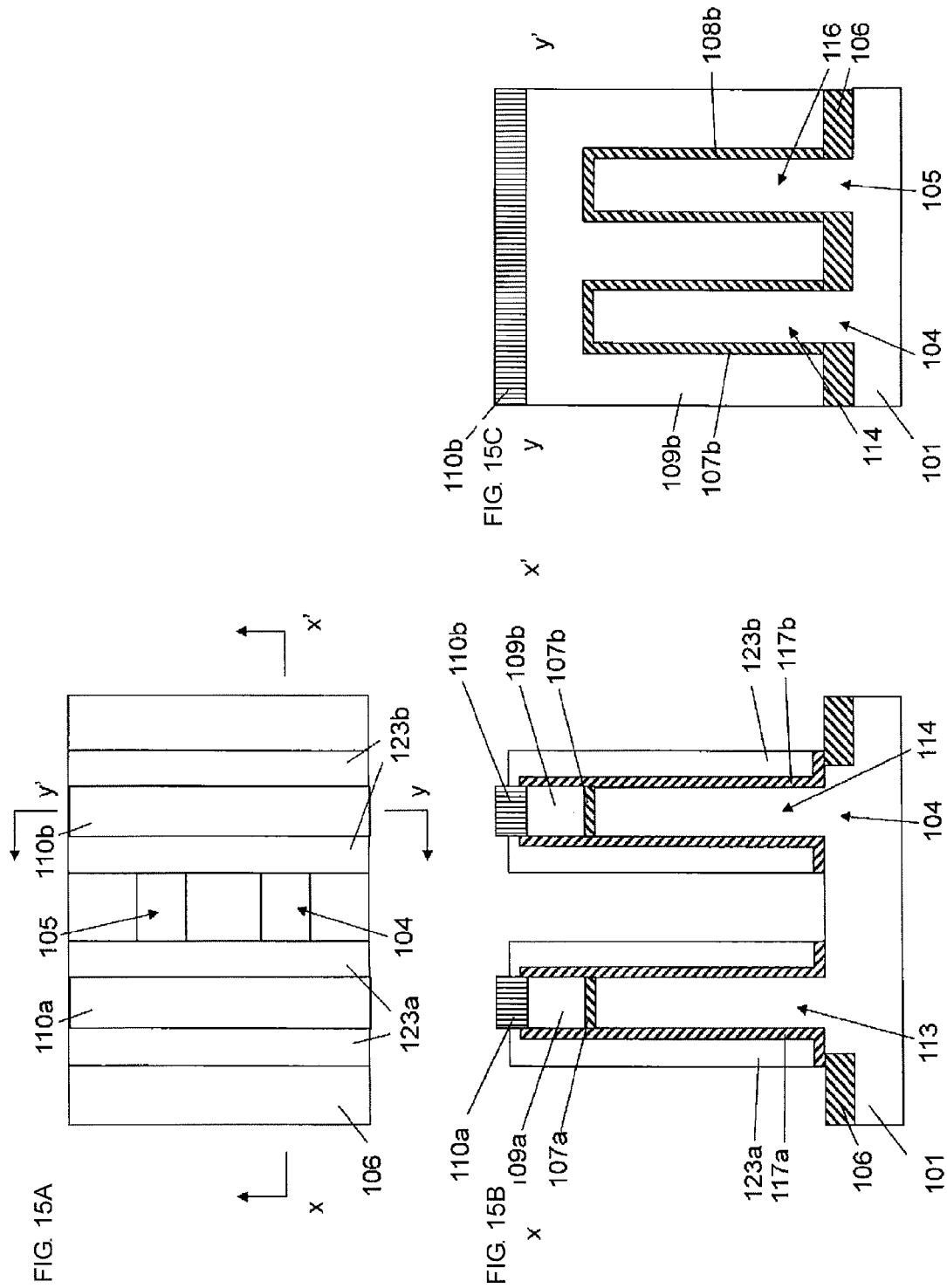

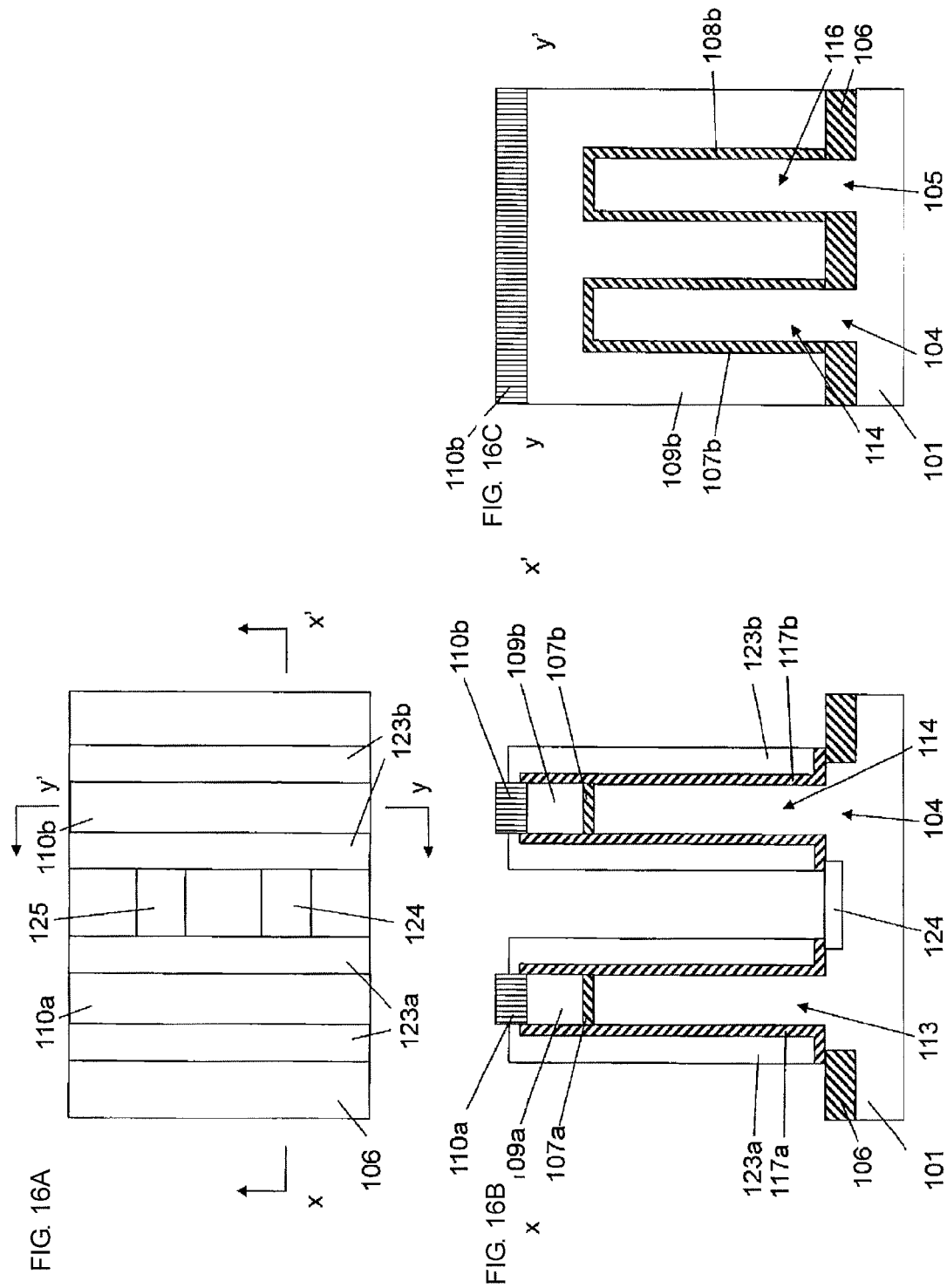

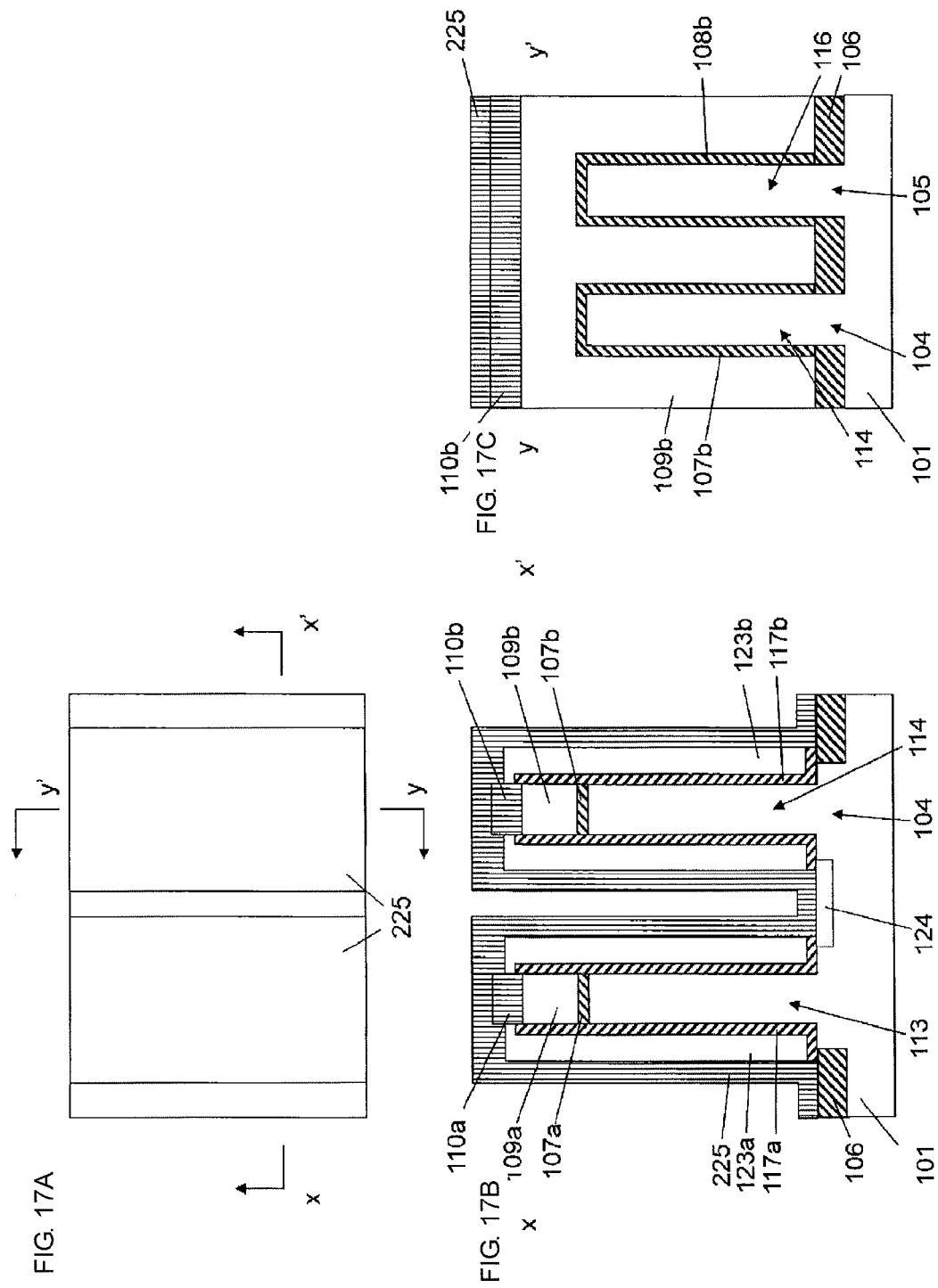

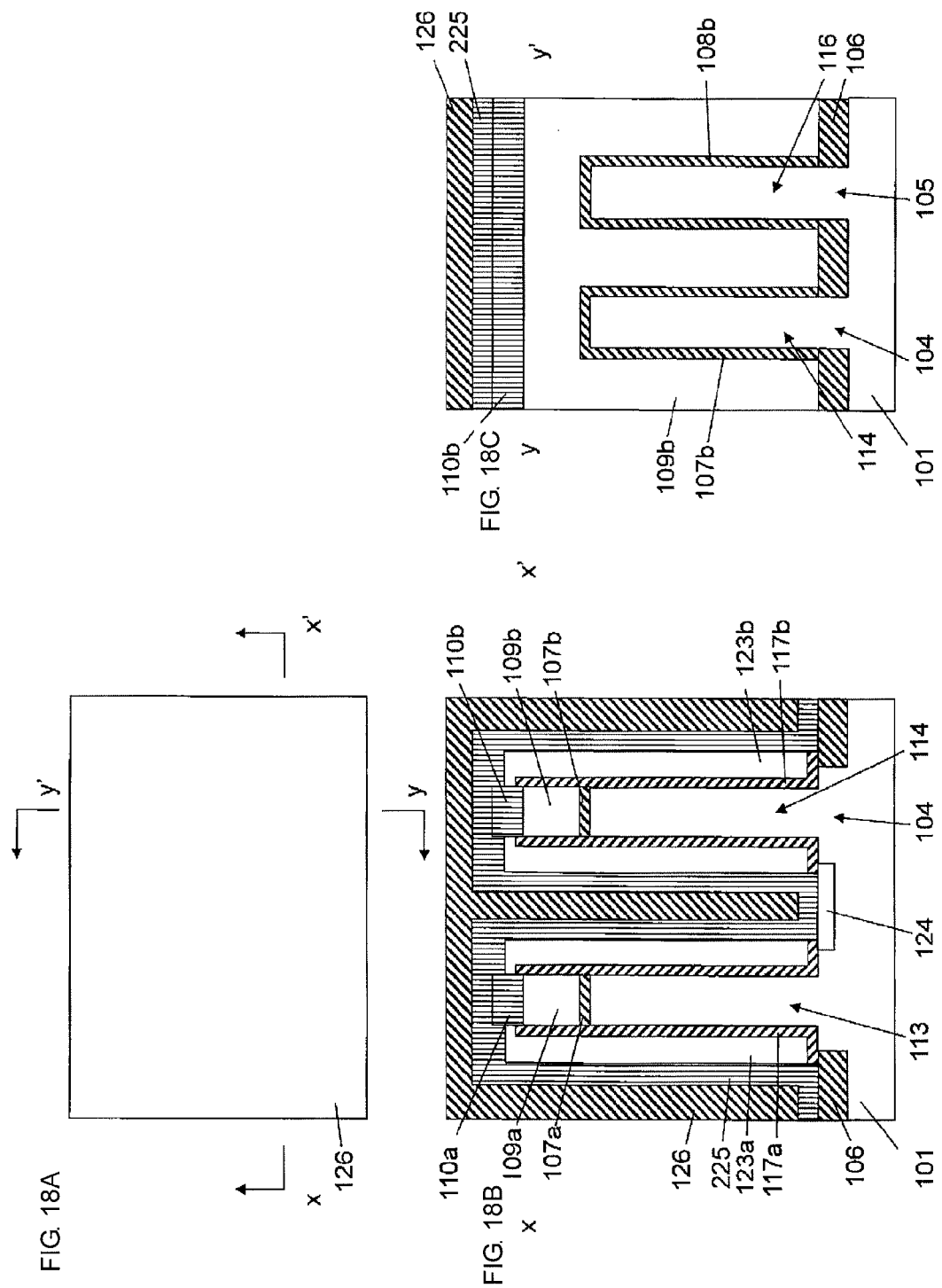

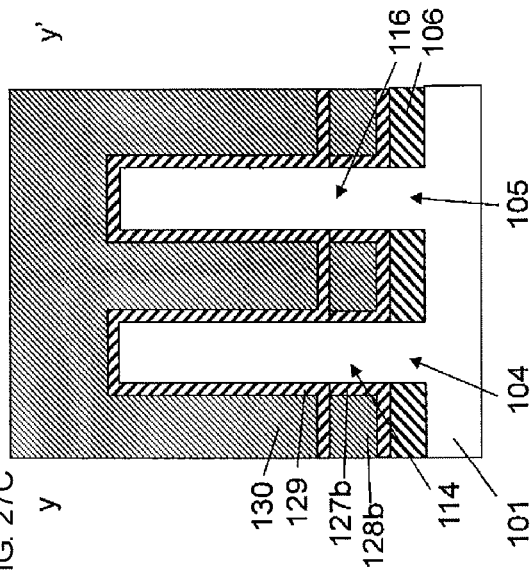
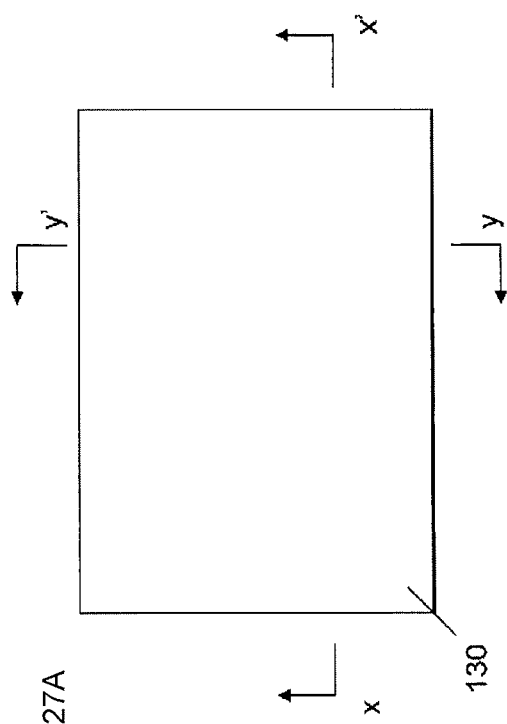
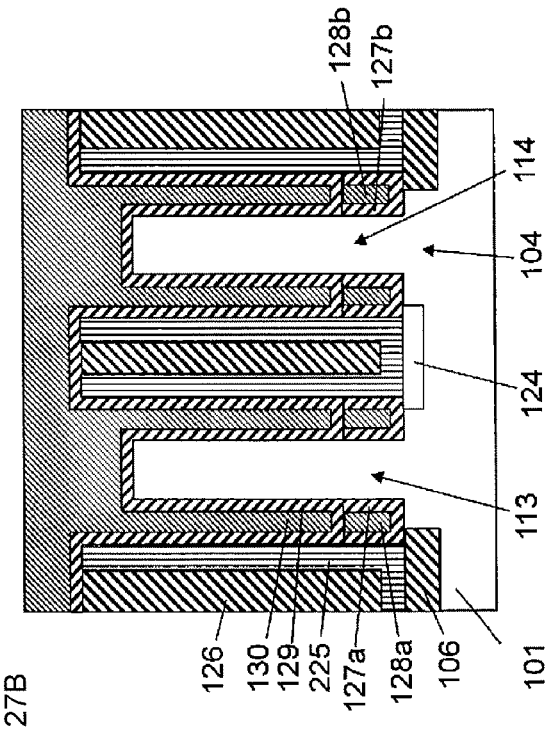

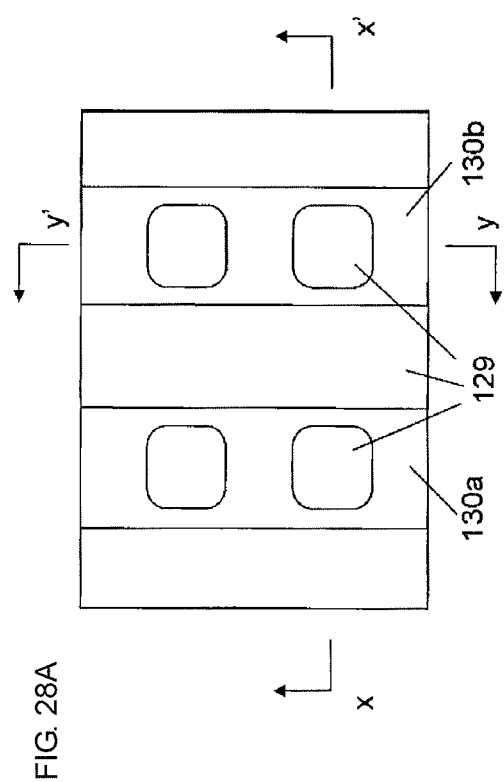
FIG. 28A
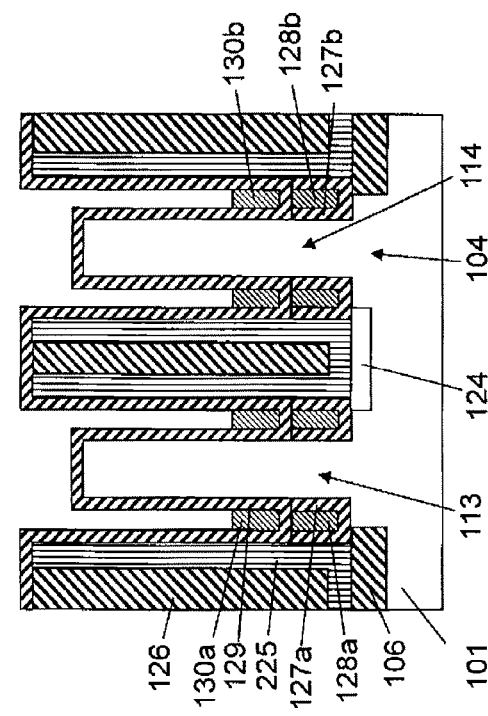
FIG. 28C
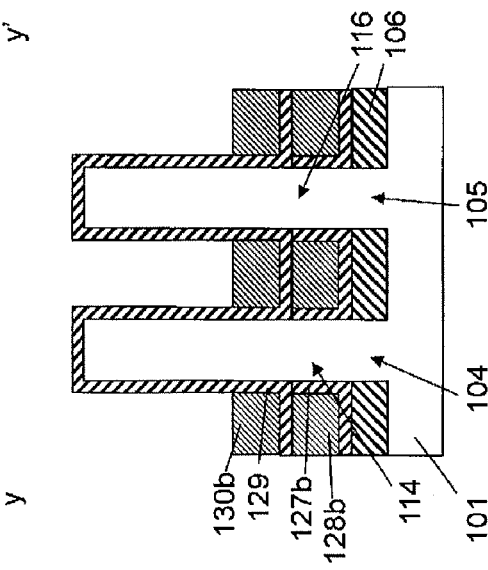
[FIG. 28B]

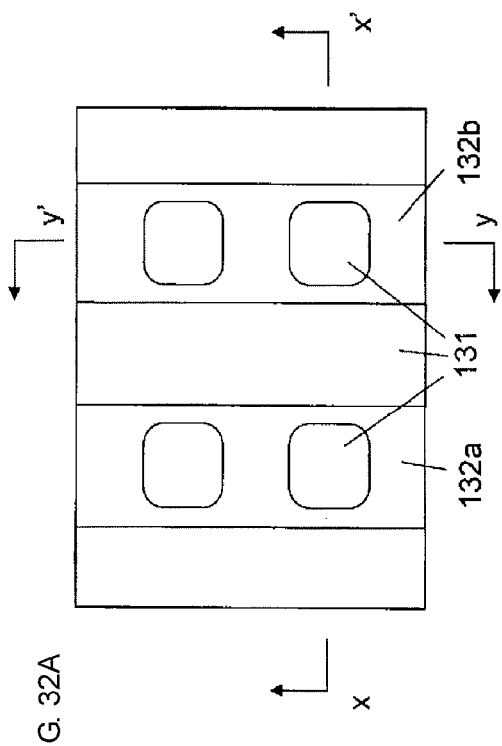
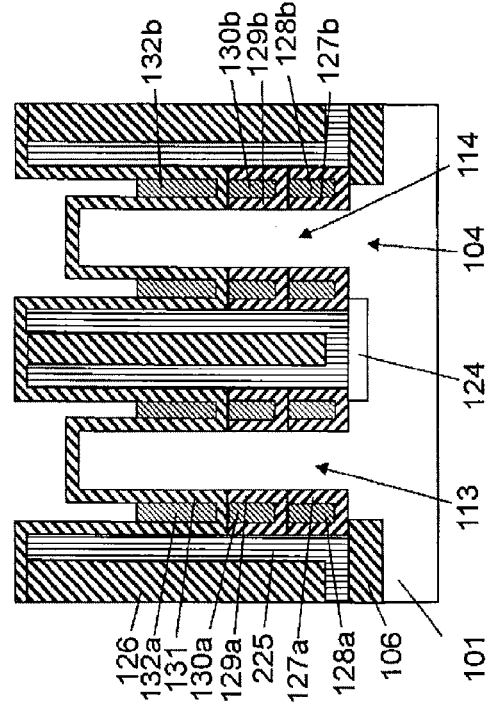
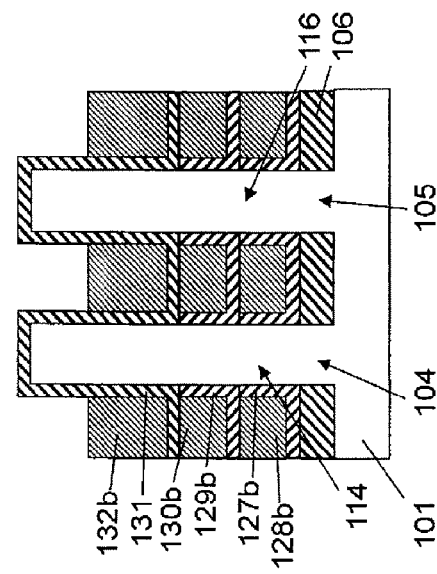
FIG. 32A
FIG. 32B
FIG. 32C

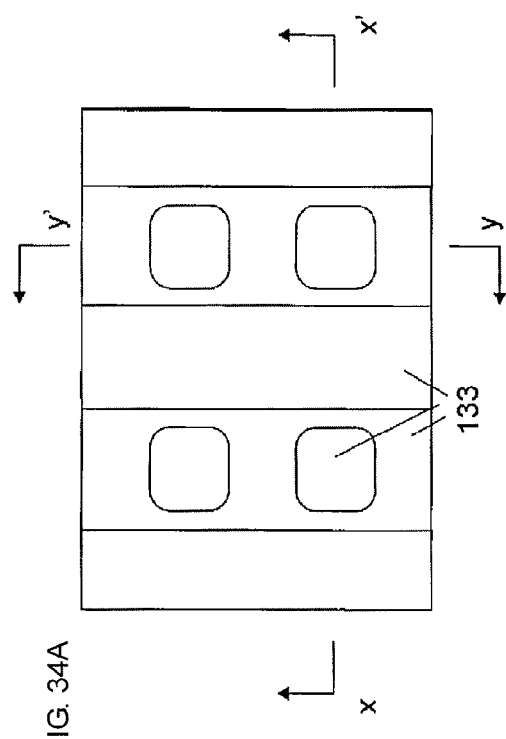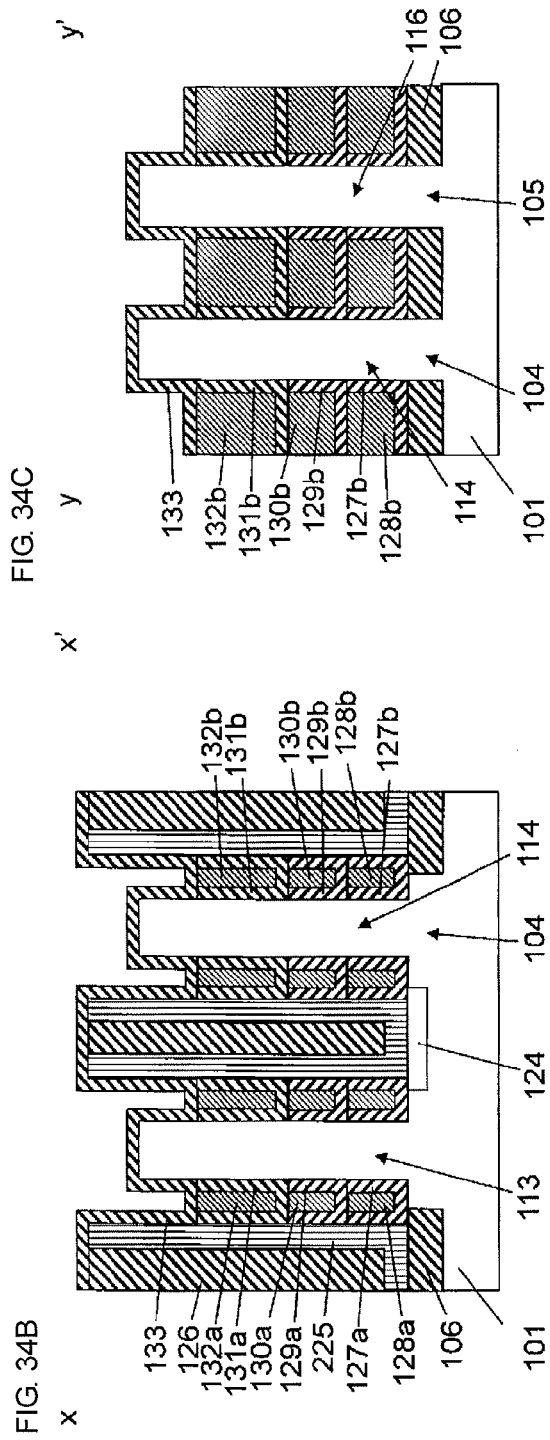

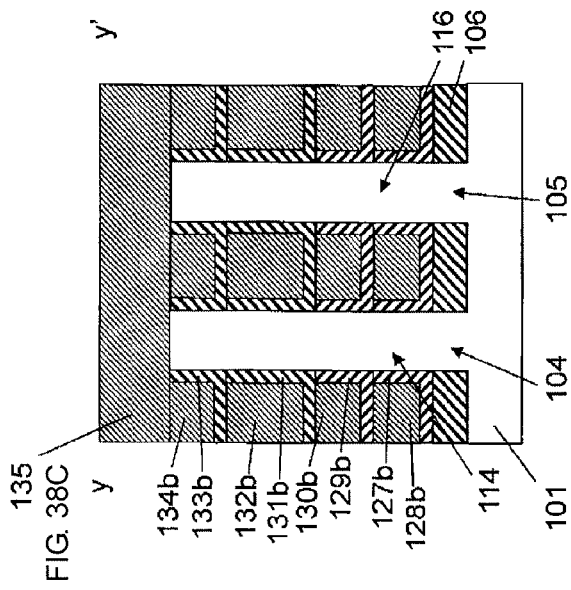
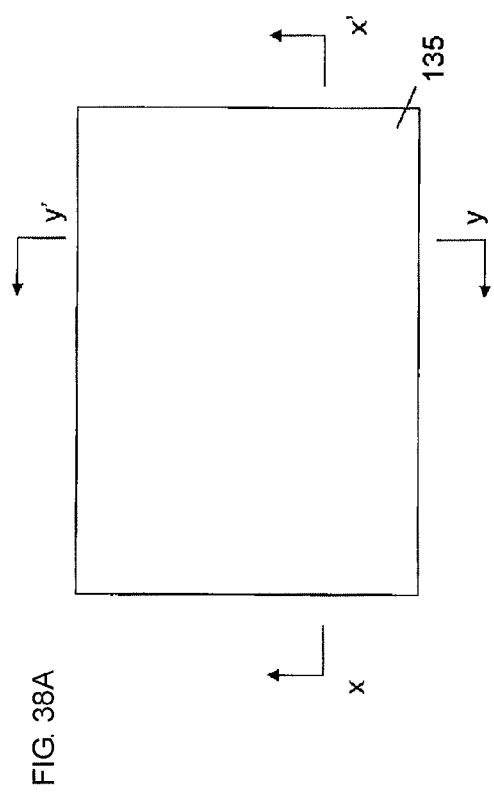
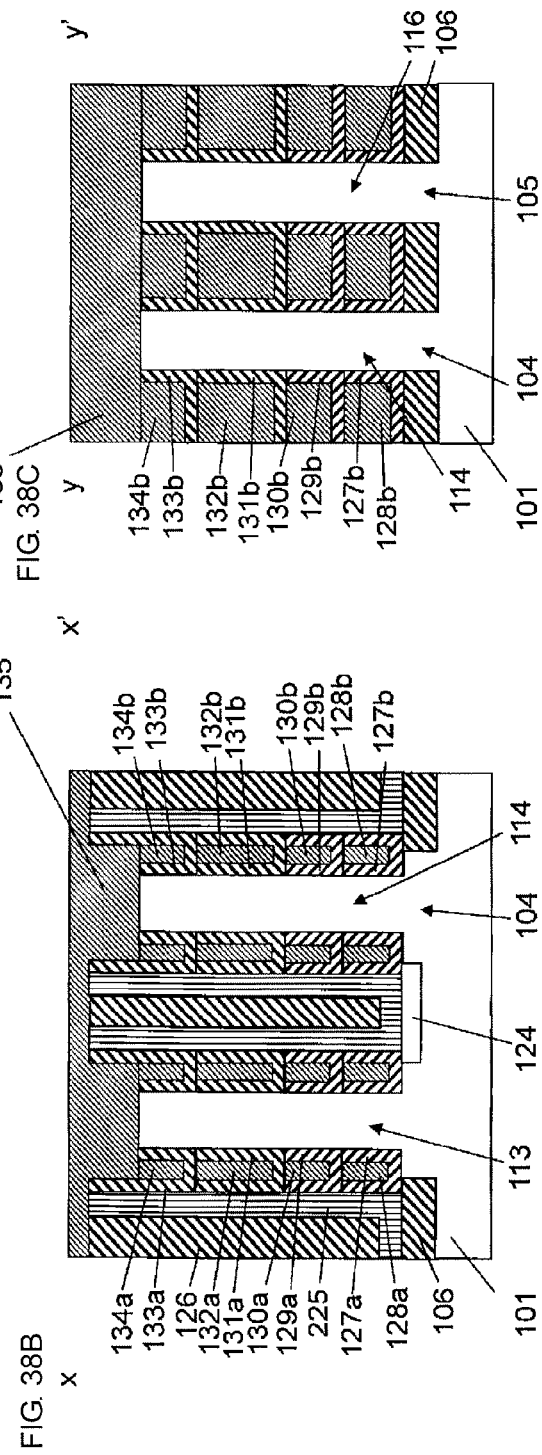

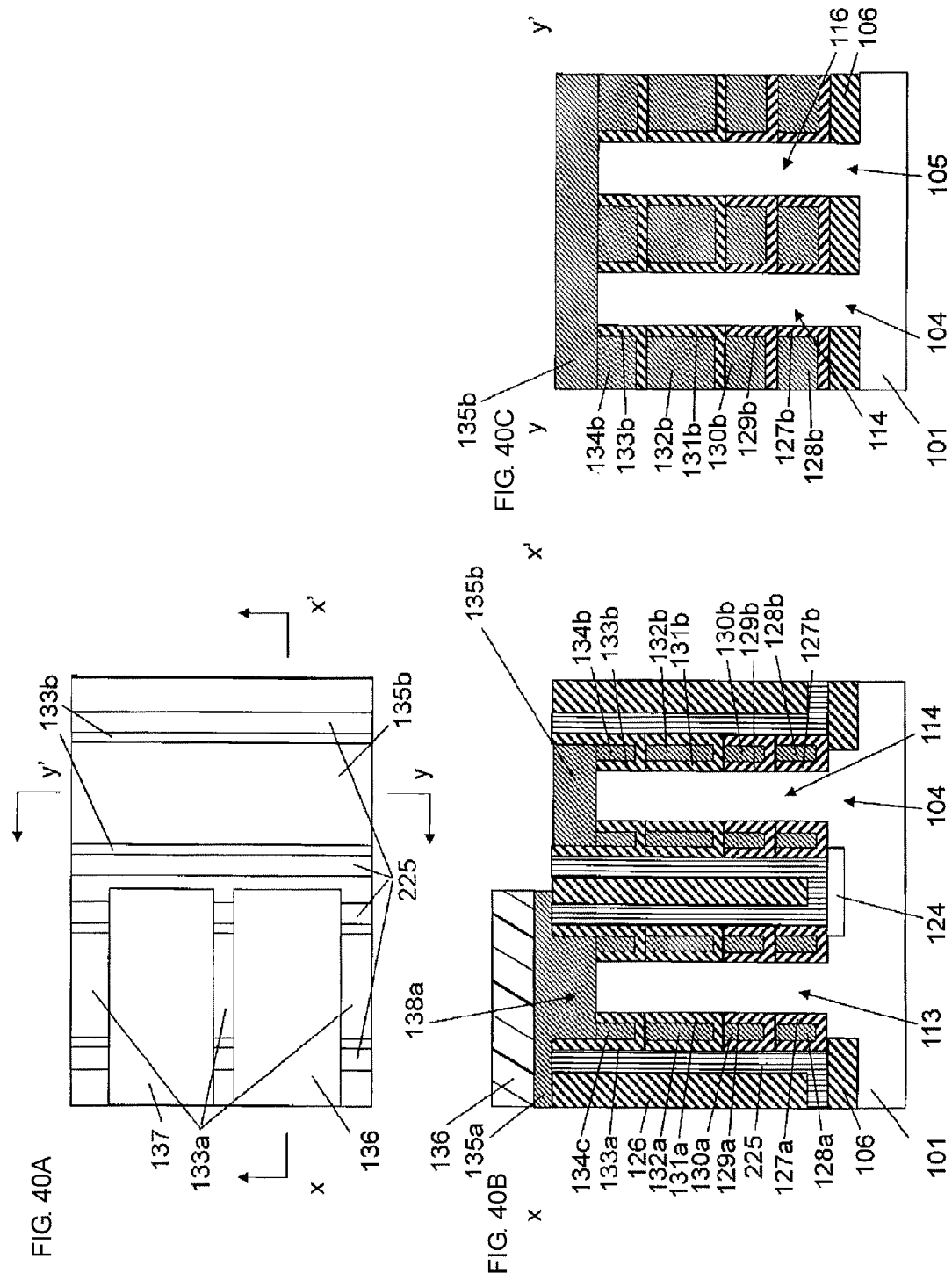

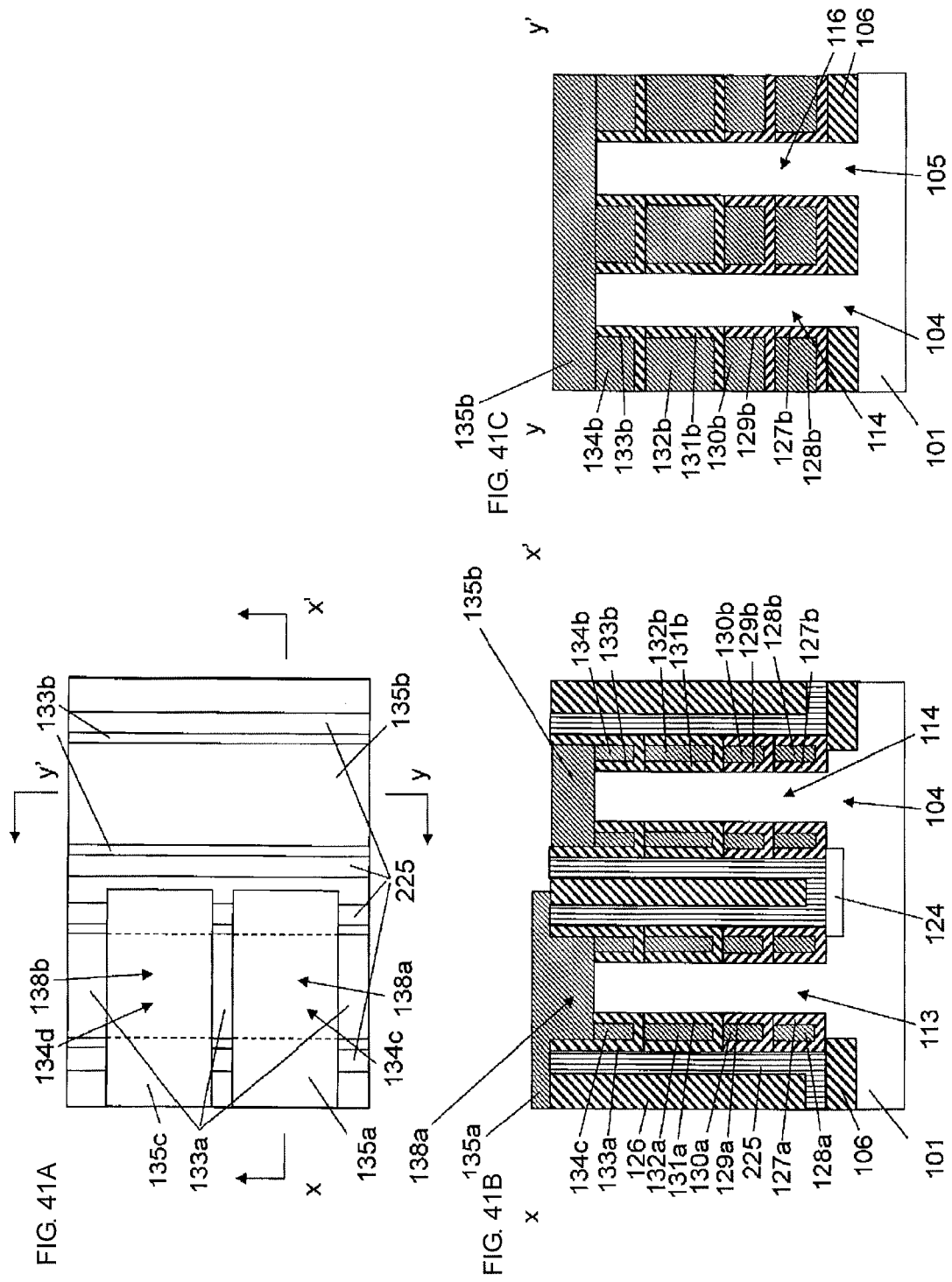

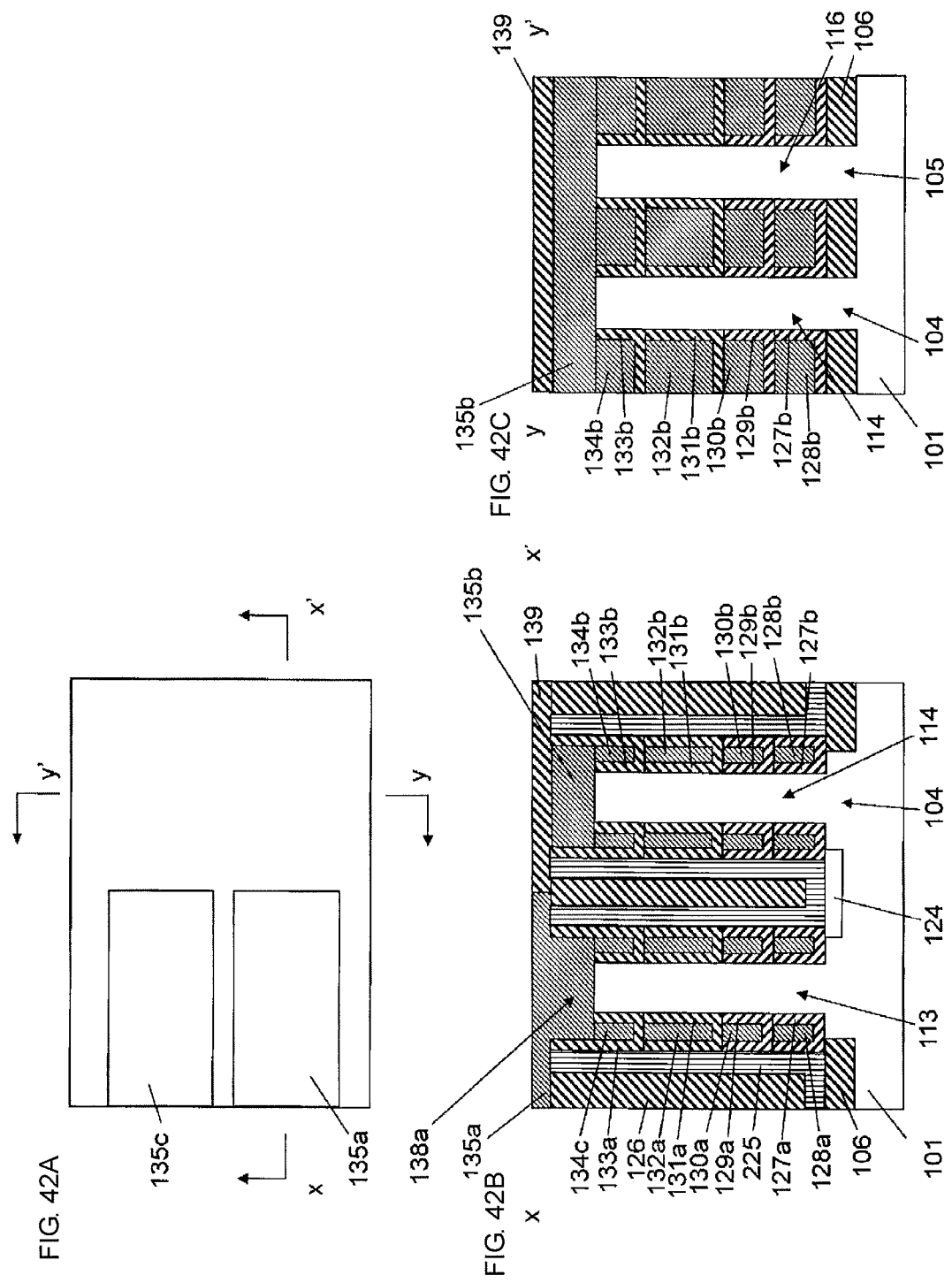

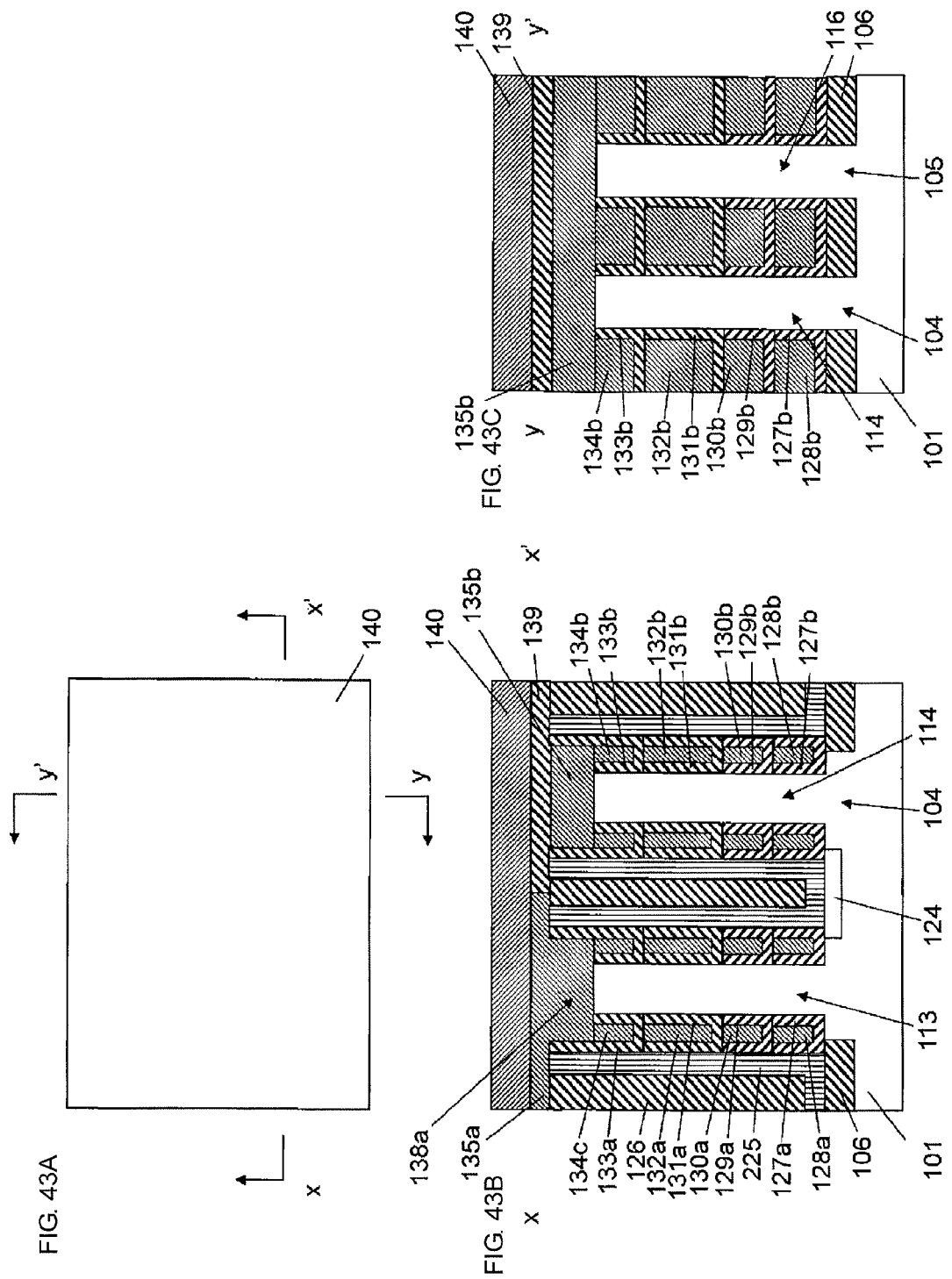

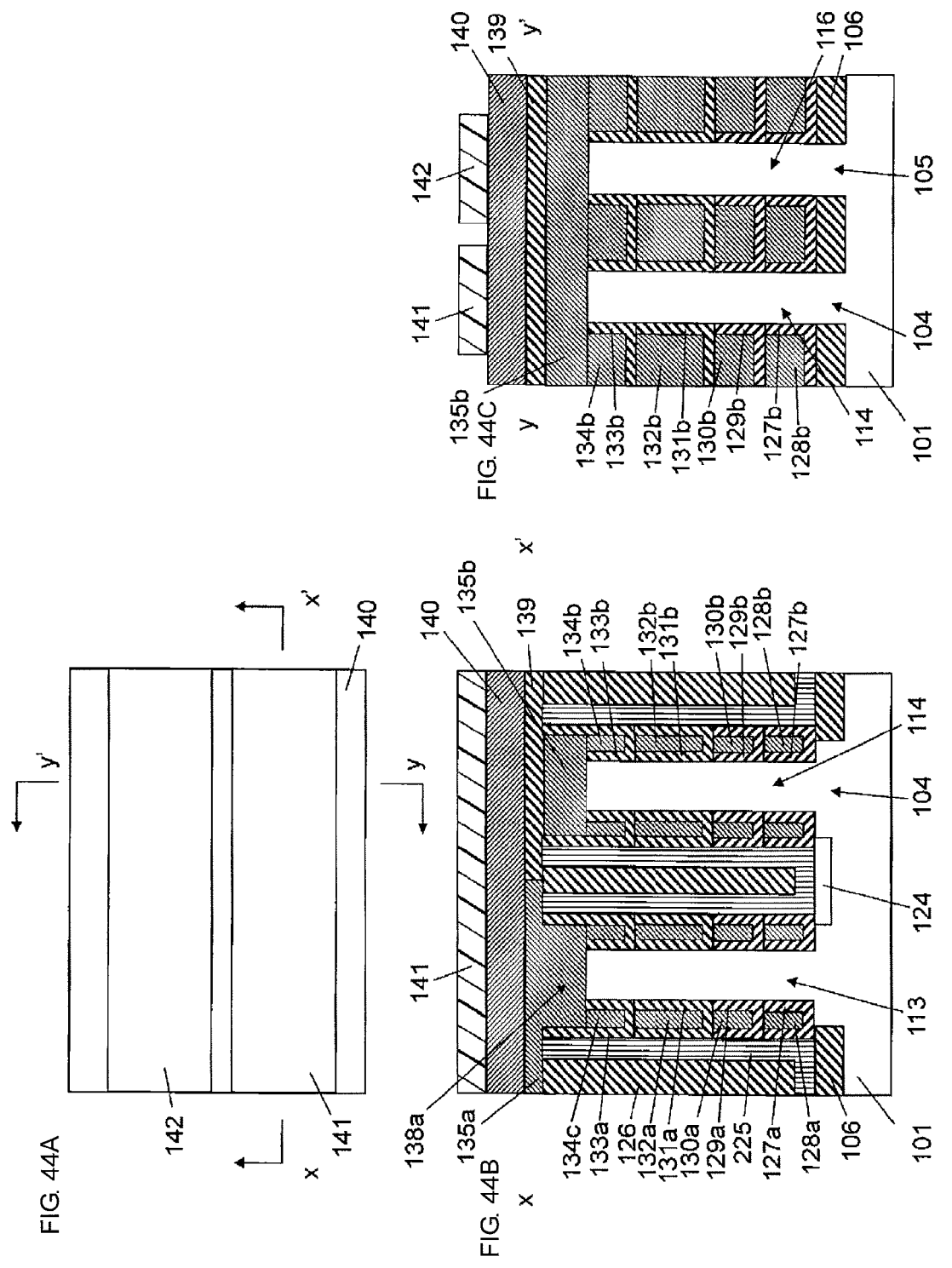

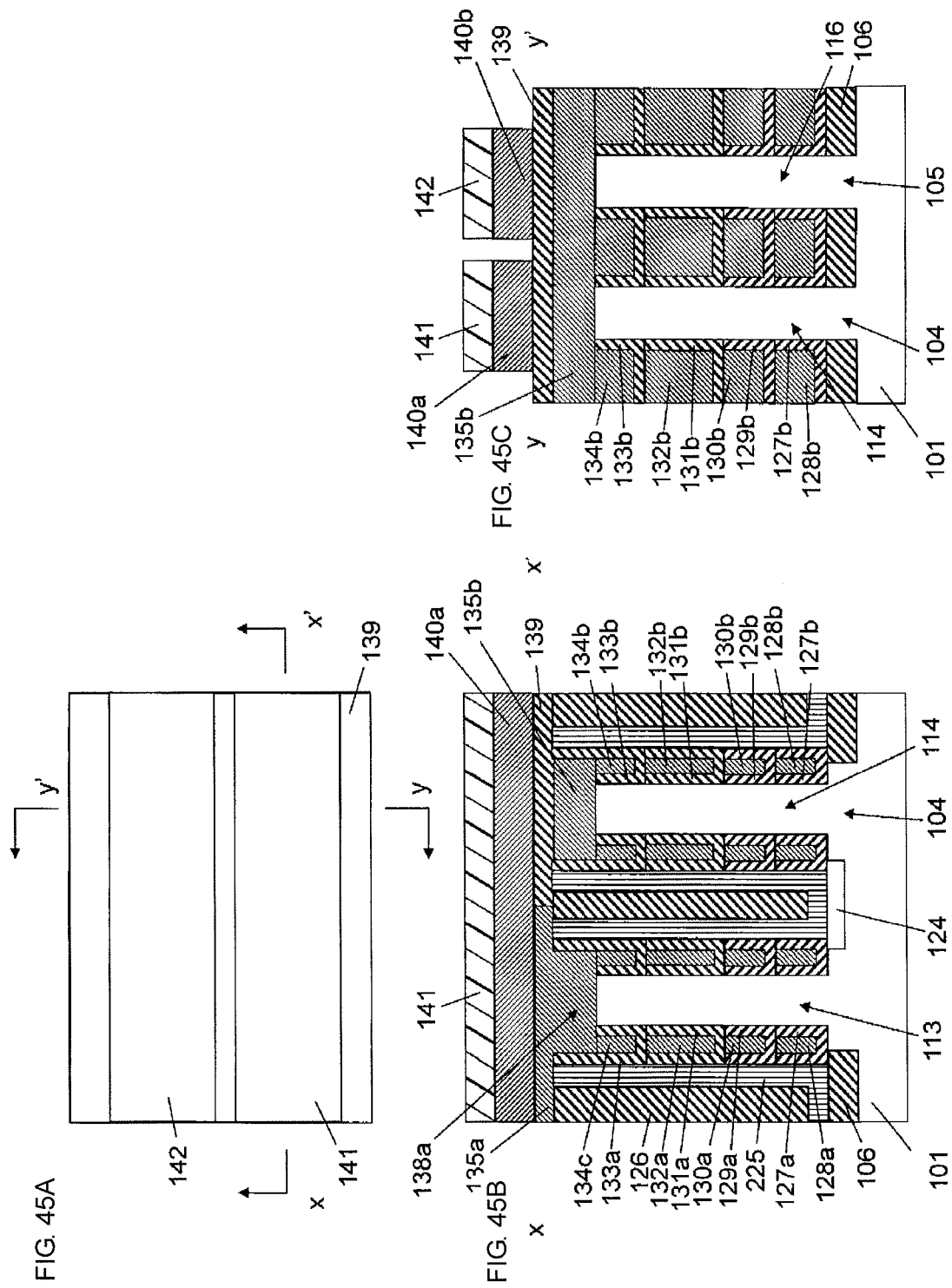

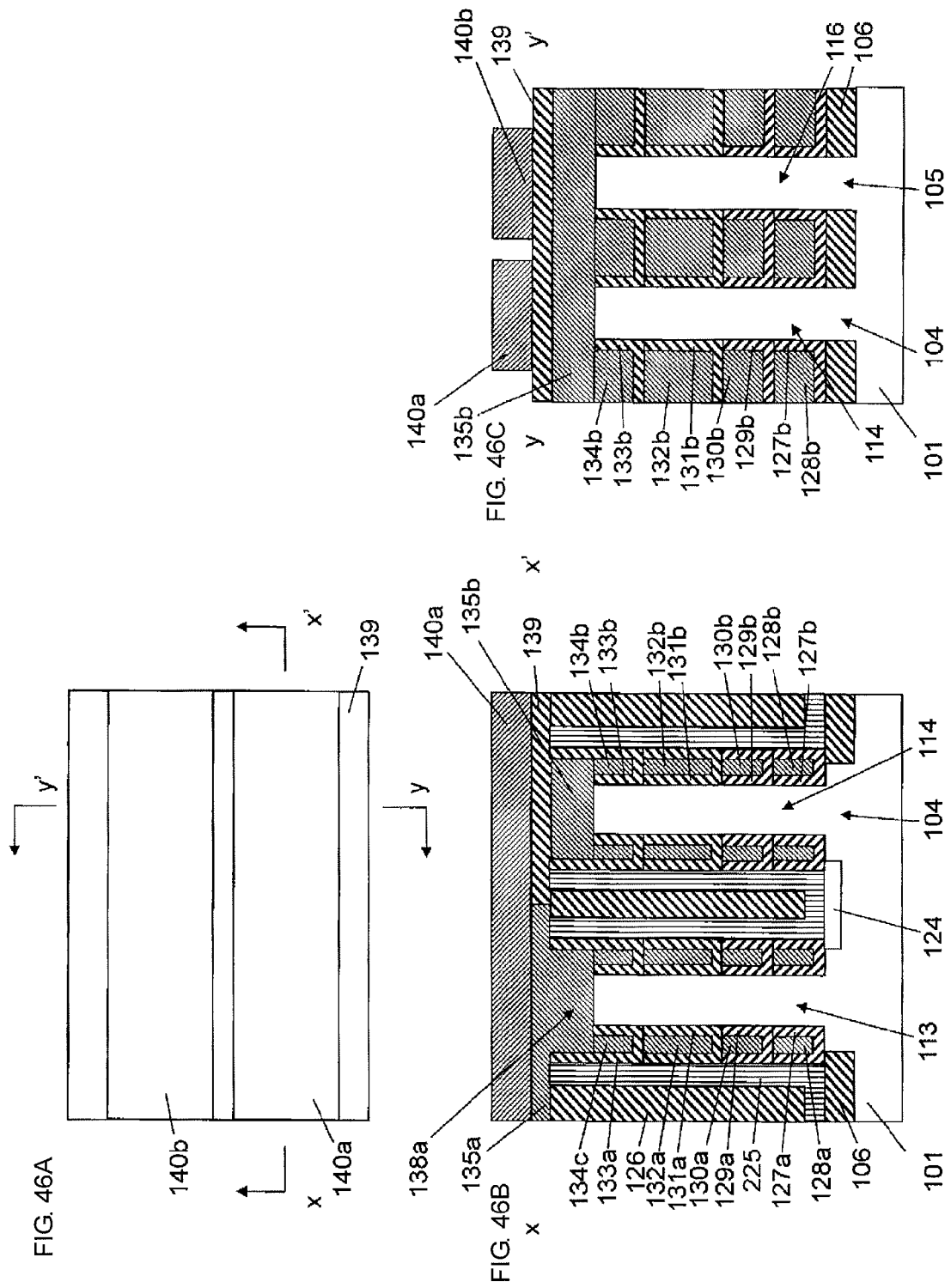

SEMICONDUCTOR DEVICE AND METHOD FOR MANUFACTURING SEMICONDUCTOR DEVICE

RELATED APPLICATIONS

This application claims priority under 35 U.S.C. §119 to Japanese Patent Application No. 2014-005481 filed on Jan. 15, 2014, the entire content of which is hereby incorporated by reference.

BACKGROUND OF THE INVENTION

1. Field of the Invention

The present invention relates to a semiconductor device and a method for manufacturing a semiconductor device.

2. Description of the Related Art

In recent years, a number of semiconductor memory devices in which memory cells are three-dimensionally arranged to increase the degree of integration of memories have been proposed (for example, see Japanese Unexamined Patent Application Publication Nos. 2007-266143 and 2013-4690).

According to one proposal, polysilicon films and silicon oxide films are alternately formed, a memory plug hole for forming a pillar-shaped semiconductor of a memory transistor is then formed, and an amorphous silicon film is deposited in the memory plug hole to form a pillar-shaped amorphous silicon layer. Then photo-etching is performed to isolate the layers of selection gate transistors (for example, see Japanese Unexamined Patent Application Publication No. 2007-266143).

In another proposal, layers of selection gate transistors and word lines are isolated (for example, see Japanese Unexamined Patent Application Publication No. 2013-4690).

In order to form a structure in which a selection gate surrounds a pillar-shaped amorphous silicon layer through a method that includes alternately forming polysilicon films and silicon oxide films, forming a memory plug hole for forming a pillar-shaped semiconductor of a memory transistor, depositing an amorphous silicon film in the memory plug hole to form a pillar-shaped amorphous silicon layer, and then isolating the layer of the selection gate transistor by photo-etching, the photoresist used for isolating the layer of the selection gate transistor needs to cover the pillar-shaped amorphous silicon layer and this requires extra spaces for mask alignment. Accordingly, the area needed for one pillar-shaped amorphous silicon layer is increased.

When amorphous silicon or polycrystalline silicon is used to form a pillar-shaped silicon layer, crystal grain boundaries decrease the charge mobility and the read rate.

In related art, a metal-gate-last process has been employed to form MOS transistors (see IEDM 2007 K. Mistry et. al, pp 247-250). A metal-gate-last process is a process that includes both a metal gate process and a high-temperature process and involves making a metal gate after performing the high-temperature process. According to this method, a gate is made by using polysilicon and then an interlayer insulating film is deposited. The polysilicon gate is exposed by chemical mechanical polishing and etched and then a metal is deposited. In order to use both a metal gate process and a high-temperature process for a SGT, a metal-gate-last process of forming a metal gate after a high-temperature process is desirably employed.

It becomes increasingly difficult to allow an impurity to exist in a silicon pillar as the silicon pillar becomes thinner. This is because density of silicon is $5 \times 10^{22}$ atoms/cm$^3$.

According to a proposal related to a SGT, a threshold voltage is determined by changing the work function of a gate material and adjusting the channel density to a level as low as $10^{17}$ cm$^{-3}$ or less (for example, see Japanese Unexamined Patent Application Publication No. 2004-356314).

According to a proposed planar-type MOS transistor, a side wall in the LDD region is formed of polycrystalline silicon having the same conductivity type as that of a low-concentration layer. In this transistor, surface carriers in the LDD region are induced by the difference in work function and the impedance in the LDD region can be decreased compared to an LDD-type MOS transistor with oxide film side walls (for example, see Japanese Unexamined Patent Application Publication No. 11-297984). The polycrystalline silicon side walls are insulated from the gate electrode. The drawings show that the polycrystalline silicon side wall is isolated from the source/drain by an interlayer insulating film.

SUMMARY OF THE INVENTION

It is desirable to provide a semiconductor device structure with which misalignment between a selection gate and a pillar-shaped semiconductor layer can be avoided and a pillar-shaped semiconductor layer is formed on a fin-shaped semiconductor layer disposed on a substrate. A method for manufacturing the semiconductor device structure is also provided.

According to an aspect of the present invention, a semiconductor device includes a fin-shaped semiconductor layer disposed on a semiconductor substrate, a first insulating film disposed around the fin-shaped semiconductor layer, a first pillar-shaped semiconductor layer disposed on the fin-shaped semiconductor layer, a first gate insulating film that is disposed around the first pillar-shaped semiconductor layer and includes a charge storing layer, a first control gate disposed around the first gate insulating film, the first control gate extending in a direction perpendicular to the fin-shaped semiconductor layer, a second gate insulating film disposed around the first pillar-shaped semiconductor layer and at a position higher than the first gate insulating film, a first selection gate disposed around the second gate insulating film, the first selection gate extending in a direction perpendicular to the fin-shaped semiconductor layer, a fifth gate insulating film surrounding an upper portion of the first pillar-shaped semiconductor layer, and a first contact electrode surrounding the fifth gate insulating film, having an upper portion connected to an upper portion of the first pillar-shaped semiconductor layer.

The metal constituting the first contact electrode may have a work function between 4.0 eV and 4.2 eV.

The metal constituting the first contact electrode may have a work function between 5.0 eV and 5.2 eV.

The semiconductor device may further include a second pillar-shaped semiconductor layer disposed on the fin-shaped semiconductor layer, a third gate insulating film that is disposed around the second pillar-shaped semiconductor layer and includes a charge storing layer, a second control gate disposed around the third gate insulating film, the second control gate extending in a direction perpendicular to the fin-shaped semiconductor layer, a fourth gate insulating film disposed around the second pillar-shaped semiconductor layer and at a position higher than the third gate insulating film, a second selection gate disposed around the fourth gate insulating film, the second selection gate extending in a direction perpendicular to the fin-shaped semiconductor layer, a sixth gate insulating film surrounding an upper portion of the second pillar-shaped semiconductor layer, a second contact electrode surrounding the sixth gate insulating film, and a source line connected to an upper portion of the second pillar-shaped semiconductor layer and an upper portion of the second contact electrode and extending in a direction perpendicular to the fin-shaped semiconductor layer.

The first gate insulating film may include a nitride film as the charge storing layer.

The first control gate may include two or more first control gates arranged in a direction perpendicular to the substrate.

The second control gate may include two or more second control gates arranged in a direction perpendicular to the substrate.

The width of the first pillar-shaped semiconductor layer in a direction perpendicular to the fin-shaped semiconductor layer may be equal to the width of the fin-shaped semiconductor layer in the direction perpendicular to the fin-shaped semiconductor layer. The first gate insulating film may be disposed around and at a bottom portion of the first control gate.

The width of the second pillar-shaped semiconductor layer in a direction perpendicular to the fin-shaped semiconductor layer may be equal to the width of the fin-shaped semiconductor layer in the direction perpendicular to the fin-shaped semiconductor layer. The third gate insulating film may be disposed around and at a bottom portion of the second control gate.

The semiconductor device may further include a first diffusion layer disposed in an upper portion of the fin-shaped semiconductor layer, the upper portion lying between the first pillar-shaped semiconductor layer and the second pillar-shaped semiconductor layer.

The second gate insulating film may be disposed around and at a bottom portion of the first selection gate.

The fourth gate insulating film may be disposed around and at a bottom portion of the second selection gate.

According to another aspect of the present invention, a method for manufacturing a semiconductor device includes a first step that includes forming fin-shaped semiconductor layers on a semiconductor substrate and forming a first insulating film around the fin-shaped semiconductor layers; a second step following the first step, the second step including forming second insulating films around the fin-shaped semiconductor layers, depositing a first polysilicon on the second insulating films to perform planarization, forming a second resist for forming a control gate, a selection gate, a first pillar-shaped semiconductor layer, a second pillar-shaped semiconductor layer, and a contact line, the second resist being formed in a direction perpendicular to the fin-shaped semiconductor layers, and etching the first polysilicon, the second insulating film, and the fin-shaped semiconductor layers so as to form first pillar-shaped semiconductor layers, a first dummy gate formed of the first polysilicon, second pillar-shaped semiconductor layers, and a second dummy gate formed of the first polysilicon; a third step following the second step, the third step including forming a fourth insulating film around the first pillar-shaped semiconductor layers, the second pillar-shaped semiconductor layers, the first dummy gate, and the second dummy gate, depositing a second polysilicon around the fourth insulating film, and etching the second polysilicon so that the second polysilicon remains on side walls of the first dummy gate, the first pillar-shaped semiconductor layers, the second dummy gate, and the second pillar-shaped semiconductor layers so as to form a third dummy gate and a fourth dummy gate; a fourth step including forming first diffusion layers in upper portions of the fin-shaped semiconductor layers and forming a fifth insulating film around the third dummy gate and the fourth dummy gate; a fifth step following the fourth step, the fifth step including depositing an interlayer insulating film to perform planarization, exposing upper portions of the first dummy gate, the second dummy gate, the third dummy gate, and the fourth dummy gate, removing the first dummy gate, the second dummy gate, the third dummy gate, and the fourth dummy gate, and removing the second insulating films and the fourth insulating film; a sixth step following the fifth step, the sixth step including forming an insulating film, which will form a first gate insulating film and a third gate insulating film and includes a charge storing layer, around the first pillar-shaped semiconductor layers, around the second pillar-shaped semiconductor layers, and on inner surfaces of the fifth insulating film, depositing a gate conductive film, etching back the gate conductive film to form a first control gate around the first pillar-shaped semiconductor layers and a second control gate around the second pillar-shaped semiconductor layers, and removing exposed portions of the insulating film, which will form a first gate insulating film and a third gate insulating film and includes a charge storing layer; a seventh step following the sixth step, the seventh step including depositing an insulating film, which will form a second gate insulating film and a fourth gate insulating film, around the first pillar-shaped semiconductor layers, on the first control gate, around the second pillar-shaped semiconductor layers, and on the second control gate, depositing a gate conductor, and etching back the gate conductor to form a first selection gate around the first pillar-shaped semiconductor layers and a second selection gate around the second pillar-shaped semiconductor layers; and an eighth step following the seventh step, the eighth step including depositing an insulating film, which will form a fifth gate insulating film and a sixth gate insulating film, around the first pillar-shaped semiconductor layers, on the first selection gate, around the second pillar-shaped semiconductor layers, and on the second selection gate, depositing a gate conductor, and etching back the gate conductor to form first contact electrodes around upper portions of the first pillar-shaped semiconductor layers and second contact electrodes around upper portions of the second pillar-shaped semiconductor layers.

The sixth step may be performed two or more times.

The method may further include forming a third insulating film on the first polysilicon after the first polysilicon is deposited on the second insulating films to perform planarization.

The present invention provides a semiconductor device structure with which misalignment between a selection gate and a pillar-shaped semiconductor layer can be avoided and a pillar-shaped semiconductor layer is formed on a fin-shaped semiconductor layer disposed on a substrate. A method for manufacturing the semiconductor device structure is also provided.

Although end portions of control gates and selection gates need to be separately worked, fin-shaped semiconductor layers, pillar-shaped semiconductor layers, control gates, and selection gates can be formed by self-alignment using two masks.

Thus, misalignment between a selection gate and a pillar-shaped semiconductor layer can be reduced. Misalignment between a control gate and a pillar-shaped semiconductor layer can be reduced. Thus, the area needed for one pillar-shaped semiconductor layer can be decreased.

Since a pillar-shaped semiconductor layer is formed on a fin-shaped semiconductor layer formed on a substrate, the pillar-shaped semiconductor layer is composed of single crystals. Thus, the decrease in charge mobility caused by crystal grain boundaries can be avoided and the decrease in read rate caused by crystal grain boundaries can be avoided.

Moreover, an existing metal-gate-last manufacturing process can be employed which includes making a first dummy gate, a second dummy gate, a third dummy gate, and a fourth dummy gate by using polysilicon, depositing an interlayer insulating film, performing chemical mechanical polishing to expose the first dummy gate, the second dummy gate, the third dummy gate, and the fourth dummy gate, etching the polysilicon gates, and depositing a metal. Thus, an SGT-type flash memory that includes control gates and selection gates composed of metal can be easily manufactured.

The gate insulting film formed around and at a bottom portion of the control gate insulates the control gate from the pillar-shaped semiconductor layer and the fin-shaped semiconductor layer.

The gate insulating film formed around and at a bottom portion of the selection gate insulates the selection gate from the pillar-shaped semiconductor layer and the control gate.

Moreover, since device isolation is achieved by the first insulating film formed around the fin-shaped semiconductor layer, a memory string can be formed by the first pillar-shaped semiconductor layer, the fin-shaped semiconductor layer, and the second pillar-shaped semiconductor layer.

Application of a metal-gate-last process to making of SGTs is difficult since the upper portion of the pillar-shaped semiconductor layer is covered with a polysilicon gate and it is difficult to form a diffusion layer in an upper portion of the pillar-shaped semiconductor layer. Accordingly, it is desirable to form a diffusion layer in an upper portion of the pillar-shaped semiconductor layer prior to forming a polysilicon gate. In contrast, according to the present invention, no diffusion layer is formed in an upper portion of the pillar-shaped semiconductor layer and the upper portion of the pillar-shaped semiconductor layer can be made to function as an n-type or p-type semiconductor layer due to the difference in work function between the metal and the semiconductor. Accordingly, a step of forming a diffusion layer in an upper portion of the pillar-shaped semiconductor layer can be omitted.

BRIEF DESCRIPTION OF THE DRAWINGS

FIG. 1A is a plan view of a semiconductor device according to one embodiment, FIG. 1B is a cross-sectional view taken at line X-X' in FIG. 1A, and FIG. 1C is a cross-sectional view taken at line Y-Y' in FIG. 1A.

FIG. 2A is a plan view related to a method for manufacturing a semiconductor device according to one embodiment, FIG. 2B is a cross-sectional view taken at line X-X' in FIG. 2A, and FIG. 2C is a cross-sectional view taken at line Y-Y' in FIG. 2A.

FIG. 5A is a plan view related to the method for manufacturing a semiconductor device according to one embodiment, FIG. 5B is a cross-sectional view taken at line X-X' in FIG. 5A, and FIG. 5C is a cross-sectional view taken at line Y-Y' in FIG. 5A.

FIG. 6A is a plan view related to the method for manufacturing a semiconductor device according to one embodiment, FIG. 6B is a cross-sectional view taken at line X-X' in FIG. 6A, and FIG. 6C is a cross-sectional view taken at line Y-Y' in FIG. 6A.

FIG. 9A is a plan view related to the method for manufacturing a semiconductor device according to one embodiment, FIG. 9B is a cross-sectional view taken at line X-X' in FIG. 9A, and FIG. 9C is a cross-sectional view taken at line Y-Y' in FIG. 9A.

FIG. 10A is a plan view related to the method for manufacturing a semiconductor device according to one embodiment, FIG. 10B is a cross-sectional view taken at line X-X' in FIG. 10A, and FIG. 10C is a cross-sectional view taken at line Y-Y' in FIG. 10A.

FIG. 11A is a plan view related to the method for manufacturing a semiconductor device according to one embodiment, FIG. 11B is a cross-sectional view taken at line X-X' in FIG. 11A, and FIG. 11C is a cross-sectional view taken at line Y-Y' in FIG. 11A.

FIG. 13A is a plan view related to the method for manufacturing a semiconductor device according to one embodiment, FIG. 13B is a cross-sectional view taken at line X-X' in FIG. 13A, and FIG. 13C is a cross-sectional view taken at line Y-Y' in FIG. 13A.

FIG. 14A is a plan view related to the method for manufacturing a semiconductor device according to one embodiment, FIG. 14B is a cross-sectional view taken at line X-X' in FIG. 14A, and FIG. 14C is a cross-sectional view taken at line Y-Y' in FIG. 14A.

FIG. 15A is a plan view related to the method for manufacturing a semiconductor device according to one embodiment, FIG. 15B is a cross-sectional view taken at line X-X' in FIG. 15A, and FIG. 15C is a cross-sectional view taken at line Y-Y' in FIG. 15A.

FIG. 16A is a plan view related to the method for manufacturing a semiconductor device according to one embodiment, FIG. 16B is a cross-sectional view taken at line X-X' in FIG. 16A, and FIG. 16C is a cross-sectional view taken at line Y-Y' in FIG. 16A.

FIG. 17A is a plan view related to the method for manufacturing a semiconductor device according to one embodiment, FIG. 17B is a cross-sectional view taken at line X-X' in FIG. 17A, and FIG. 17C is a cross-sectional view taken at line Y-Y' in FIG. 17A.

FIG. 18A is a plan view related to the method for manufacturing a semiconductor device according to one embodiment, FIG. 18B is a cross-sectional view taken at line X-X' in FIG. 18A, and FIG. 18C is a cross-sectional view taken at line Y-Y' in FIG. 18A.

FIG. 27A is a plan view related to the method for manufacturing a semiconductor device according to one embodiment, FIG. 27B is a cross-sectional view taken at line X-X' in FIG. 27A, and FIG. 27C is a cross-sectional view taken at line Y-Y' in FIG. 27A.

FIG. 28A is a plan view related to the method for manufacturing a semiconductor device according to one embodiment, FIG. 28B is a cross-sectional view taken at line X-X' in FIG. 28A, and FIG. 28C is a cross-sectional view taken at line Y-Y' in FIG. 28A.

FIG. 32A is a plan view related to the method for manufacturing a semiconductor device according to one embodiment, FIG. 32B is a cross-sectional view taken at line X-X' in FIG. 32A, and FIG. 32C is a cross-sectional view taken at line Y-Y' in FIG. 32A.

FIG. 34A is a plan view related to the method for manufacturing a semiconductor device according to one embodiment, FIG. 34B is a cross-sectional view taken at line X-X' in FIG. 34A, and FIG. 34C is a cross-sectional view taken at line Y-Y' in FIG. 34A.

FIG. 38A is a plan view related to the method for manufacturing a semiconductor device according to one embodiment, FIG. 38B is a cross-sectional view taken at line X-X' in FIG. 38A, and FIG. 38C is a cross-sectional view taken at line Y-Y' in FIG. 38A.

FIG. 40A is a plan view related to the method for manufacturing a semiconductor device according to one embodiment, FIG. 40B is a cross-sectional view taken at line X-X' in FIG. 40A, and FIG. 40C is a cross-sectional view taken at line Y-Y' in FIG. 40A.

FIG. 41A is a plan view related to the method for manufacturing a semiconductor device according to one embodiment, FIG. 41B is a cross-sectional view taken at line X-X' in FIG. 41A, and FIG. 41C is a cross-sectional view taken at line Y-Y' in FIG. 41A.

FIG. 42A is a plan view related to the method for manufacturing a semiconductor device according to one embodiment, FIG. 42B is a cross-sectional view taken at line X-X' in FIG. 42A, and FIG. 42C is a cross-sectional view taken at line Y-Y' in FIG. 42A.

FIG. 43A is a plan view related to the method for manufacturing a semiconductor device according to one embodiment, FIG. 43B is a cross-sectional view taken at line X-X' in FIG. 43A, and FIG. 43C is a cross-sectional view taken at line Y-Y' in FIG. 43A.

FIG. 44A is a plan view related to the method for manufacturing a semiconductor device according to one embodiment, FIG. 44B is a cross-sectional view taken at line X-X' in FIG. 44A, and FIG. 44C is a cross-sectional view taken at line Y-Y' in FIG. 44A.

FIG. 45A is a plan view related to the method for manufacturing a semiconductor device according to one embodiment, FIG. 45B is a cross-sectional view taken at line X-X' in FIG. 45A, and FIG. 45C is a cross-sectional view taken at line Y-Y' in FIG. 45A.

FIG. 46A is a plan view related to the method for manufacturing a semiconductor device according to one embodiment, FIG. 46B is a cross-sectional view taken at line X-X' in FIG. 46A, and FIG. 46C is a cross-sectional view taken at line Y-Y' in FIG. 46A.

DETAILED DESCRIPTION OF THE PREFERRED EMBODIMENTS

Figure 3C:
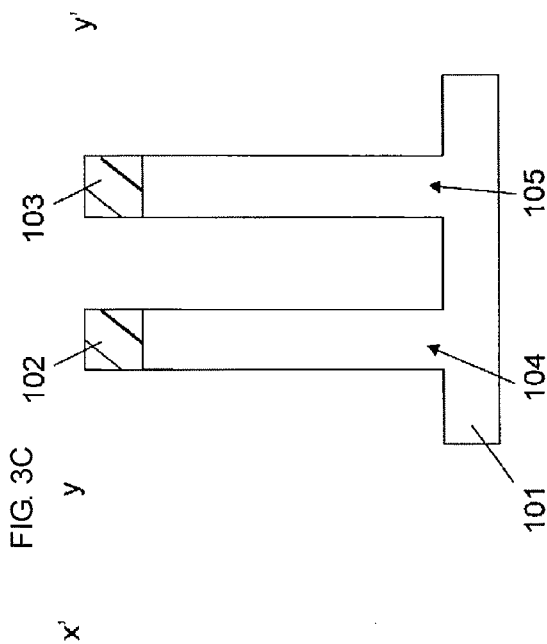
FIG. 3C is a cross-sectional view taken at line Y-Y' in FIG. 3A.

FIGS. 1A to 1C show a structure of a semiconductor device according to one embodiment of the present invention.

In the structure of the semiconductor device shown in FIGS. 1B and 1C, a fin-shaped silicon layer 104 is formed on a silicon substrate 101 and a first insulating film 106 is formed around the fin-shaped silicon layer 104.

Referring to FIG. 1B, a first pillar-shaped silicon layer 113 is formed on the fin-shaped silicon layer 104, a first gate insulating film 127a that includes a charge storing layer is formed around the first pillar-shaped silicon layer 113, and a first control gate 128a is formed around the first gate insulating film 127a. A second gate insulating film 131a is formed at a position higher than the first gate insulating film 127a, a first selection gate 132a is formed around the second gate insulating film 131a, and a fifth gate insulating film 133a surrounds an upper portion of the first pillar-shaped silicon layer 113. A first contact electrode 134c surrounds the fifth gate insulating film 133a. The first control gate 128a extends in a direction perpendicular to the fin-shaped silicon layer 104 and is formed around the first pillar-shaped silicon layer 113. The first selection gate 132a extends in a direction perpendicular to the fin-shaped silicon layer 104. An upper portion of the first contact electrode 134c is connected to an upper portion of the first pillar-shaped silicon layer 113 by a third contact electrode 138a.

The first contact electrode 134c is composed of a metal having a particular work function. The work function of the metal is preferably between 4.0 eV and 4.2 eV or between 5.0 eV and 5.2 eV.

The upper portion of the pillar-shaped silicon layer can be made to function as an n-type silicon layer or a p-type silicon layer depending on the difference in work function between the metal and the semiconductor without forming a diffusion layer in the upper portion of the pillar-shaped silicon layer. Accordingly, the step of forming a diffusion layer in the upper portion of the pillar-shaped silicon layer can be omitted.

A first gate insulating film 129a that includes a charge storing layer is formed around the first pillar-shaped silicon layer 113 and at a position higher than the first gate insulating film 127a and the first control gate 128a. A first control gate 130a is formed around the first gate insulating film 129a. The first control gate 130a extends in a direction perpendicular to the fin-shaped silicon layer 104. Two or more first control gates 128a and 130a are arranged in a direction perpendicular to the substrate.

Referring to FIG. 1C, a second pillar-shaped silicon layer 114 is formed on the fin-shaped silicon layer 104, a third gate insulating film 127b that includes a charge storing layer is formed around the second pillar-shaped silicon layer 114, and a second control gate 128b is formed around the third gate insulating film 127b. A fourth gate insulating film 131b is formed around the second pillar-shaped silicon layer 114 and at a position higher than the third gate insulating film 127b. A second selection gate 132b is formed around the fourth gate insulating film 131b, a sixth gate insulating film 133b surrounds an upper portion of the second pillar-shaped silicon layer 114, and a second contact electrode 134b surrounds the sixth gate insulating film 133b. A source line 135b is connected to an upper portion of the second pillar-shaped silicon layer 114 and an upper portion of the second contact electrode 134b and extends in a direction perpendicular to the fin-shaped silicon layer 104. The second control gate 128b extends in a direction perpendicular to the fin-shaped silicon layer 104 and the second selection gate 132b extends in a direction perpendicular to the fin-shaped silicon layer 104.

A first bit line 135a is connected to the third contact electrode 138a and extends in a direction parallel to the fin-shaped silicon layer 104.

A second bit line 140a is connected to the first bit line 135a and extends in a direction parallel to the first bit line 135a.

A third gate insulating film 129b that includes a charge storing layer lies at a position higher than the third gate insulating film 127b and the second control gate 128b and around the second pillar-shaped silicon layer 114. A second control gate 130b is formed around the third gate insulating film 129b. The second control gate 130b extends in a direction perpendicular to the fin-shaped silicon layer 104. Two or more second control gates 128b and 130b are arranged in a direction perpendicular to the substrate.

A first diffusion layer 124 is formed in an upper portion of the fin-shaped silicon layer 104, the upper portion lying between the first pillar-shaped silicon layer 113 and the second pillar-shaped silicon layer 114.

Since the first pillar-shaped silicon layer 113 and the second pillar-shaped silicon layer 114 are formed on the fin-shaped silicon layer 104 formed on a substrate, the first pillar-shaped silicon layer 113 and the second pillar-shaped silicon layer 114 are composed of single crystals. Thus, the decrease in charge mobility caused by grain boundaries can be avoided and the decrease in read-out rate caused by grain boundaries can be avoided.

Since device isolation is achieved by the first insulating film 106 formed around the fin-shaped silicon layer 104, a memory string can be formed by the first pillar-shaped silicon layer 113, the fin-shaped silicon layer 104, and the second pillar-shaped silicon layer 114.

The first gate insulating film 127a and the third gate insulating film 127b each preferably includes a nitride film as the charge storing layer and may each have a multilayer structure that includes an oxide film, a nitride film, and another oxide film.

The first control gate 128a and the second control gate 128b can be insulated from the first pillar-shaped silicon layer 113, the second pillar-shaped silicon layer 114, and the fin-shaped silicon layer 104 by the first gate insulating film 127a and the third gate insulating film 127b formed around and at bottom portions of the first control gate 128a and the second control gate 128b.

The first selection gate 132a and the second selection gate 132b can be insulated from the first pillar-shaped silicon layer 113, the second pillar-shaped silicon layer 114, the first control gate 130a, and the second control gate 130b by the second gate insulating film 131a and the fourth gate insulating film 131b formed around and at bottom portions of the first selection gate 132a and the second selection gate 132b.

The width of the first pillar-shaped silicon layer 113 in a direction perpendicular to the fin-shaped silicon layer 104 is equal to the width of the fin-shaped silicon layer 104 in the direction perpendicular to the fin-shaped silicon layer 104 and the width of the second pillar-shaped silicon layer 114 in the direction perpendicular to the fin-shaped silicon layer 104 is equal to the width of the fin-shaped silicon layer 104 in the direction perpendicular to the fin-shaped silicon layer 104. This is because the semiconductor device is manufactured by a method of the present invention described below.

Referring to FIG. 1A, a fin-shaped silicon layer 105 is formed on the silicon substrate 101 and the first insulating film 106 surrounds the fin-shaped silicon layer 105.

Referring to FIG. 1A, a first pillar-shaped silicon layer 115 is formed on the fin-shaped silicon layer 105. The first gate insulating film 127a that includes a charge storing layer is formed around the first pillar-shaped silicon layer 115. The first control gate 128a is formed around the first gate insulating film 127a. The second gate insulating film 131a is formed around the first pillar-shaped silicon layer 115 and at a position higher than the first gate insulating film 127a. The first selection gate 132a is formed around the second gate insulating film 131a and the fifth gate insulating film 133a surrounds an upper portion of the first pillar-shaped silicon layer 115. A first contact electrode 134d surrounds the fifth gate insulating film 133a. The first control gate 128a extends in a direction orthogonal to the fin-shaped silicon layer 105. The first selection gate 132a extends in a direction perpendicular to the fin-shaped silicon layer 105. An upper portion of the first contact electrode 134d is connected to an upper portion of the first pillar-shaped silicon layer 115 by a third contact electrode 138b.

The first gate insulating film 129a that includes a charge storing layer is formed at a position higher than the first gate insulating film 127a and the first control gate 128a and around the first pillar-shaped silicon layer 115. The first control gate 130a is formed around the first gate insulating film 129a. Two or more first control gates 128a and 130a are arranged in a direction perpendicular to the substrate. The first control gate 130a extends in a direction perpendicular to the fin-shaped silicon layer 105.

Referring to FIG. 1C, a second pillar-shaped silicon layer 116 is formed on the fin-shaped silicon layer 105. The third gate insulating film 127b including a charge storing layer is formed around the second pillar-shaped silicon layer 116 and the second control gate 128b is formed around the third gate insulating film 127b. The fourth gate insulating film 131b is formed around the second pillar-shaped silicon layer 116 and at a position higher than the third gate insulating film 127b. The second selection gate 132b is formed around the fourth gate insulating film 131b. The sixth gate insulating film 133b surrounds an upper portion of the second pillar-shaped silicon layer 116. The second contact electrode 134b surrounds the sixth gate insulating film 133b. The source line 135b is connected to an upper portion of the second pillar-shaped silicon layer 116 and an upper portion of the second contact electrode 134b and extends in a direction perpendicular to the fin-shaped silicon layer 105. The second control gate 128b extends in a direction perpendicular to the fin-shaped silicon layer 105. The second selection gate 132b extends in a direction perpendicular to the fin-shaped silicon layer 105.

A first bit line 135c is connected to an upper portion of the first pillar-shaped silicon layer 115 and extends in a direction parallel to the fin-shaped silicon layer 105.

A second bit line 140b is connected to the first bit line 135c and extends in a direction parallel to the first bit line 135c.

The third gate insulating film 129b including a charge storing layer is formed at a position higher than the third gate insulating film 127b and the second control gate 128b and around the second pillar-shaped silicon layer 116. The second control gate 130b is formed around the third gate insulating film 129b. Two or more second control gates 128b and 130b are arranged in a direction perpendicular to the substrate. The second control gate 130b extends in a direction perpendicular to the fin-shaped silicon layer 105.

A first diffusion layer 125 lies in an upper portion of the fin-shaped silicon layer 105, the upper portion lying between the first pillar-shaped silicon layer 115 and the second pillar-shaped silicon layer 116.

A method for manufacturing a structure of a semiconductor device according to an embodiment of the present invention will now be described with reference to FIGS. 2A to 46C.

First, a first step that includes forming fin-shaped semiconductor layers on a semiconductor substrate and forming a first insulating film around the fin-shaped semiconductor layers is described. In this embodiment, a silicon substrate is used as the semiconductor substrate but the semiconductor substrate may be composed of any other semiconductor.

Referring to FIGS. 2A to 2C, first resists 102 and 103 for forming fin-shaped silicon layers are formed on a silicon substrate 101.

Figure 3A:
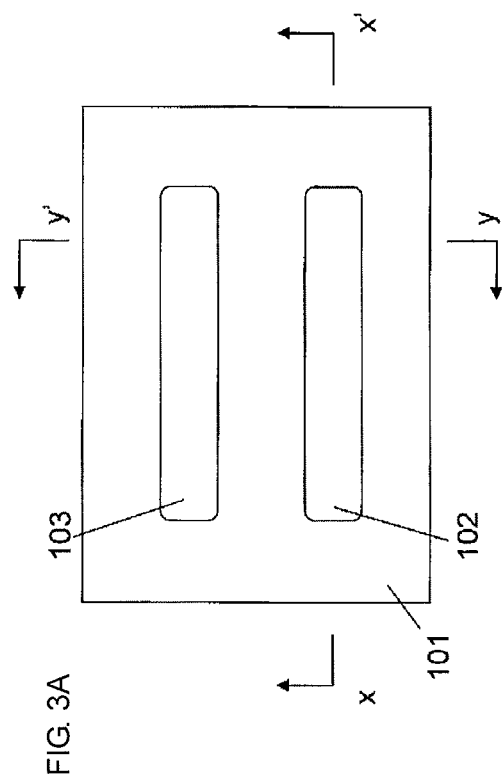
FIG. 3A is a plan view related to the method for manufacturing a semiconductor device according to one embodiment.
Figure 3B:
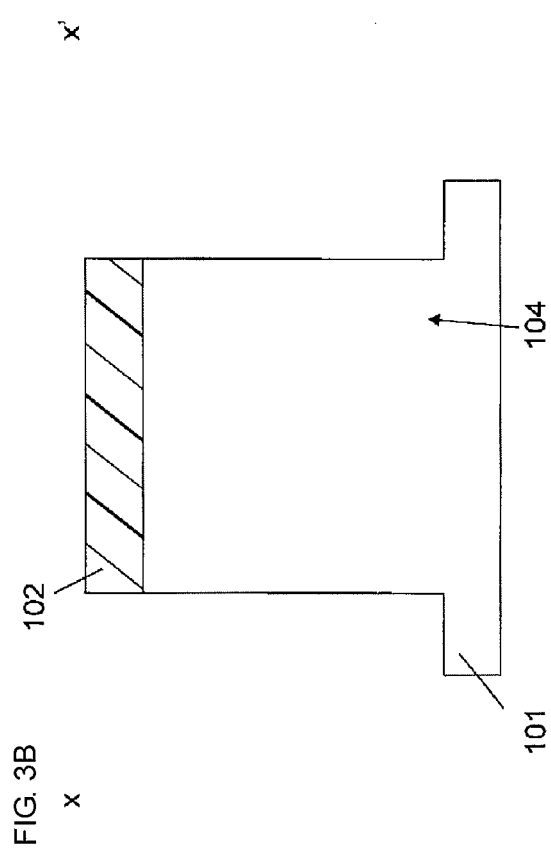
FIG. 3B is a cross-sectional view taken at line X-X' in FIG. 3A.

Referring to FIGS. 3A to 3C, the silicon substrate 101 is etched to form fin-shaped silicon layers 104 and 105. The fin-shaped silicon layers 104 and 105 may be made by using a hard mask such as an oxide film or a nitride film instead of the resist mask.

Figure 4C:
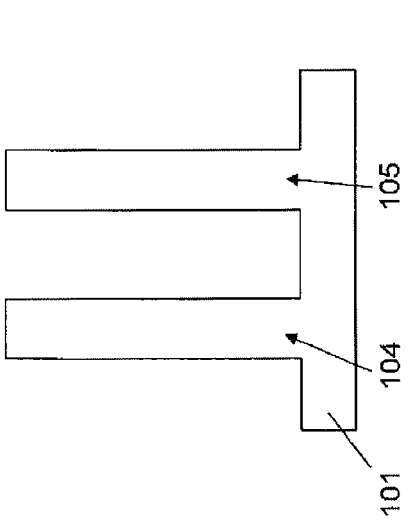
FIG. 4C is a cross-sectional view taken at line Y-Y' in FIG. 4A.
Figure 4A:
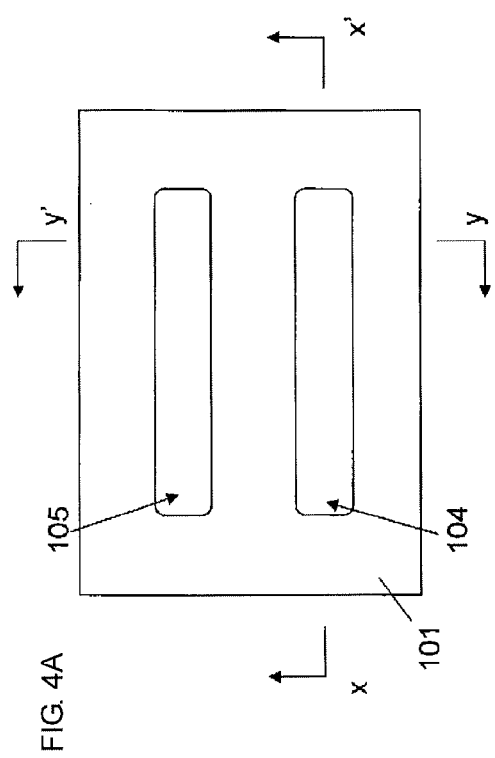
FIG. 4A is a plan view related to the method for manufacturing a semiconductor device according to one embodiment.
Figure 4B:
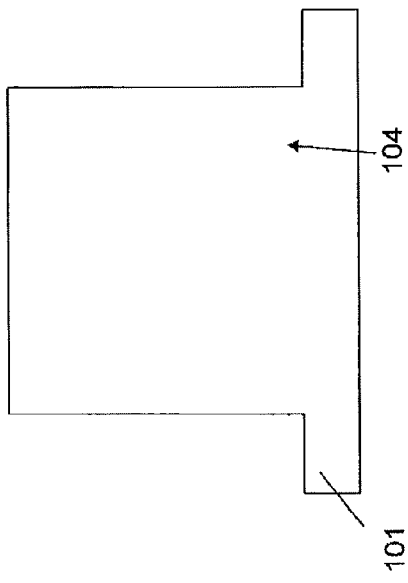
FIG. 4B is a cross-sectional view taken at line X-X in FIG. 4A.

Referring to FIGS. 4A to 4C, the first resists 102 and 103 are removed.

Referring to FIGS. 5A to 5C, a first insulating film 106 is deposited around the fin-shaped silicon layers 104 and 105. An oxide film formed by using high-density plasma or low-pressure chemical vapor deposition (CVD) may be used as the first insulating film 106.

Referring to FIGS. 6A to 6C, the first insulating film 106 is etched back to expose upper portions of the fin-shaped silicon layers 104 and 105.

The description up to the preceding paragraph is the description of the first step that includes forming fin-shaped semiconductor layers on a semiconductor substrate and forming a first insulating film around the fin-shaped semiconductor layers.

A second step following the first step is described next. The second step includes forming second insulating films around the fin-shaped semiconductor layers, depositing a first polysilicon on the second insulating films to perform planarization, forming a second resist for forming a control gate, a selection gate, a first pillar-shaped semiconductor layer, a second pillar-shaped semiconductor layer, and a contact line, the second resist being formed in a direction perpendicular to the fin-shaped semiconductor layers, and etching the first polysilicon, the second insulating film, and the fin-shaped semiconductor layers so as to form first pillar-shaped semiconductor layers, a first dummy gate formed of the first polysilicon, second pillar-shaped semiconductor layers, and a second dummy gate formed of the first polysilicon.

Figure 7C:
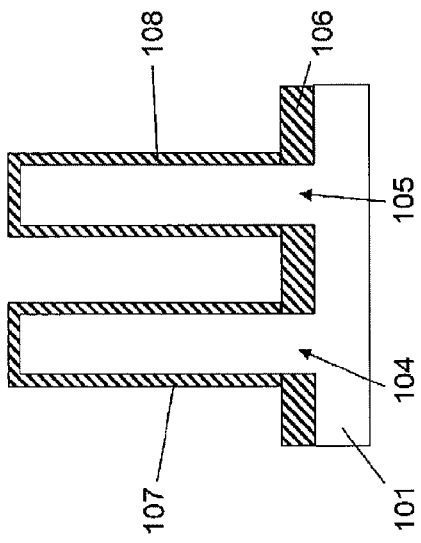
FIG. 7C is a cross-sectional view taken at line Y-Y' in FIG. 7A.
Figure 7A:
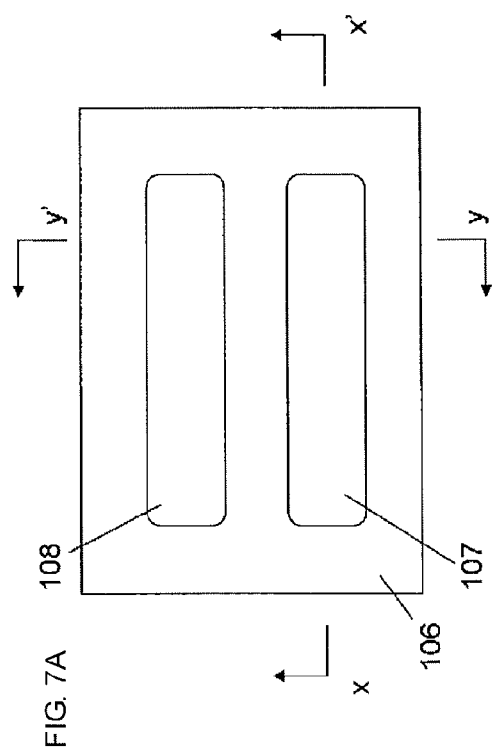
FIG. 7A is a plan view related to the method for manufacturing a semiconductor device according to one embodiment.
Figure 7B:
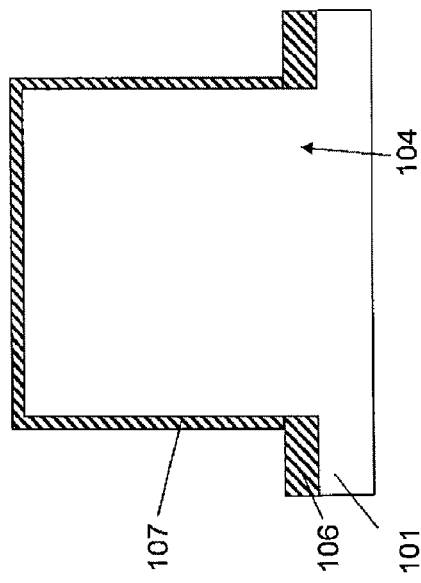
FIG. 7B is a cross-sectional view taken at line X-X' in FIG. 7A.

Referring to FIGS. 7A to 7C, second insulating films 107 and 108 are formed around the fin-shaped silicon layers 104 and 105. The second insulating films 107 and 108 are each preferably an oxide film.

Figure 8A:
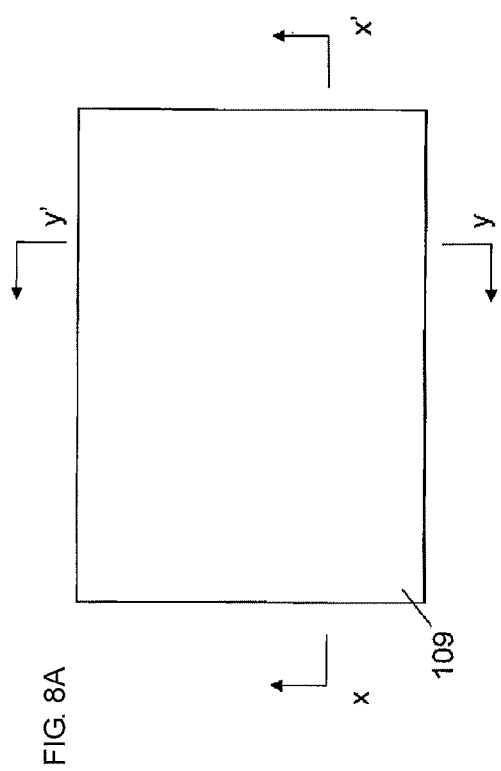
FIG. 8A is a plan view related to the method for manufacturing a semiconductor device according to one embodiment.
Figure 8B:
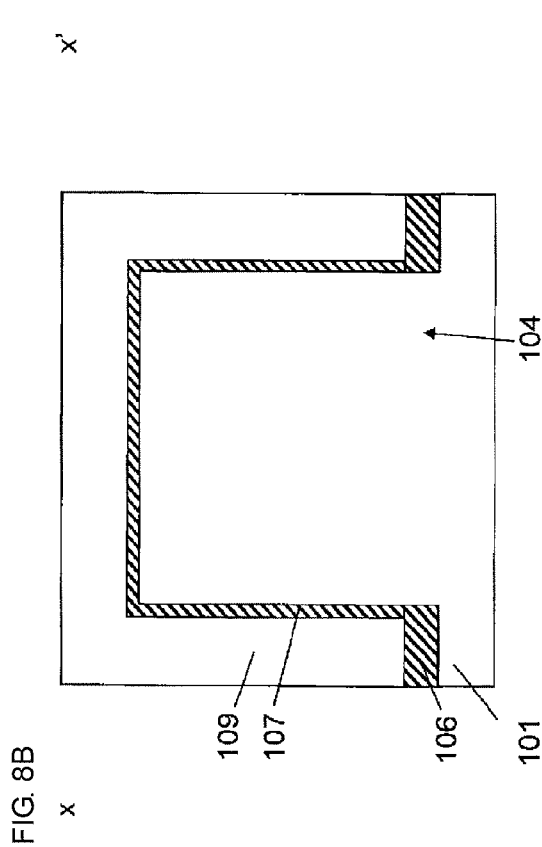
FIG. 8B is a cross-sectional view taken at line X-X' in FIG. 8A.
Figure 8C:
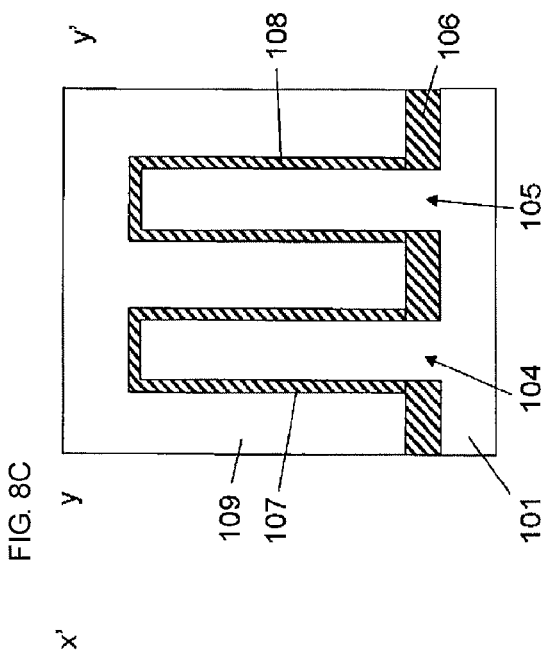
FIG. 8C is a cross-sectional view taken at line Y-Y' in FIG. 8A.

Referring to FIGS. 8A to 8C, a first polysilicon 109 is deposited on the second insulating films 107 and 108 to perform planarization.

Referring to FIGS. 9A to 9C, a third insulating film 110 is formed on the first polysilicon 109. The third insulating film 110 is preferably a nitride film.

Referring to FIGS. 10A to 10C, second resists 111 and 112 for forming first and second control gates 128a, 128b, 130a, and 130b, first and second selection gates 132a and 132b, first pillar-shaped silicon layers 113 and 115, and second pillar-shaped semiconductor layers 114 and 116 are formed in a direction perpendicular to the fin-shaped silicon layers 104 and 105.

Referring to FIGS. 11A to 11C, the third insulating film 110, the first polysilicon 109, the second insulating films 107 and 108, and the fin-shaped silicon layers 104 and 105 are etched to form first pillar-shaped silicon layers 113 and 115, a first dummy gate 109a formed of the first polysilicon, second pillar-shaped silicon layers 114 and 116, and a second dummy gate 109b formed of the first polysilicon. As a result, the third insulating film 110 is divided into third insulating films 110a and 110b. The second insulating films 107 and 108 are divided into second insulating films 107a, 107b, 108a, and 108b. In the case where the second resists 111 and 112 are removed during etching, the third insulating films 110a and 110b serve as a hard mask. There is no need to use a third insulating film if the second resist remains unremoved during etching.

Figure 12A:
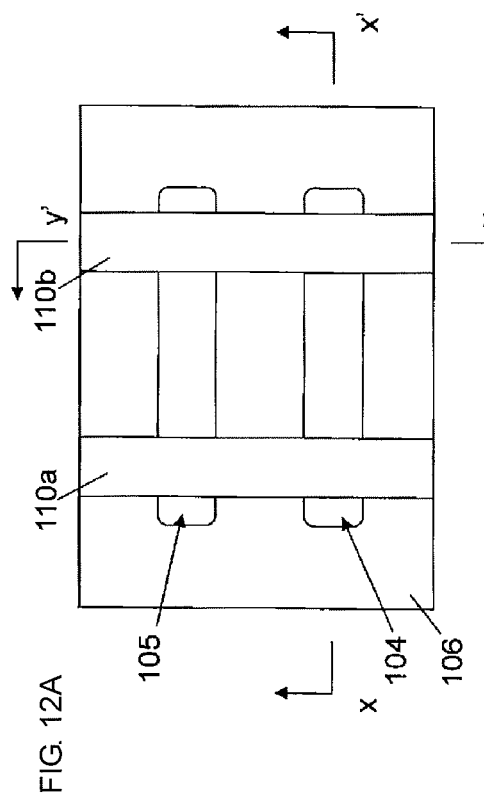
FIG. 12A is a plan view related to the method for manufacturing a semiconductor device according to one embodiment.
Figure 12C:
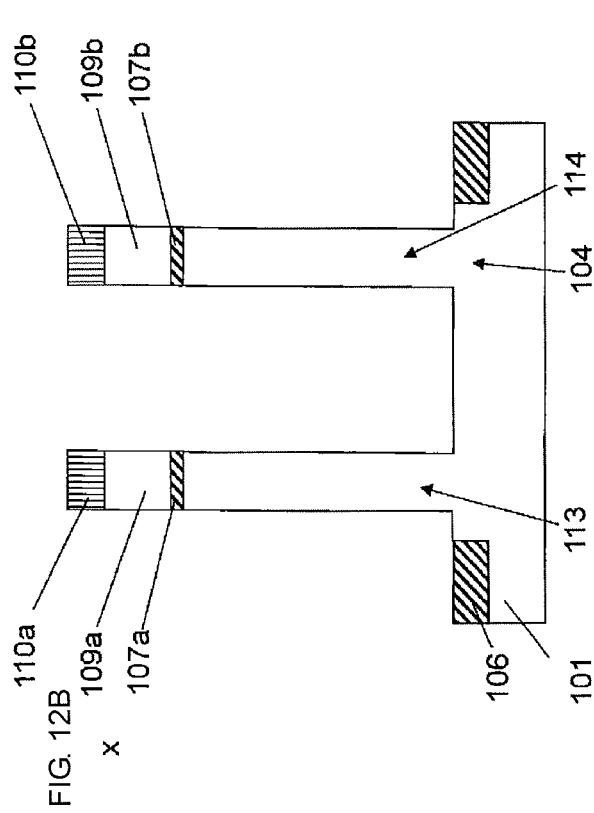
FIG. 12C is a cross-sectional view taken at line Y-Y' in FIG. 12A.
Figure 12B:
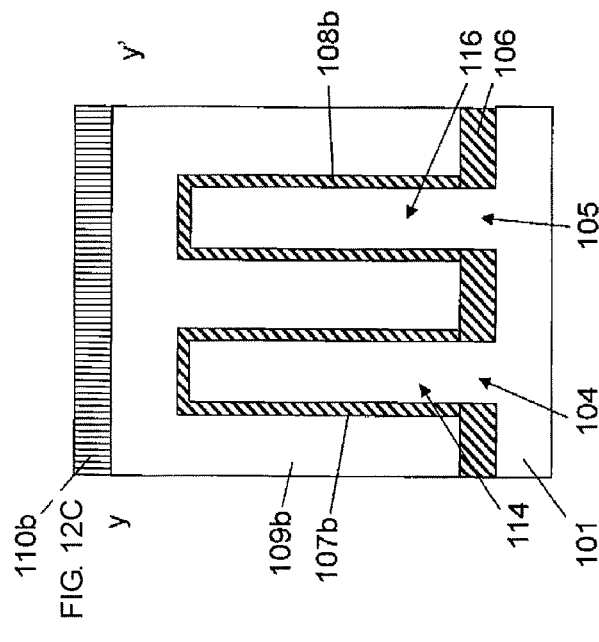
FIG. 12B is a cross-sectional view taken at line X-X' in FIG. 12A.

Referring to FIGS. 12A to 12C, the second resists 111 and 112 are removed.

The description up to the preceding paragraph is the description of the second step that follows the first step and includes forming second insulating films around the fin-shaped semiconductor layers, depositing a first polysilicon on the second insulating films to perform planarization, forming a second resist for forming a control gate, a selection gate, a first pillar-shaped semiconductor layer, a second pillar-shaped semiconductor layer, and a contact line, the second resist being formed in a direction perpendicular to the fin-shaped semiconductor layers, and etching the first polysilicon, the second insulating film, and the fin-shaped semiconductor layers so as to form first pillar-shaped semiconductor layers, a first dummy gate formed of the first polysilicon, second pillar-shaped semiconductor layers, and a second dummy gate formed of the first polysilicon.

Next, a third step following the second step is described. The third step includes forming a fourth insulating film around the first pillar-shaped semiconductor layers, the second pillar-shaped semiconductor layers, the first dummy gate, and the second dummy gate, depositing a second polysilicon around the fourth insulating film, and etching the second polysilicon so that the second polysilicon remains on side walls of the first dummy gate, the first pillar-shaped semiconductor layers, the second dummy gate, and the second pillar-shaped semiconductor layers so as to form a third dummy gate and a fourth dummy gate.

Referring to FIGS. 13A to 13C, a fourth insulating film 117 is formed around the first pillar-shaped silicon layers 113 and 115, the second pillar-shaped silicon layers 114 and 116, the first dummy gate 109a, and the second dummy gate 109b.

Referring to FIGS. 14A to 14C, a second polysilicon 123 is deposited around the fourth insulating film 117.

Referring to FIGS. 15A to 15C, the second polysilicon 123 is etched so that the second polysilicon 123 remains on side walls of the first dummy gate 109a, the first pillar-shaped silicon layers 113 and 115, the second dummy gate 109b, and the second pillar-shaped silicon layers 114 and 116 so as to form a third dummy gate 123a and a fourth dummy gate 123b. The fourth insulating film 117 may be divided into fourth insulating films 117a and 117b.

The description up to the preceding paragraph is the description of the third step that follows the second step and includes forming a fourth insulating film around the first pillar-shaped semiconductor layers, the second pillar-shaped semiconductor layers, the first dummy gate, and the second dummy gate, depositing a second polysilicon around the fourth insulating film, and etching the second polysilicon so that the second polysilicon remains on side walls of the first dummy gate, the first pillar-shaped semiconductor layers, the second dummy gate, and the second pillar-shaped semiconductor layers so as to form a third dummy gate and a fourth dummy gate.

Next, a fourth step is described. The forth step includes forming first diffusion layers in upper portions of the fin-shaped semiconductor layers and forming a fifth insulating film around the third dummy gate and the fourth dummy gate.

Referring to FIGS. 16A to 16C, an impurity is introduced to form first diffusion layers 124 and 125 in upper portions of the fin-shaped silicon layers 104 and 105. To form n-type diffusion layers, arsenic or phosphorus is preferably introduced. To form a p-type diffusion layers, boron is preferably introduced. Formation of the diffusion layers may be performed after forming side walls of the fifth insulating film as described below.

Referring to FIGS. 17A to 17C, a fifth insulating film 225 is formed around the third dummy gate 123a and the fourth dummy gate 123b. The fifth insulating film 225 is preferably a nitride film. Alternatively, the fifth insulating film 225 may then be etched into a side wall shape to form side walls formed of the fifth insulating film and metal-semiconductor compound layers may be formed on the first diffusion layers 124 and 125.

The description up to the preceding paragraph is the description of the fourth step that includes forming first diffusion layers in upper portions of the fin-shaped semiconductor layers and forming a fifth insulating film around the third dummy gate and the fourth dummy gate.

Next, a fifth step after the fourth step is described. The fifth step includes depositing an interlayer insulating film to perform planarization, exposing upper portions of the first dummy gate, the second dummy gate, the third dummy gate, and the fourth dummy gate, removing the first dummy gate, the second dummy gate, the third dummy gate, and the fourth dummy gate, and removing the second insulating films and the fourth insulating film.

Referring to FIGS. 18A to 18C, an interlayer insulating film 126 is deposited. A contact stopper film may be used.

Figure 19C:
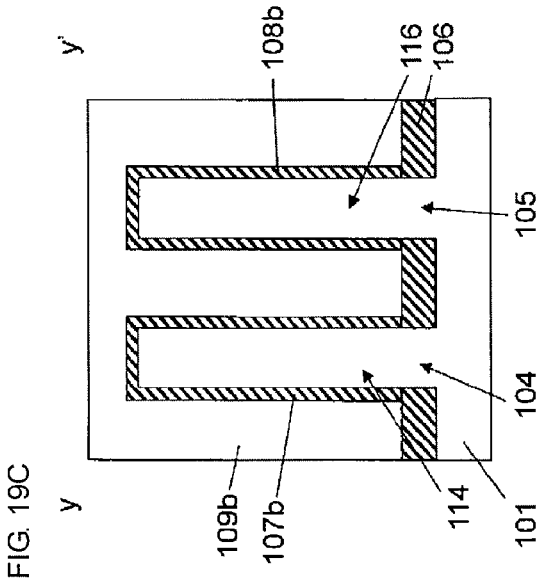
FIG. 19C is a cross-sectional view taken at line Y-Y' in FIG. 19A.
Figure 19A:
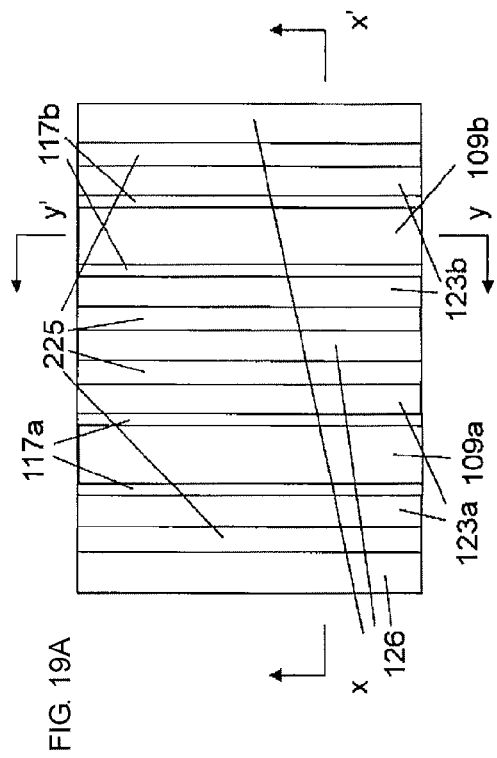
FIG. 19A is a plan view related to the method for manufacturing a semiconductor device according to one embodiment.
Figure 19B:
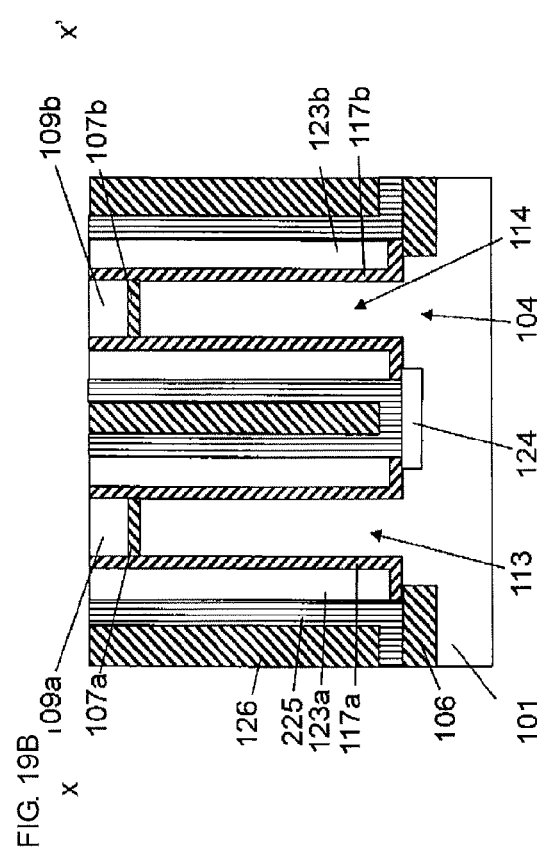
FIG. 19B is a cross-sectional view taken at line X-X' in FIG. 19A.

Referring to FIGS. 19A to 19C, chemical mechanical polishing is performed to expose upper portions of the first dummy gate 109a, the second dummy gate 109b, the third dummy gate 123a, and the fourth dummy gate 123b.

Figure 20A:
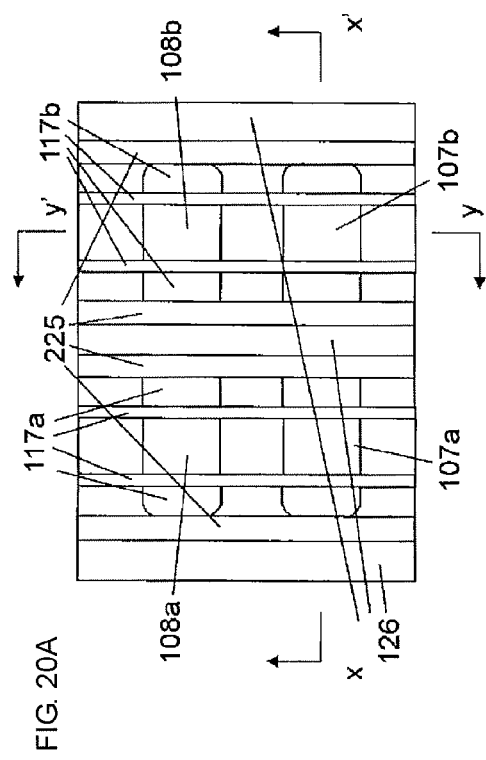
FIG. 20A is a plan view related to the method for manufacturing a semiconductor device according to one embodiment.
Figure 20C:
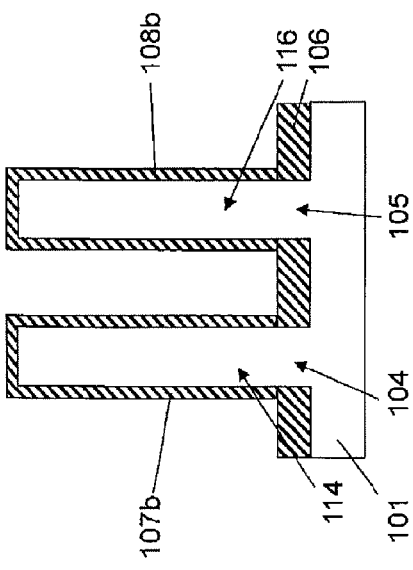
FIG. 20C is a cross-sectional view taken at line Y-Y' in FIG. 20A.
Figure 20B:
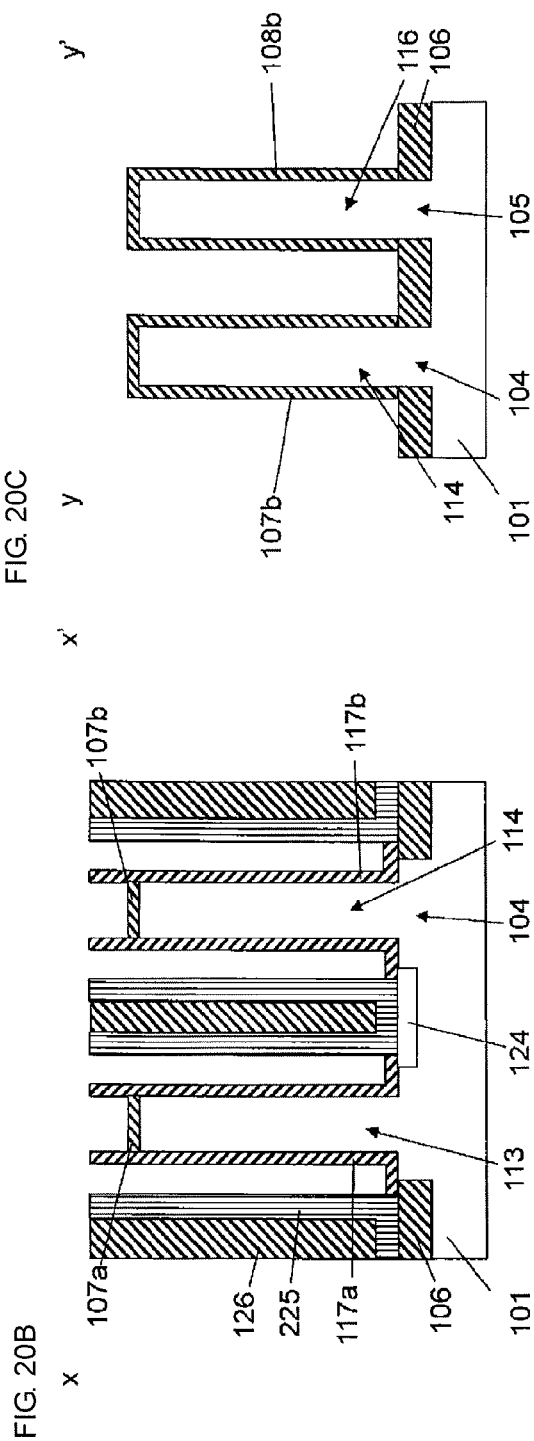
FIG. 20B is a cross-sectional view taken at line X-X' in FIG. 20A.

Referring to FIGS. 20A to 20C, the first dummy gate 109a, the second dummy gate 109b, the third dummy gate 123a, and the fourth dummy gate 123b are removed.

Figure 21A:
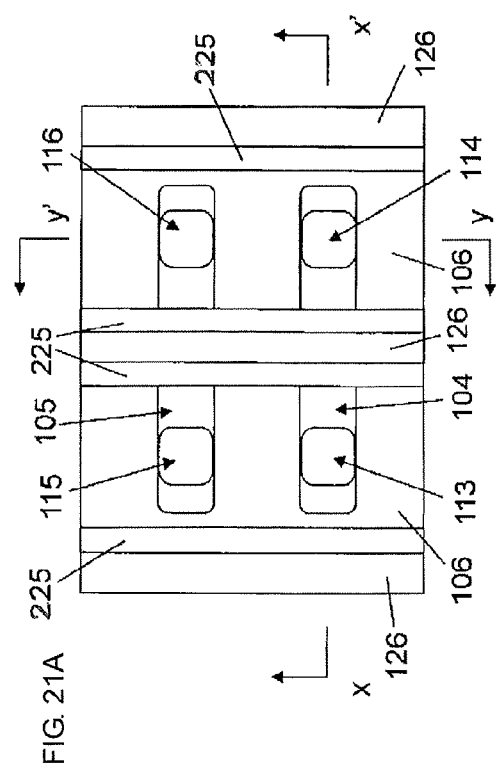
FIG. 21A is a plan view related to the method for manufacturing a semiconductor device according to one embodiment.
Figure 21C:
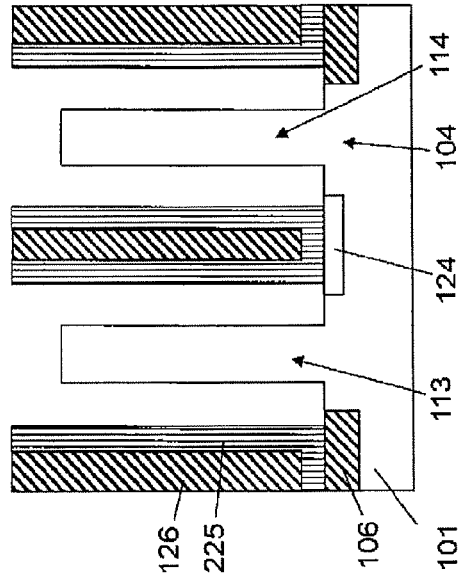
FIG. 21C is a cross-sectional view taken at line Y-Y' in FIG. 21A.
Figure 21B:
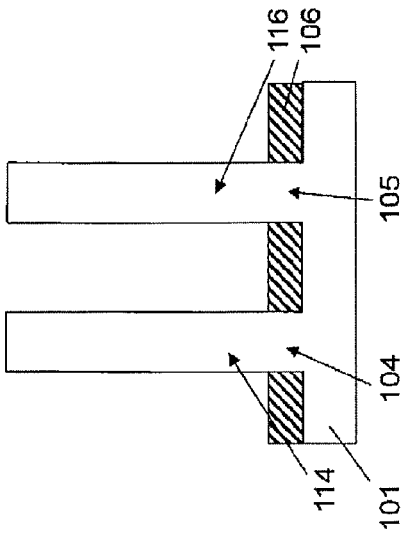
FIG. 21B is a cross-sectional view taken at line X-X' in FIG. 21A.

Referring to FIGS. 21A to 21C, the second insulating films 107a, 107b, 108a, and 108b and the fourth insulating films 117a and 117b are removed.

The description up to the preceding paragraph is the description of the fifth step that includes depositing an interlayer insulating film to perform planarization, exposing upper portions of the first dummy gate, the second dummy gate, the third dummy gate, and the fourth dummy gate, removing the first dummy gate, the second dummy gate, the third dummy gate, and the fourth dummy gate, and removing the second insulating films and the fourth insulating film.

Next, a sixth step after the fifth step is described. The sixth step includes forming an insulating film, which will form a first gate insulating film and a third gate insulating film and includes a charge storing layer, around the first pillar-shaped semiconductor layers, around the second pillar-shaped semiconductor layers, and on inner surfaces of the fifth insulating film, depositing a gate conductive film, etching back the gate conductive film to form a first control gate around the first pillar-shaped semiconductor layers and a second control gate around the second pillar-shaped semiconductor layers, and removing exposed portions of the insulating film, which will form a first gate insulating film and a third gate insulating film and includes a charge storing layer.

Figure 22C:
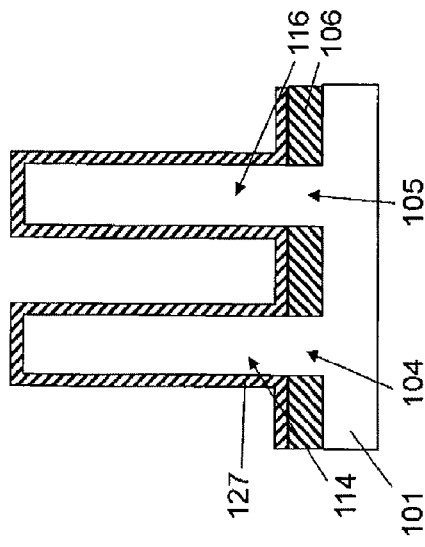
FIG. 22C is a cross-sectional view taken at line Y-Y' in FIG. 22A.
Figure 22A:
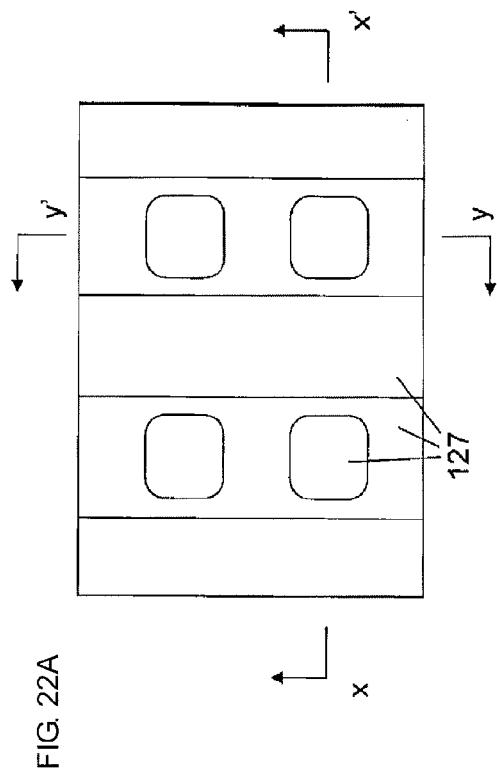
FIG. 22A is a plan view related to the method for manufacturing a semiconductor device according to one embodiment.
Figure 22B:
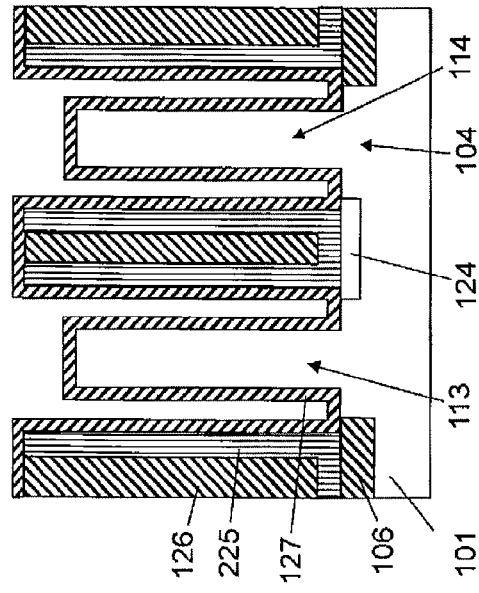
FIG. 22B is a cross-sectional view taken at line X-X' in FIG. 22A.

Referring to FIGS. 22A to 22C, a first gate insulating film 127, which will form a first gate insulating film 127a and a third gate insulating film 127b and includes a charge storing layer, is formed around the first pillar-shaped silicon layers 113 and 115, around the second pillar-shaped silicon layers 114 and 116, and on the surfaces of the fifth insulating film 225. The first gate insulating film 127 that includes a charge storing layer preferably includes a nitride film. The first gate insulating film 127 may include a multilayer structure including an oxide film, a nitride film, and another oxide film.

Figure 23C:
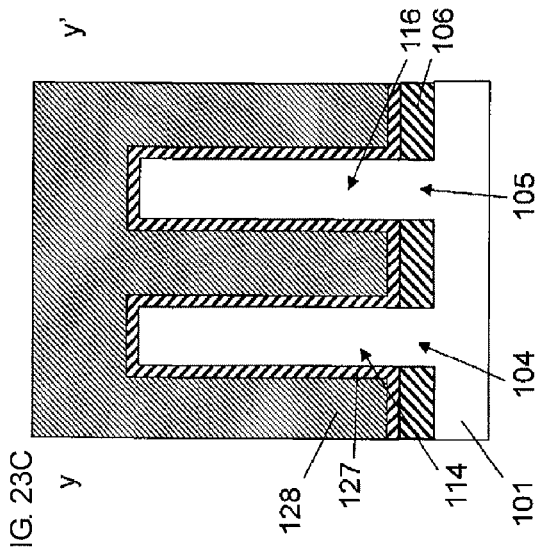
FIG. 23C is a cross-sectional view taken at line Y-Y' in FIG. 23A.
Figure 23A:
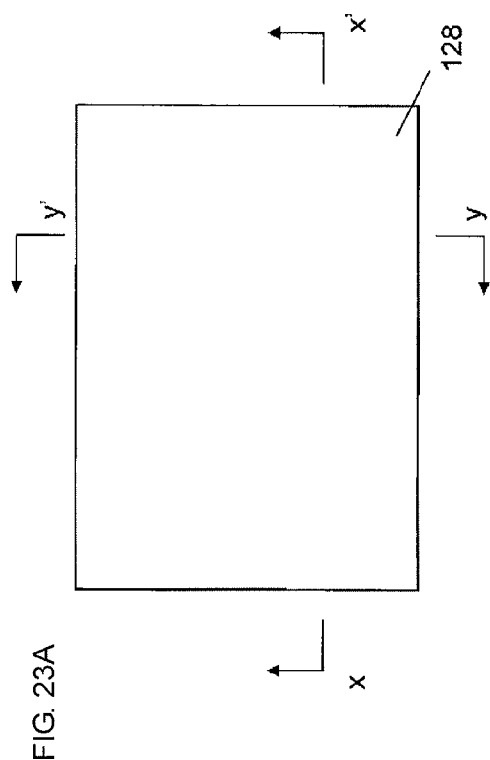
FIG. 23A is a plan view related to the method for manufacturing a semiconductor device according to one embodiment.
Figure 23B:
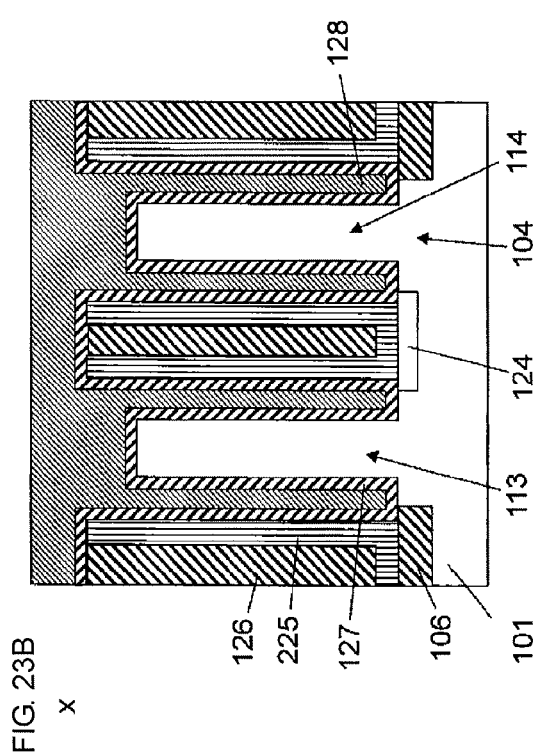
FIG. 23B is a cross-sectional view taken at line X-X' in FIG. 23A.

Referring to FIGS. 23A to 23C, a gate conductive film 128 is deposited. The gate conductive film 128 is preferably composed of a metal.

Figure 24A:
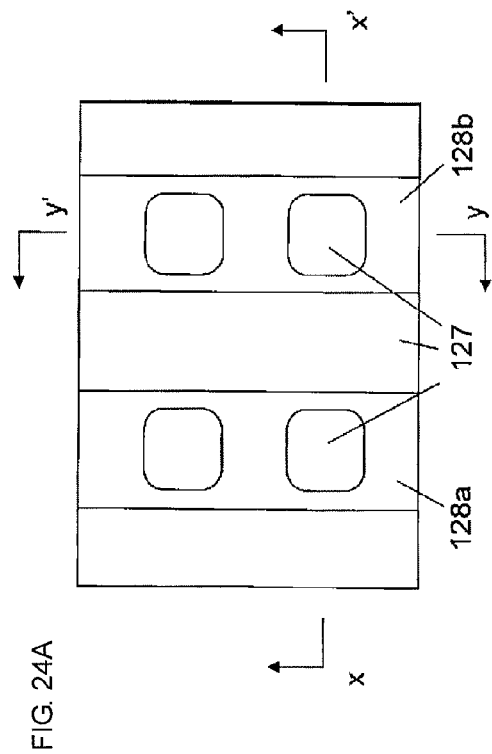
FIG. 24A is a plan view related to the method for manufacturing a semiconductor device according to one embodiment.
Figure 24C:
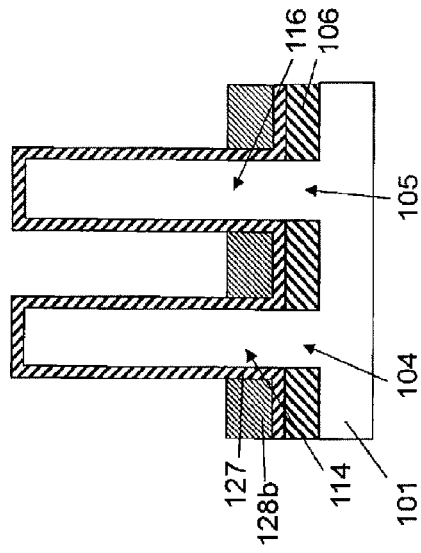
FIG. 24C is a cross-sectional view taken at line Y-Y' in FIG. 24A.
Figure 24B:
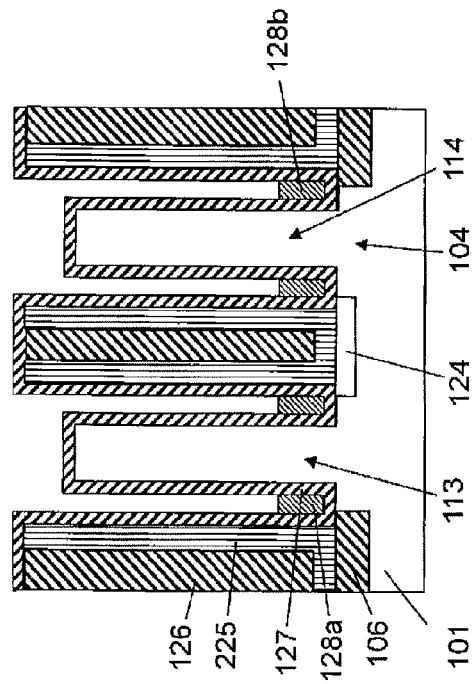
FIG. 24B is a cross-sectional view taken at line X-X' in FIG. 24A.

Referring to FIGS. 24A to 24C, the gate conductive film 128 is etched back to form a first control gate 128a around the first pillar-shaped silicon layers 113 and 115 and a second control gate 128b around the second pillar-shaped silicon layers 114 and 116.

Figure 25C:
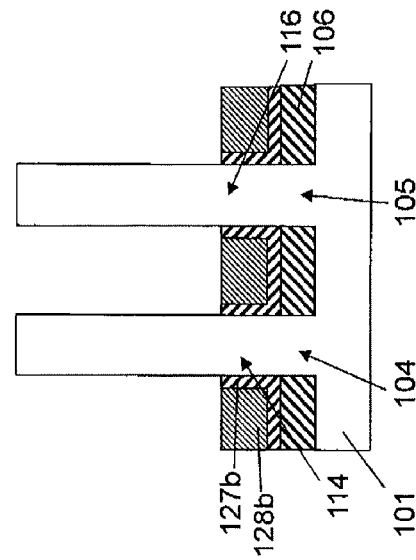
FIG. 25C is a cross-sectional view taken at line Y-Y' in FIG. 25A.
Figure 25A:
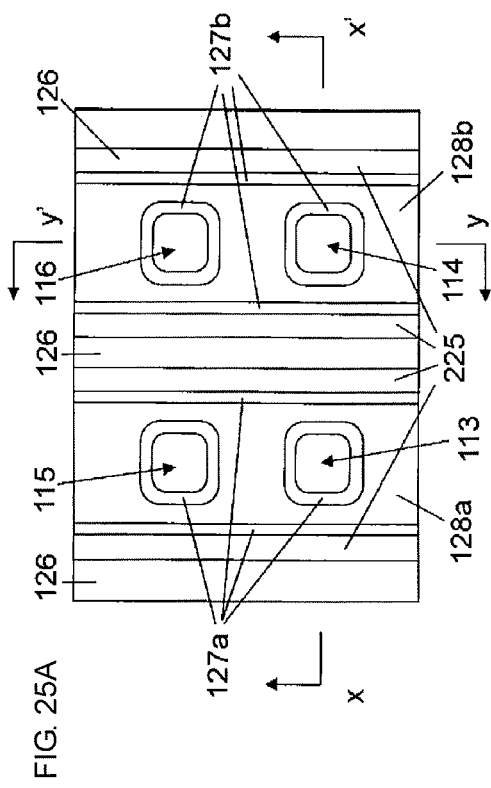
FIG. 25A is a plan view related to the method for manufacturing a semiconductor device according to one embodiment.
Figure 25B:
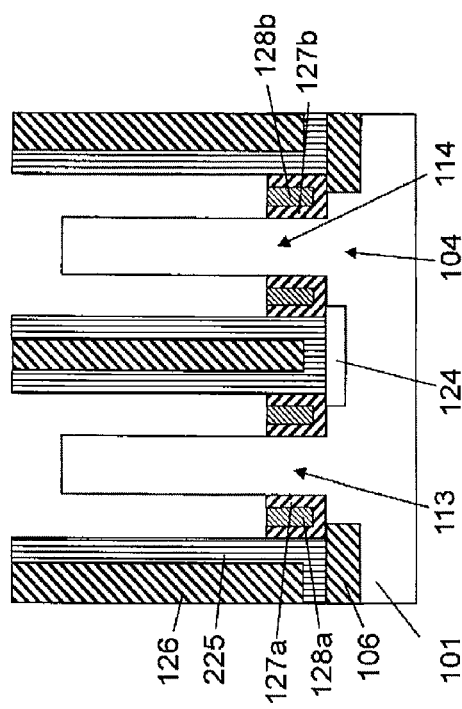
FIG. 25B is a cross-sectional view taken at line X-X' in FIG. 25A.

Referring to FIGS. 25A to 25C, exposed portions of the first gate insulating film 127, which will form a first gate insulating film 127a and a third gate insulating film 127b and includes a charge storing layer, are removed. As a result, the first gate insulating film 127 is divided into a first gate insulating film 127a and a third gate insulating film 127b.

The description up to the preceding paragraph is the description of the sixth step that follows the fifth step and includes forming an insulating film, which will form a first gate insulating film and a third gate insulating film and includes a charge storing layer, around the first pillar-shaped semiconductor layers, around the second pillar-shaped semiconductor layers, and on inner surfaces of the fifth insulating film, depositing a gate conductive film, etching back the gate conductive film to form a first control gate around the first pillar-shaped semiconductor layers and a second control gate around the second pillar-shaped semiconductor layers, and removing exposed portions of the insulating film, which will form a first gate insulating film and a third gate insulating film and includes a charge storing layer.

Next, a step of repeating the sixth step so as to form two or more first control gates in a direction perpendicular to the substrate and two or more second control gates in a direction perpendicular to the substrate is described.

Figure 26A:
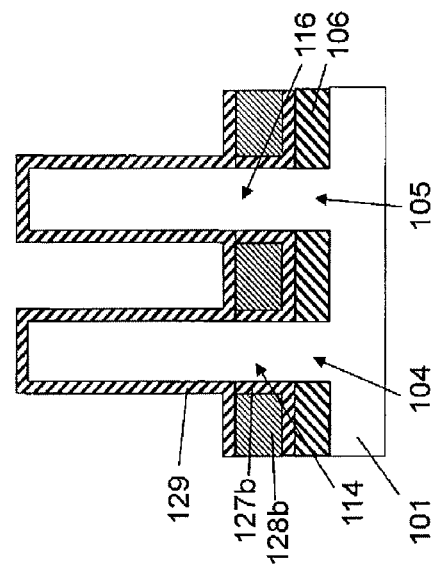
FIG. 26A is a plan view related to the method for manufacturing a semiconductor device according to one embodiment.
Figure 26B:
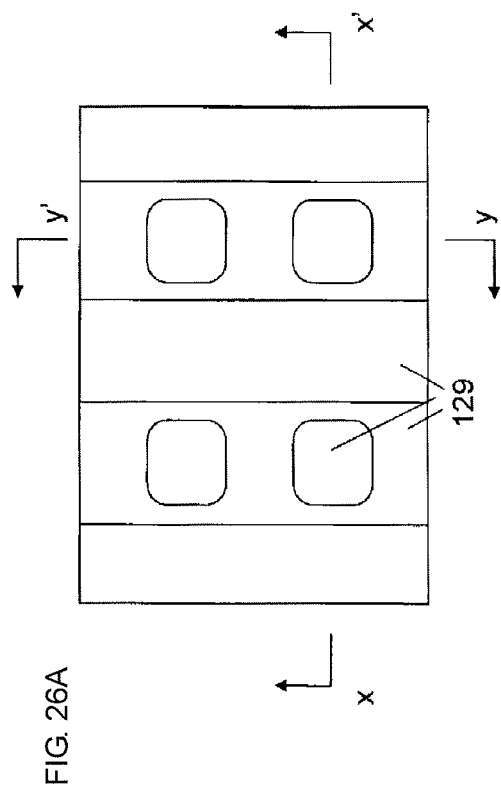
FIG. 26B is a cross-sectional view taken at line X-X' in FIG. 26A.
Figure 26C:
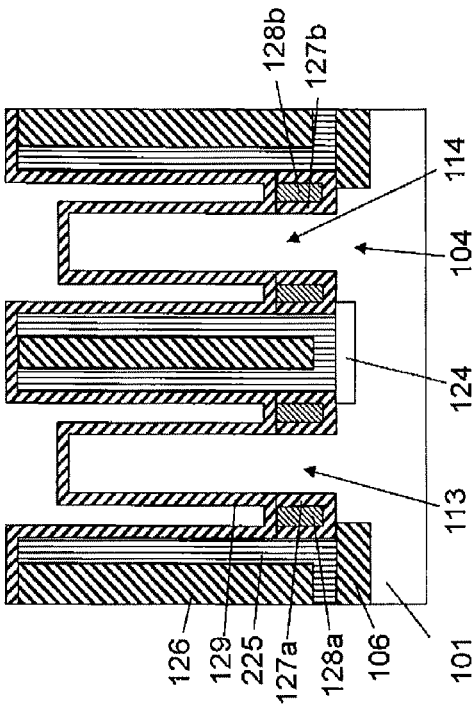
FIG. 26C is a cross-sectional view taken at line Y-Y' in FIG. 26A.

Referring to FIGS. 26A to 26C, an insulating film 129, which will form a first gate insulating film 129a and a third gate insulating film 129b and includes a charge storing layer, is formed on the first control gate 128a and the second control gate 128b, around the first pillar-shaped silicon layers 113 and 115, around the second pillar-shaped silicon layers 114 and 116, and on inner surfaces of the fifth insulating film 225. The insulating film 129 that includes a charge storing layer preferably includes a nitride film. The insulating film 129 may include a multilayered structure that includes an oxide film, a nitride film, and another oxide film.

Referring to FIGS. 27A to 27C, a gate conductive film 130 is deposited. The gate conductive film 130 is preferably composed of a metal.

Referring to FIGS. 28A to 28C, the gate conductive film 130 is etched back to form a first control gate 130a around the first pillar-shaped silicon layers 113 and 115 and a second control gate 130b around the second pillar-shaped silicon layers 114 and 116.

Figure 29C:
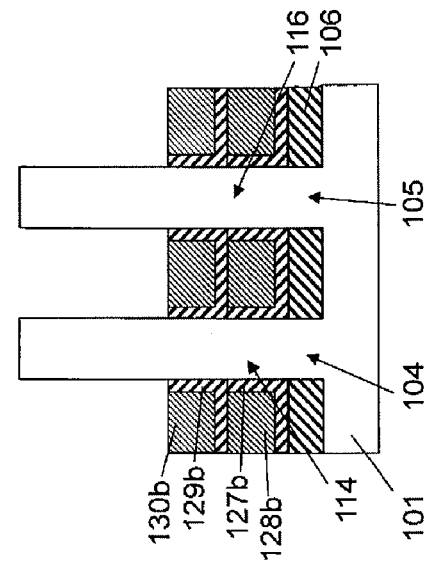
FIG. 29C is a cross-sectional view taken at line Y-Y' in FIG. 29A.
Figure 29A:
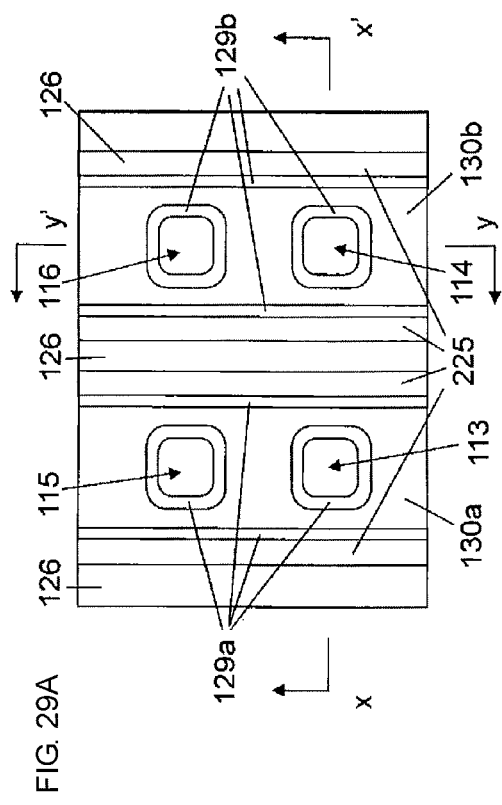
FIG. 29A is a plan view related to the method for manufacturing a semiconductor device according to one embodiment.
Figure 29B:
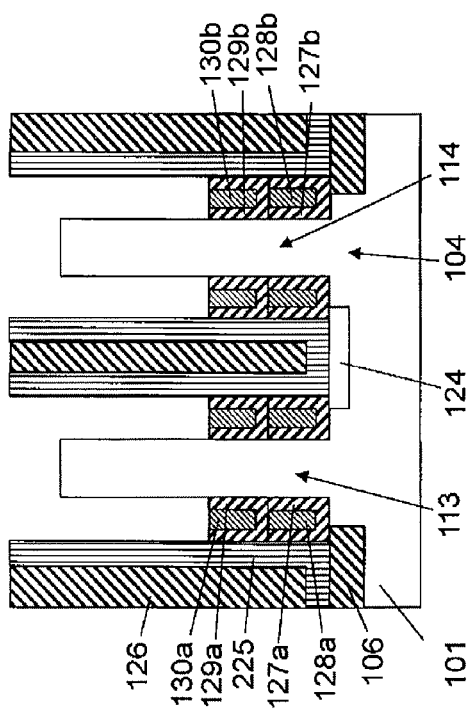
FIG. 29B is a cross-sectional view taken at line X-X' in FIG. 29A.

Referring to FIGS. 29A to 29C, exposed portions of the insulating film 129, which will form a first gate insulating film 129a and a third gate insulating film 129b and includes a charge storing layer, are removed. As a result, the insulating film 129 is divided into a first gate insulating film 129a and a third gate insulating film 129b.

The description up to the preceding paragraph is the description of the step of repeating the sixth step so as to form two or more first control gates in a direction perpendicular to the substrate and two or more second control gates in a direction perpendicular to the substrate. The sixth step may be repeated four times to form four first control gates and four second control gates in a direction perpendicular to the substrate.

Next, a seventh step following the sixth step is described. The seventh step includes depositing an insulating film, which will form a second gate insulating film and a fourth gate insulating film, around the first pillar-shaped semiconductor layers, on the first control gate, around the second pillar-shaped semiconductor layers, and on the second control gate, depositing a gate conductor, and etching back the gate conductor to form a first selection gate around the first pillar-shaped semiconductor layers and a second selection gate around the second pillar-shaped semiconductor layers.

Figure 30C:
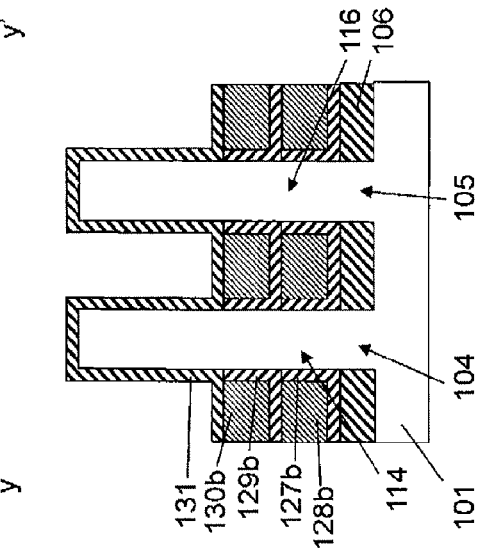
FIG. 30C is a cross-sectional view taken at line Y-Y' in FIG. 30A.
Figure 30A:
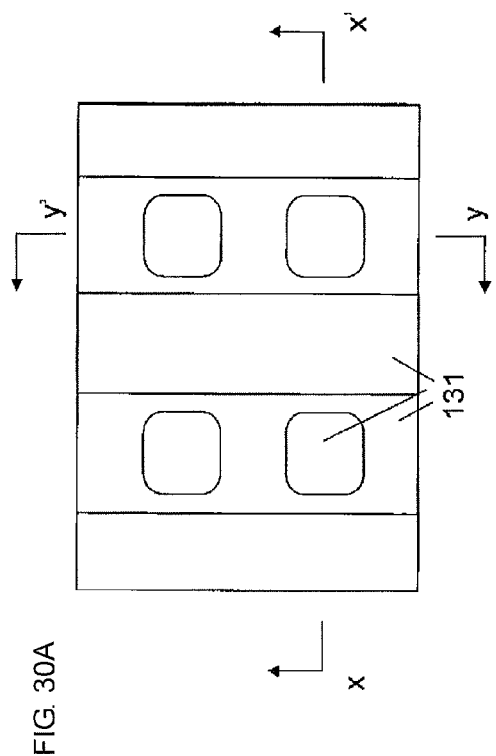
FIG. 30A is a plan view related to the method for manufacturing a semiconductor device according to one embodiment.
Figure 30B:
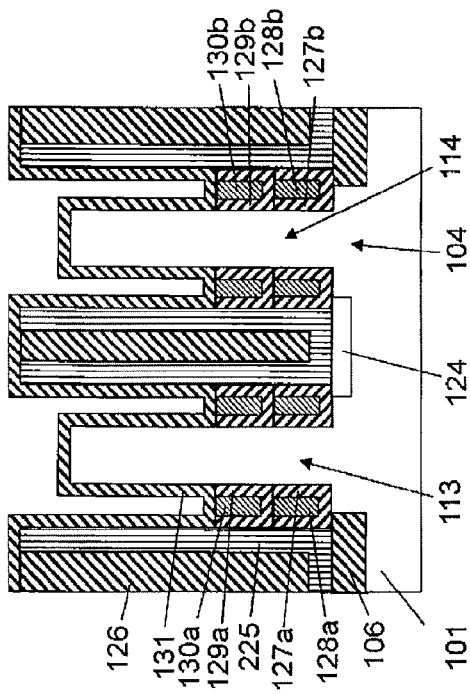
FIG. 30B is a cross-sectional view taken at line X-X' in FIG. 30A.

Referring to FIGS. 30A to 30C, an insulating film 131, which will form a second gate insulating film 131a and a fourth gate insulating film 131b, is deposited around the first pillar-shaped silicon layers 113 and 115, on the first control gate 130a, around the second pillar-shaped silicon layers 114 and 116, and on the second control gate 130b.

Figure 31A:
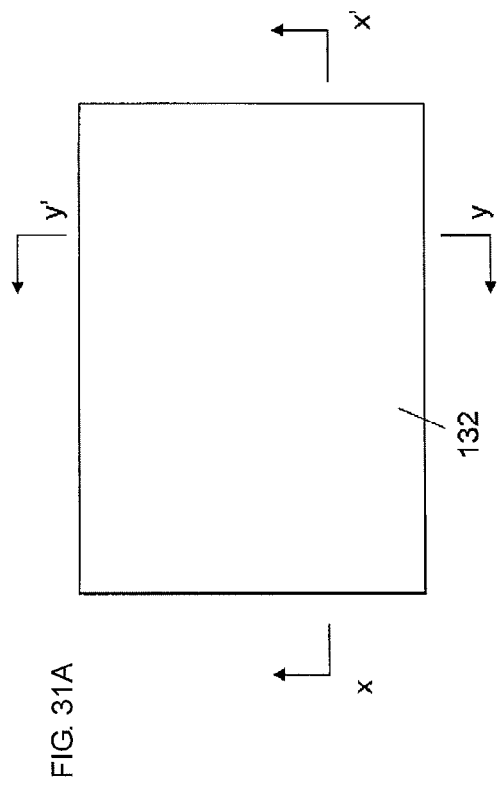
FIG. 31A is a plan view related to the method for manufacturing a semiconductor device according to one embodiment.
Figure 31C:
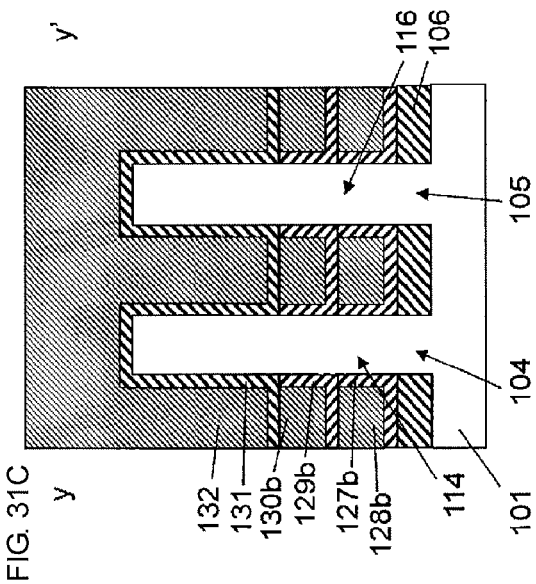
FIG. 31C is a cross-sectional view taken at line Y-Y' in FIG. 31A.
Figure 31B:
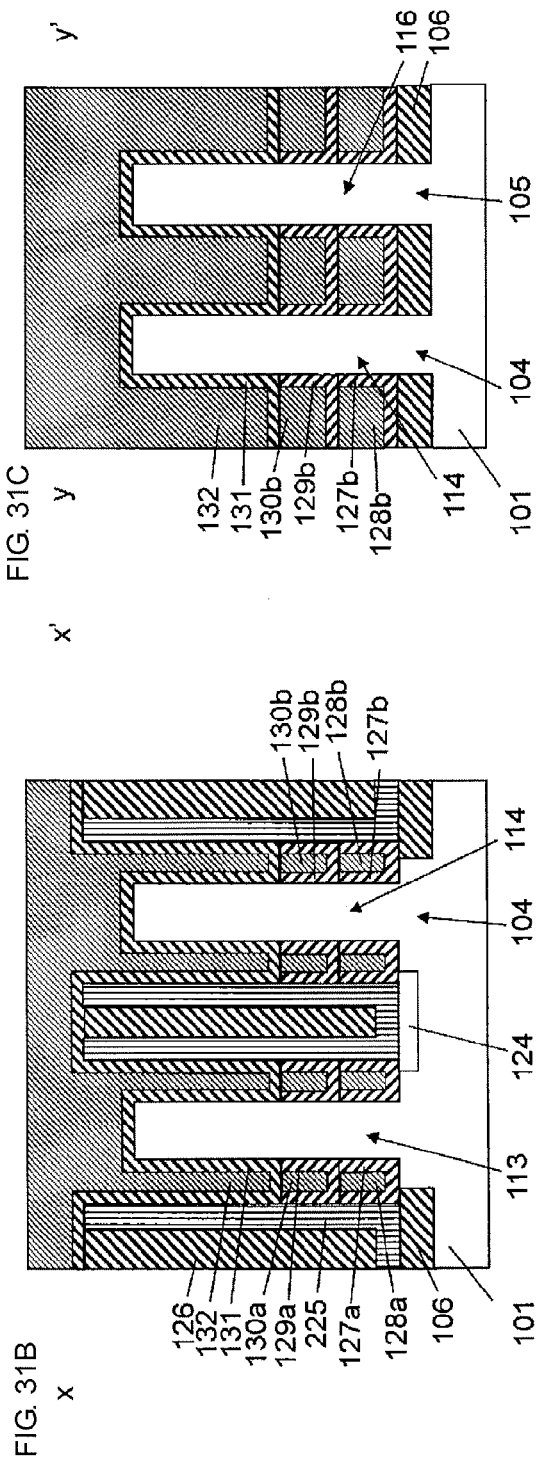
FIG. 31B is a cross-sectional view taken at line X-X' in FIG. 31A.

Referring to FIGS. 31A to 31C, a gate conductive film 132 is deposited. The gate conductive film 132 is preferably composed of a metal.

Referring to FIGS. 32A to 32C, the gate conductive film 132 is etched back to form a first selection gate 132a around the first pillar-shaped silicon layers 113 and 115 and a second selection gate 132b around the second pillar-shaped silicon layers 114 and 116.

Figure 33C:
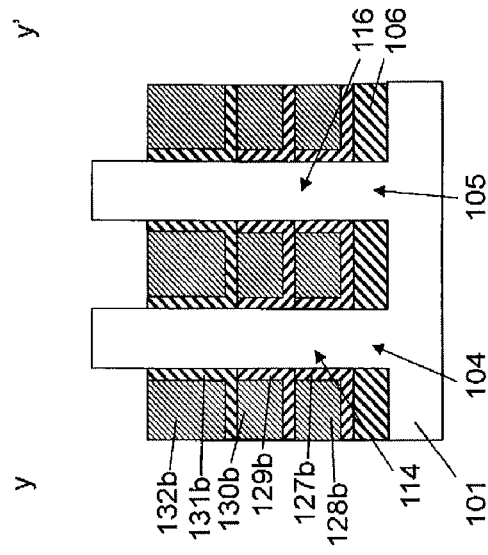
FIG. 33C is a cross-sectional view taken at line Y-Y' in FIG. 33A.
Figure 33A:
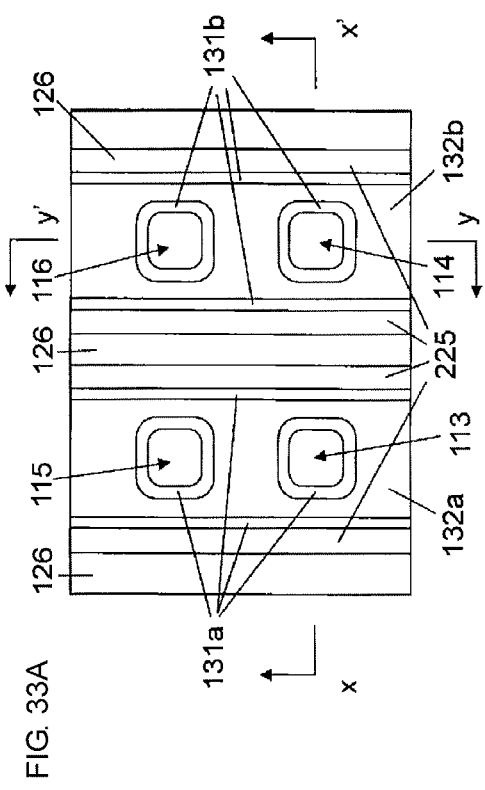
FIG. 33A is a plan view related to the method for manufacturing a semiconductor device according to one embodiment.
Figure 33B:
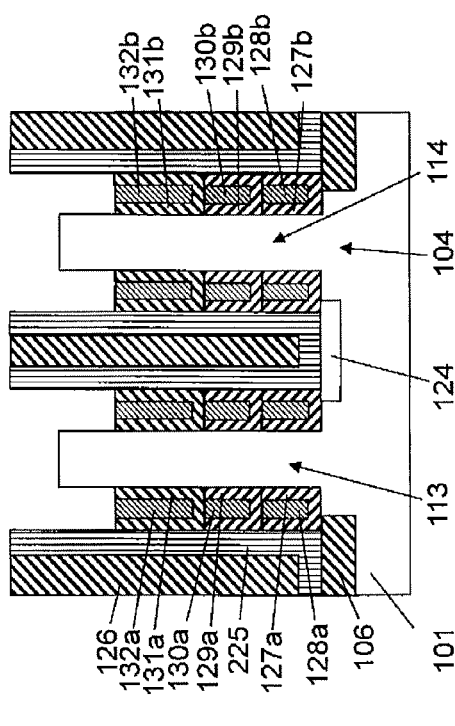
FIG. 33B is a cross-sectional view taken at line X-X' in FIG. 33A.

Referring to FIGS. 33A to 33C, exposed portions of the insulating film 131, which will form a second gate insulating film 131a and a fourth gate insulating film 131b, are removed. As a result, the insulating film 131 is divided into a second gate insulating film 131a and a fourth gate insulating film 131b.

The description up to the preceding paragraph is the description of the seventh step that follows the sixth step and includes depositing an insulating film, which will form a second gate insulating film and a fourth gate insulating film, around the first pillar-shaped semiconductor layers, on the first control gate, around the second pillar-shaped semiconductor layers, and on the second control gate, depositing a gate conductor, and etching back the gate conductor to form a first selection gate around the first pillar-shaped semiconductor layers and a second selection gate around the second pillar-shaped semiconductor layers.

Next, an eighth step following the seventh step is described. The eighth step includes depositing an insulating film, which will form a fifth gate insulating film and a sixth gate insulating film, around the first pillar-shaped semiconductor layers, on the first selection gate, around the second pillar-shaped semiconductor layers, and on the second selection gate, depositing a gate conductor, and etching back the gate conductor to form first contact electrodes around upper portions of the first pillar-shaped semiconductor layers and second contact electrodes around upper portions of the second pillar-shaped semiconductor layers.

Referring to FIGS. 34A to 34C, an insulating film 133, which will form a fifth gate insulating film 133a and a sixth gate insulating film 133b, is deposited around the first pillar-shaped silicon layers 113 and 115, on the first selection gate 132a, around the second pillar-shaped silicon layers 114 and 116, and on the second selection gate 132b.

Figure 35C:
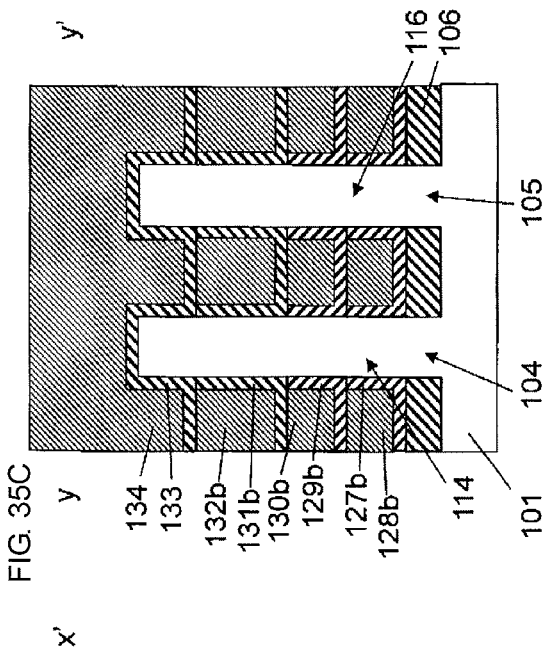
FIG. 35C is a cross-sectional view taken at line Y-Y' in FIG. 35A.
Figure 35A:
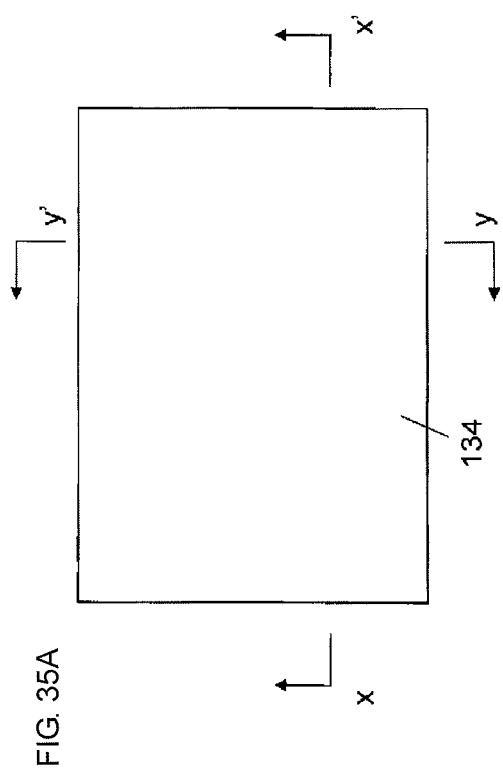
FIG. 35A is a plan view related to the method for manufacturing a semiconductor device according to one embodiment.
Figure 35B:
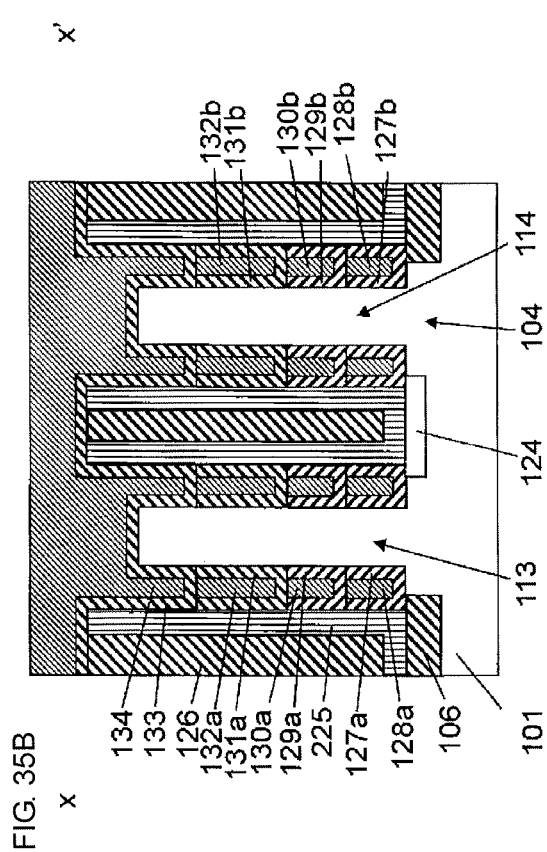
FIG. 35B is a cross-sectional view taken at line X-X' in FIG. 35A.

Referring to FIGS. 35A to 35C, a gate conductive film 134 is deposited. The gate conductive film 134 is preferably composed of a metal. The work function of the metal constituting the gate conductive film 134 is preferably between 4.0 eV and 4.2 eV when the gate conductive film 134 is to function as an n-type diffusion layer. The work function of the metal constituting the gate conductive film 134 is preferably between 5.0 eV and 5.2 eV when the gate conductive film 134 is to function as a p-type diffusion layer.

Figure 36A:
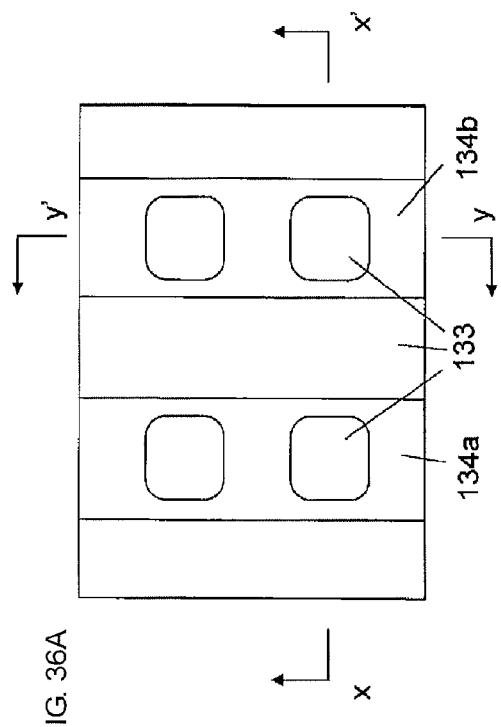
FIG. 36A is a plan view related to the method for manufacturing a semiconductor device according to one embodiment.
Figure 36C:
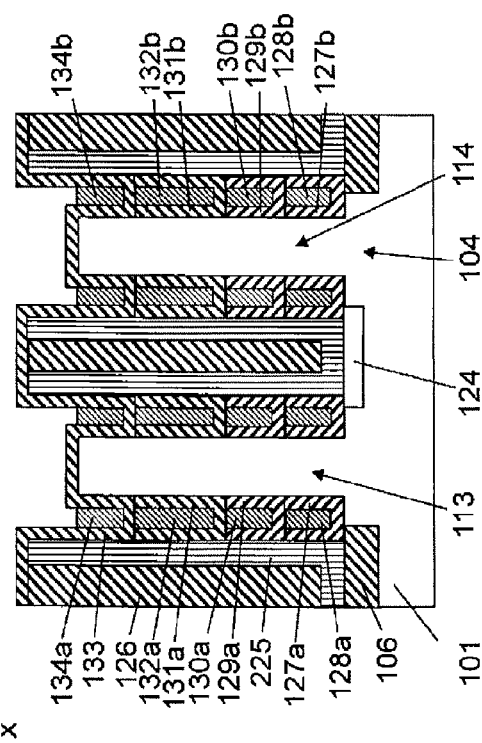
FIG. 36C is a cross-sectional view taken at line Y-Y' in FIG. 36A.
Figure 36B:
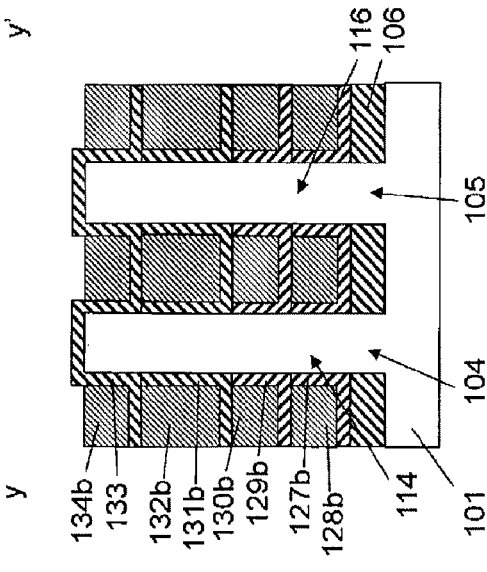
FIG. 36B is a cross-sectional view taken at line X-X' in FIG. 36A.

Referring to FIGS. 36A to 36C, the gate conductive film 134 is etched back to form a first contact electrode 134a around upper portions of the first pillar-shaped silicon layers 113 and 115 and a second contact electrode 134b around upper portions of the second pillar-shaped silicon layers 114 and 116.

Figure 37C:
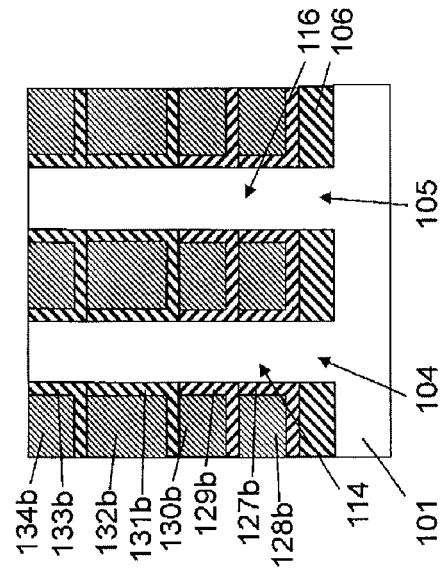
FIG. 37C is a cross-sectional view taken at line Y-Y' in FIG. 37A.
Figure 37A:
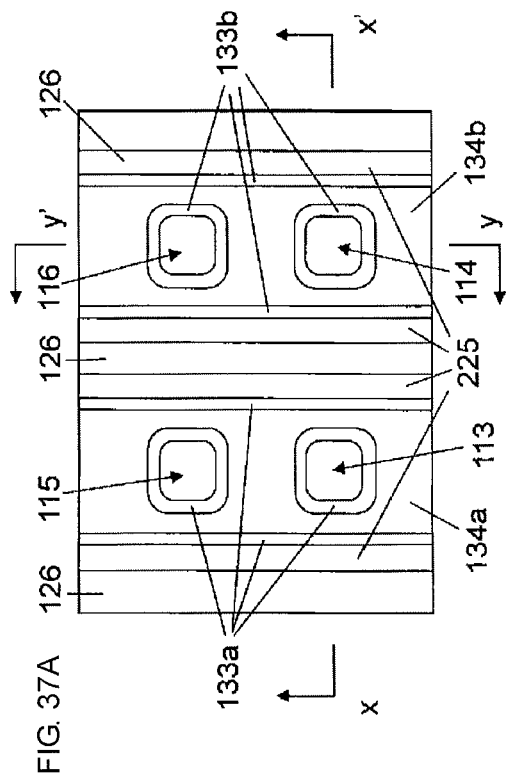
FIG. 37A is a plan view related to the method for manufacturing a semiconductor device according to one embodiment.
Figure 37B:
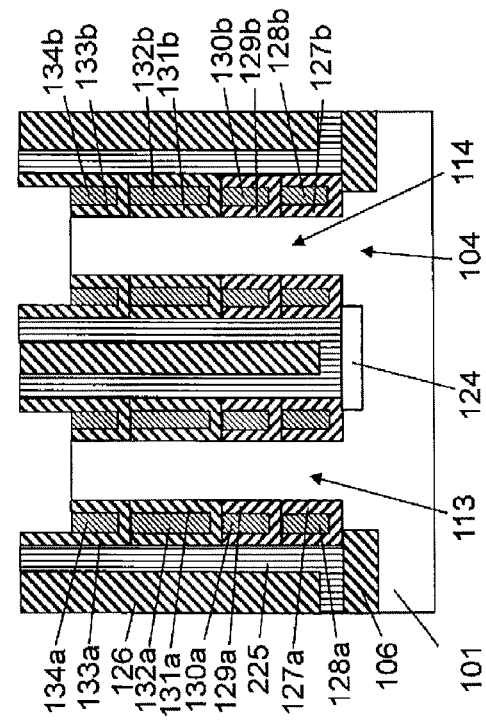
FIG. 37B is a cross-sectional view taken at line X-X' in FIG. 37A.

Referring to FIGS. 37A to 37C, exposed portions of the insulating film 133 are etched to expose upper portions of the first pillar-shaped silicon layers 113 and 115 and the second pillar-shaped silicon layers 114 and 116. As a result, the insulating film 133 is divided into a fifth gate insulating film 133a and a sixth gate insulating film 133b.

Referring to FIGS. 38A to 38C, a metal 135 which will form third contact electrodes 138a and 138b, first bit lines 135a and 135c, and a source line 135b is deposited.

Figure 39A:
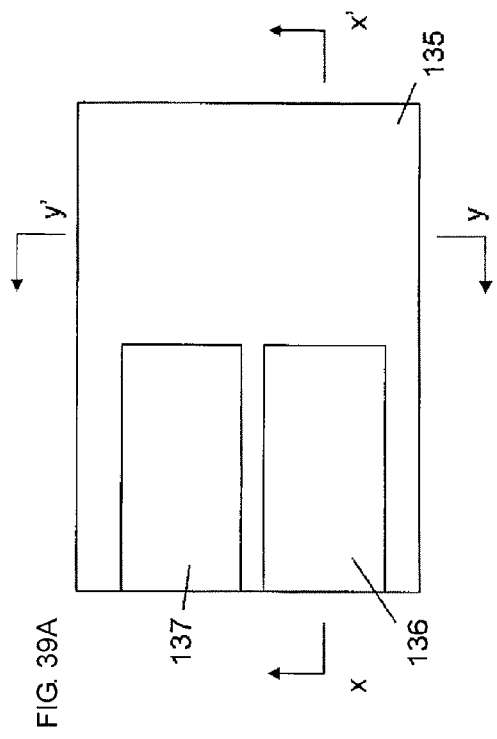
FIG. 39A is a plan view related to the method for manufacturing a semiconductor device according to one embodiment.
Figure 39C:
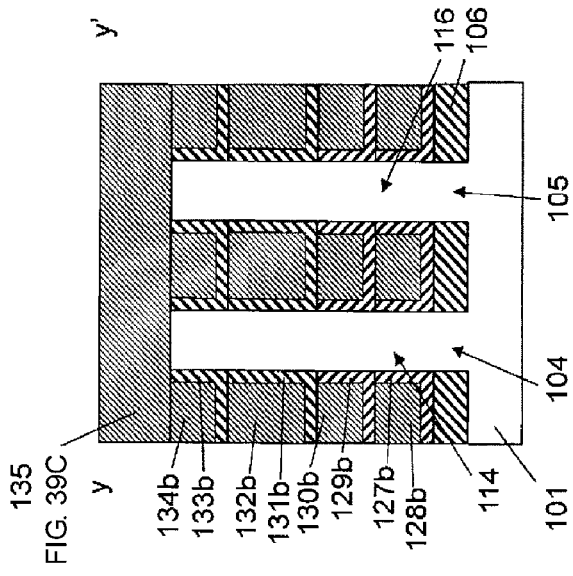
FIG. 39C is a cross-sectional view taken at line Y-Y' in FIG. 39A.
Figure 39B:
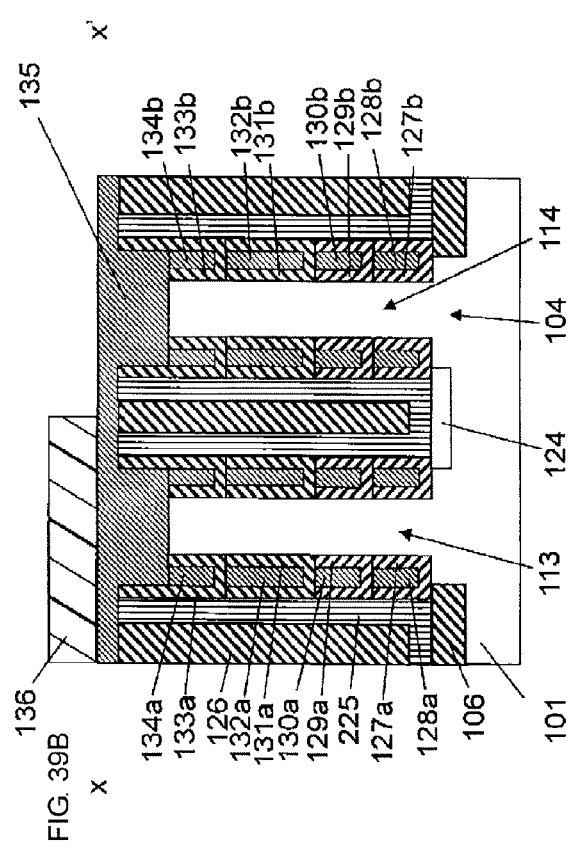
FIG. 39B is a cross-sectional view taken at line X-X' in FIG. 39A.

Referring to FIGS. 39A to 39C, third resists 136 and 137 for forming third contact electrodes 138a and 138b, first bit lines 135a and 135c and a source line 135b are formed.

Referring to FIGS. 40A to 40C, the metal 135 and the first contact electrode 134a are etched to form third contact electrodes 138a and 138b, first bit lines 135a and 135c, and a source line 135b. The first contact electrode 134a is thereby divided into first contact electrodes 134c and 134d.

Referring to FIGS. 41A to 41C, the third resists 136 and 137 are removed.

Referring to FIGS. 42A to 42C, a second interlayer insulating film 139 is deposited and etched back to expose upper portions of the first bit lines 135a and 135c.

Referring to FIGS. 43A to 43C, a metal 140 is deposited.

Referring to FIGS. 44A to 44C, fourth resists 141 and 142 for forming second bit lines 140a and 140b are formed.

Referring to FIGS. 45A to 45C, the metal 140 are etched to form second bit lines 140a and 140b.

Referring to FIGS. 46A to 46C, the fourth resists 141 and 142 are removed.

The description up to the preceding paragraph is the description of the eighth step that follows the seventh step and includes depositing an insulating film, which will form a fifth gate insulating film and a sixth gate insulating film, around the first pillar-shaped semiconductor layers, on the first selection gate, around the second pillar-shaped semiconductor layers, and on the second selection gate, depositing a gate conductor, and etching back the gate conductor to form first contact electrodes around upper portions of the first pillar-shaped semiconductor layers and second contact electrodes around upper portions of the second pillar-shaped semiconductor layers.

This ends the description of the method for manufacturing a structure of a semiconductor device according to an embodiment of the present invention.

It should be understood that various other embodiments, alterations, and modifications are possible without departing from the broad spirit and scope of the present invention and the embodiments described above are merely for illustrative purpose only and do not limit the scope of the present invention.

For example, in the embodiments described above, a method for manufacturing a semiconductor device in which the conductivity of various p-type (including $p^+$-type) parts and n-type (including $n^+$-type) parts is reversed and a semiconductor device obtained by such an method are naturally within the technical scope of the present invention.

What is claimed is:

1. A semiconductor device comprising:
    a fin-shaped semiconductor layer on a semiconductor substrate;
    a first insulating film around the fin-shaped semiconductor layer;
    a first pillar-shaped semiconductor layer on the fin-shaped semiconductor layer;
    a first gate insulating film around the first pillar-shaped semiconductor layer and including a charge storing layer;
    a first control gate around the first gate insulating film, the first control gate extending in a direction perpendicular to the fin-shaped semiconductor layer;
    a second gate insulating film around the first pillar-shaped semiconductor layer and at a position higher than the first gate insulating film;
    a first selection gate around the second gate insulating film, the first selection gate extending in a direction perpendicular to the fin-shaped semiconductor layer;
    a fifth gate insulating film surrounding an upper portion of the first pillar-shaped semiconductor layer; and
    a first contact electrode surrounding and in intimate contact with the fifth gate insulating film and having an upper portion connected to an upper portion of the first pillar-shaped semiconductor layer; and
    a source line connected to an upper portion of the first pillar-shaped semiconductor layer and an upper portion of the first contact electrode and extending in a direction perpendicular to the fin-shaped semiconductor layer.

2. The semiconductor device according to claim 1, wherein a metal constituting the first contact electrode has a work function between 4.0 eV and 4.2 eV.

3. The semiconductor device according to claim 1, wherein a metal constituting the first contact electrode has a work function between 5.0 eV and 5.2 eV.

4. The semiconductor device according to claim 1, wherein the first gate insulating film includes a nitride film as a charge storing layer.

5. The semiconductor device according to claim 1, wherein the first control gate comprises two or more first control gates in a direction perpendicular to the substrate.

6. The semiconductor device according to claim 1, wherein a width of the first pillar-shaped semiconductor layer in a direction perpendicular to the fin-shaped semiconductor layer is equal to a width of the fin-shaped semiconductor layer in the direction perpendicular to the fin-shaped semiconductor layer, and
    the first gate insulating film is around and at a bottom portion of the first control gate.

7. The semiconductor device according to claim 1, wherein the second gate insulating film is around and at a bottom portion of the first selection gate.

8. A semiconductor device comprising:
    a fin-shaped semiconductor layer on a semiconductor substrate;
    a first insulating film around the fin-shaped semiconductor layer;

a first pillar-shaped semiconductor layer on the fin-shaped semiconductor layer;

a first gate insulating film around the first pillar-shaped semiconductor layer and including a charge storing layer;

a first control gate around the first gate insulating film, the first control gate extending in a direction perpendicular to the fin-shaped semiconductor layer;

a second gate insulating film around the first pillar-shaped semiconductor layer and at a position higher than the first gate insulating film;

a first selection gate around the second gate insulating film, the first selection gate extending in a direction perpendicular to the fin-shaped semiconductor layer;

a fifth gate insulating film surrounding an upper portion of the first pillar-shaped semiconductor layer;

a first contact electrode surrounding the fifth gate insulating film and having an upper portion connected to an upper portion of the first pillar-shaped semiconductor layer;

a second pillar-shaped semiconductor layer on a second fin-shaped semiconductor layer;

a third gate insulating film around the second pillar-shaped semiconductor layer and including a charge storing layer;

a second control gate around the third gate insulating film, the second control gate extending in a direction perpendicular to the fin-shaped semiconductor layer;

a fourth gate insulating film around the second pillar-shaped semiconductor layer and at a position higher than the third gate insulating film;

a second selection gate around the fourth gate insulating film, the second selection gate extending in a direction perpendicular to the fin-shaped semiconductor layer;

a sixth gate insulating film surrounding an upper portion of the second pillar-shaped semiconductor layer;

a second contact electrode surrounding the sixth gate insulating film; and a source line connected to an upper portion of the second pillar-shaped semiconductor layer and an upper portion of the second contact electrode and extending in a direction perpendicular to the first and second fin-shaped semiconductor layers.

9. The semiconductor device according to claim 8, wherein the second control gate comprises two or more second control gates in a direction perpendicular to the substrate.

10. The semiconductor device according to claim 8, wherein a width of the second pillar-shaped semiconductor layer in a direction perpendicular to the fin-shaped semiconductor layer is equal to a width of the fin-shaped semiconductor layer in the direction perpendicular to the fin-shaped semiconductor layer, and the third gate insulating film is around and at a bottom portion of the second control gate.

11. The semiconductor device according to claim 8, further comprising:

a first diffusion layer in an upper portion of the fin-shaped semiconductor layer, the upper portion between the first pillar-shaped semiconductor layer and the second pillar-shaped semiconductor layer.

12. The semiconductor device according to claim 8, wherein the fourth gate insulating film is around and at a bottom portion of the second selection gate.

* * * * *